US012618141B2

(12) United States Patent
Kawashima et al.

(10) Patent No.: US 12,618,141 B2
(45) Date of Patent: May 5, 2026

(54) SINTERED BODY, SPUTTERING TARGET, OXIDE THIN FILM, THIN FILM TRANSISTOR, ELECTRONIC EQUIPMENT, AND METHOD FOR PRODUCING SINTERED BODY

(71) Applicant: IDEMITSU KOSAN CO.,LTD., Tokyo (JP)

(72) Inventors: Emi Kawashima, Tokyo (JP); Mami Itose, Tokyo (JP); Akira Kaijo, Tokyo (JP); Kazuyoshi Inoue, Tokyo (JP); Nobuhiro Iwase, Tokyo (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 18/847,175

(22) PCT Filed: Mar. 7, 2023

(86) PCT No.: PCT/JP2023/008589
§ 371 (c)(1),
(2) Date: Sep. 13, 2024

(87) PCT Pub. No.: WO2023/176591
PCT Pub. Date: Sep. 21, 2023

(65) Prior Publication Data
US 2025/0188591 A1     Jun. 12, 2025

(30) Foreign Application Priority Data

Mar. 16, 2022 (JP) ................................. 2022-041918
Jun. 29, 2022 (JP) ................................. 2022-104923

(51) Int. Cl.
*C23C 14/34* (2006.01)
(52) U.S. Cl.
CPC ............................... *C23C 14/3414* (2013.01)

(58) Field of Classification Search
None
See application file for complete search history.

(56) References Cited

U.S. PATENT DOCUMENTS

2014/0014500 A1* 1/2014 Tomai ............... H01L 21/02565
                                                 204/192.15
2015/0225843 A1   8/2015 Oda et al.
(Continued)

FOREIGN PATENT DOCUMENTS

JP     2014-234337 A    12/2014
JP       5997690 B2     9/2016
(Continued)

OTHER PUBLICATIONS

PCT International Preliminary Report on Patentability, dated Sep. 10, 2024, which includes a Translation of International Searching Authority, "Written Opinion," issued in connection with International Patent Application No. PCT/JP2023/008589, dated May 9, 2023 (5 pages).
(Continued)

*Primary Examiner* — Jason Berman
(74) *Attorney, Agent, or Firm* — Foley & Lardner LLP

(57) ABSTRACT

A sintered body of an oxide contains an In element, a Ga element, and an Al element, in which an atomic composition ratio of the In element and an atomic composition ratio of the Al element respectively satisfy a formula (1) and a formula (2) below, $$[In]/([In] + [Ga] + [Al]) > 0.70 \qquad (1)$$

$$[Al]/([In] + [Ga] + [Al]) > 0.01. \qquad (2)$$

13 Claims, 11 Drawing Sheets

(56)            References Cited

U.S. PATENT DOCUMENTS

| | | |
|---|---|---|
| 2016/0149005 A1 | 5/2016 | Oda et al. |
| 2018/0226472 A1 | 8/2018 | Oda et al. |
| 2019/0112703 A1 | 4/2019 | Oda et al. |
| 2020/0052130 A1 | 2/2020 | Inoue et al. |
| 2021/0309535 A1 | 10/2021 | Sasaki et al. |
| 2021/0343876 A1 | 11/2021 | Inoue et al. |
| 2022/0049348 A1 | 2/2022 | Oda et al. |

FOREIGN PATENT DOCUMENTS

| | | | | |
|---|---|---|---|---|
| TW | 202142518 A | * | 11/2021 | ............... B22F 3/14 |
| WO | WO-2014/112376 A1 | | 7/2014 | |
| WO | WO-2015/005202 A1 | | 1/2015 | |
| WO | WO-2018143280 A1 | * | 8/2018 | ....... H01L 21/02565 |
| WO | WO-2020/027243 A1 | | 2/2020 | |
| WO | WO-2020027244 A1 | * | 2/2020 | ............ C30B 29/22 |

OTHER PUBLICATIONS

International Searching Authority, "International Search Report," issued in connection with International Patent Application No. PCT/JP2023/008589, dated May 9, 2023.
International Searching Authority, "Written Opinion," issued in connection with International Patent Application No. PCT/JP2023/008589, dated May 9, 2023.

* cited by examiner

SINTERED BODY, SPUTTERING TARGET, OXIDE THIN FILM, THIN FILM TRANSISTOR, ELECTRONIC EQUIPMENT, AND METHOD FOR PRODUCING SINTERED BODY

CROSS-REFERENCE TO RELATED APPLICATIONS

The present application claims priority under 35 U.S.C. § 371 to International Patent Application No. PCT/JP2023/008589, filed Mar. 7, 2023, which claims priority to and the benefit of Japanese Patent Application Nos. 2022-041918, filed Mar. 16, 2022, and 2022-104923, filed on Jun. 29, 2022. The contents of these applications are hereby incorporated by reference in their entireties.

TECHNICAL FIELD

The present invention relates to a sintered body, a sputtering target, an oxide thin film, a thin film transistor, an electronic device, and a method of producing a sintered body.

BACKGROUND ART

High-mobility thin film transistors (hereinafter the thin film transistor is occasionally referred to as a TFT) are required to provide high-definition displays for the next generation. Crystalline oxide semiconductors such as indium gallium oxide (IGO) are considered as semiconductor materials for use in the TFT. When an oxide semiconductor is used in a display, the TFT is obtained by sputtering with a sputtering target having the same atomic composition as an oxide sintered body.

In order to provide large-size displays such as a TV, the manufacturing equipment is also larger from the viewpoint of manufacturing cost. The sintered body used for the sputtering target is also required to enable stable sputtering even in large equipment.

For instance, Patent Literature 1 describes a sputtering target consisting essentially of an oxide of indium and gallium, or an oxide of indium, gallium and tin and/or aluminum. When the sputtering target described in Patent Literature 1 contains tin, the amount of tin is in a range from 100 to 10,000 ppm. When the sputtering target described in Patent Literature 1 contains aluminum, the amount of aluminum is in a range from 100 to 10,000 ppm. The sputtering target described in Patent Literature 1 is made of a sintered body having voids each having a volume of 14,000 $\mu m^3$ or more in an amount of 0.03 volume % or less, in which one surface of the sintered body has an area of 25,000 $mm^2$ or more and a thickness of 5 mm or more.

If the sputtering target is made of a sintered body having an atomic composition ratio of an Al element of 1 atomic % or less and a void ratio of 0.03 volume % or less, as described in Patent Literature 1, sputtering can be stably performed in large sizes.

Recent developments have made it clear that stability for the TFT producing process is required, e.g., the change in properties needs to be small for chemical vapor deposition (CVD), which is one of the processes after the formation of oxide semiconductor film.

For instance, Patent Literature 2 describes a crystalline compound A represented by a composition formula $(In_xGa_y\text{-}Al_z)_2O_3$ and having diffraction peaks in respective ranges of an incidence angle ($2\theta$) observed by X-ray (Cu-K$\alpha$ ray)

diffraction measurement. In addition, Patent Literature 2 describes a sputtering target using an oxide sintered body that consists of the crystalline compound A.

A sputtering target containing the crystalline compound A represented by the composition formula $(In_xGa_yAl_z)_2O_3$ as described in Patent Literature 2 can enable stable sputtering, is stable to the TFT producing process, and can meet the demand for TFT (thin film transistor) performance with high mobility.

CITATION LIST

Patent Literature(s)

Patent Literature 1: Japan Patent No. 5997690
Patent Literature 2: International Publication No. WO 2020/027243

SUMMARY OF THE INVENTION

Problem(s) to be Solved by the Invention

In recent years, panels for medium-size displays (notebooks and tablets) as well as large-size displays (TVs) have tended to be produced in large equipment with a glass substrate with dimensions of 2,200 mm×2,400 mm or larger. In addition, there are demands for higher definition and narrower bezels for medium-size display applications. To meet these demands, the TFT is required to have higher performance (high mobility and high optical reliability). Thus, the oxide sintered body used for the sputtering target is required to enable stable sputtering even in large equipment and to provide the TFT excellent in mobility, processability, and optical reliability, specifically, the TFT having high mobility and excellent in processability and in-plane uniformity control for performance. There is room for further improvement in conventional sintered bodies.

An object of the invention is to provide a sintered body that enables stable sputtering even in large equipment and provides a TFT having high mobility and excellent in processability and in-plane uniformity of optical reliability; a sputtering target using the sintered body; an oxide thin film using the sputtering target; a thin film transistor including the oxide thin film; an electronic device including the thin film transistor; and a method of producing a sintered body that provides a TFT having high mobility and excellent in processability and in-plane uniformity of optical reliability.

Means for Solving the Problem(s)

[1] A sintered body of an oxide containing an In element, a Ga element, and an Al element, in which an atomic composition ratio of the In element and an atomic composition ratio of the Al element respectively satisfy a formula (1) and a formula (2) below.

$$[\text{In}]/([\text{In}] + [\text{Ga}] + [\text{Al}]) > 0.70 \tag{1}$$

$$[\text{Al}]/([\text{In}] + [\text{Ga}] + [\text{Al}]) > 0.01 \tag{2}$$

[2] The sintered body according to [1], in which in a field of view when the sintered body is observed with a scanning electron microscope, an area ratio of pores to an area of the field of view is 0.1% or less.

[3] The sintered body according to [1] or [2], in which provided that an atomic composition ratio of the Ga element represented by {[Ga]/([In]+[Ga]+[Al])}×100 is x and an atomic composition ratio of the Al element represented by {[Al]/([In]+[Ga]+[Al])}×100 is y, the x and the y are, in atomic %, within a composition range bounded by straight lines of (A1), (B0), (C1), (D1), and (E1) below.

$$x \geq 4 \qquad \text{(A1)}$$

$$x \leq 22.5 \qquad \text{(B1)}$$

$$y > 1 \qquad \text{(C1)}$$

$$6x + 14y - 98 \geq 0 \qquad \text{(D1)}$$

$$4x + 20y - 180 \leq 0 \qquad \text{(E1)}$$

[4] The sintered body according to [3], in which the x and the y are, in atomic %, within a composition range bounded by straight lines of (A2) and (B2) below and the straight lines of (C1), (D1), and (E1) above.

$$x \geq 8 \qquad \text{(A2)}$$

$$x \leq 20 \qquad \text{(B2)}$$

[5] The sintered body according to any one of [1] to [4], in which the sintered body includes a Bixbyite structure containing the In element and a crystal structure belonging to a space group P1 or a space group P-1, the crystal structure belonging to the space group P1 being represented by a crystal structure parameter (X) below, the crystal structure belonging to the space group P-1 being represented by a crystal structure parameter (Y) below, the crystal structure parameter (X):
lattice constants are a=10.07±0.15 Å, b=10.45±0.15 Å, c=11.01±0.15 Å, α=111.70±0.50°, β=107.70±0.50°, and γ=90.00±0.50°,
the sintered body has a triclinic crystal system,
at least one metal in an atomic configuration below of the space group P1 is any one of In, Ga and Al, or any two or more of In, Ga and Al, and is on identical atomic coordinates at a predetermined ratio,
the atomic coordinates on which the at least one metal is arranged are in a range of x±0.01, y±0.01, and z±0.01, and
atomic coordinates on which oxygen is arranged are in a range of x±0.01, y±0.01, and z±0.01, where
atomic species: metal, atomic coordinates (x=0.04, y=0.36, z=0.87),
atomic species: metal, atomic coordinates (x=0.13, y=0.12, z=0.62),
atomic species: metal, atomic coordinates (x=0.21, y=0.85, z=0.39),
atomic species: metal, atomic coordinates (x=0.23, y=0.11, z=0.97),
atomic species: metal, atomic coordinates (x=0.29, y=0.64, z=0.11),
atomic species: metal, atomic coordinates (x=0.46, y=0.12, z=0.63),
atomic species: metal, atomic coordinates (x=0.58, y=0.14, z=0.01),
atomic species: metal, atomic coordinates (x=0.62, y=0.64, z=0.11), atomic species: metal, atomic coordinates (x=0.69, y=0.18, z=0.32),
atomic species: metal, atomic coordinates (x=0.09, y=0.88, z=0.03),
atomic species: metal, atomic coordinates (x=0.02, y=0.13, z=0.30),
atomic species: metal, atomic coordinates (x=0.06, y=0.61, z=0.46),
atomic species: metal, atomic coordinates (x=0.15, y=0.40, z=0.19),
atomic species: metal, atomic coordinates (x=0.26, y=0.36, z=0.54),
atomic species: metal, atomic coordinates (x=0.34, y=0.13, z=0.30),
atomic species: metal, atomic coordinates (x=0.41, y=0.61, z=0.45),
atomic species: metal, atomic coordinates (x=0.48, y=0.40, z=0.23),
atomic species: metal, atomic coordinates (x=0.84, y=0.39, z=0.23),
atomic species: metal, atomic coordinates (x=0.96, y=0.64, z=0.13),
atomic species: metal, atomic coordinates (x=0.87, y=0.88, z=0.38),
atomic species: metal, atomic coordinates (x=0.79, y=0.15, z=0.61),
atomic species: metal, atomic coordinates (x=0.77, y=0.89, z=0.03),
atomic species: metal, atomic coordinates (x=0.71, y=0.36, z=0.89),
atomic species: metal, atomic coordinates (x=0.54, y=0.88, z=0.37),
atomic species: metal, atomic coordinates (x=0.42, y=0.86, z=0.99),
atomic species: metal, atomic coordinates (x=0.38, y=0.36, z=0.89),
atomic species: metal, atomic coordinates (x=0.31, y=0.82, z=0.68),
atomic species: metal, atomic coordinates (x=0.91, y=0.12, z=0.97),
atomic species: metal, atomic coordinates (x=0.98, y=0.87, z=0.70),
atomic species: metal, atomic coordinates (x=0.94, y=0.39, z=0.54),
atomic species: metal, atomic coordinates (x=0.85, y=0.60, z=0.81),
atomic species: metal, atomic coordinates (x=0.74, y=0.64, z=0.46),
atomic species: metal, atomic coordinates (x=0.66, y=0.87, z=0.70),
atomic species: metal, atomic coordinates (x=0.59, y=0.39, z=0.55),
atomic species: metal, atomic coordinates (x=0.52, y=0.60, z=0.77),
atomic species: metal, atomic coordinates (x=0.16, y=0.61, z=0.77),
atomic species: oxygen, atomic coordinates (x=0.02, y=0.73, z=0.36),
atomic species: oxygen, atomic coordinates (x=0.03, y=0.45, z=0.29),
atomic species: oxygen, atomic coordinates (x=0.05, y=0.02, z=0.40),
atomic species: oxygen, atomic coordinates (x=0.10, y=0.74, z=0.65),
atomic species: oxygen, atomic coordinates (x=0.10, y=0.23, z=0.06), atomic species: oxygen, atomic coordinates (x=0.12, y=0.51, z=0.09), atomic species: oxygen, atomic coordinates (x=0.12, y=0.47, z=0.57), atomic species: oxygen, atomic coordinates (x=0.13, y=0.79, z=0.17), atomic species: oxygen, atomic coordinates (x=0.19, y=0.21, z=0.84), atomic species: oxygen, atomic coordinates (x=0.20, y=0.23, z=0.36), atomic species: oxygen, atomic coordinates (x=0.25, y=0.66, z=0.49), atomic species: oxygen, atomic coordinates (x=0.27, y=0.02, z=0.12), atomic species: oxygen, atomic coordinates (x=0.30, y=0.26, z=0.65), atomic species: oxygen, atomic coordinates (x=0.33, y=0.44, z=0.29), atomic species: oxygen, atomic coordinates (x=0.38, y=0.02, z=0.40), atomic species: oxygen, atomic coordinates (x=0.39, y=0.73, z=0.35), atomic species: oxygen, atomic coordinates (x=0.41, y=0.24, z=0.07), atomic species: oxygen, atomic coordinates (x=0.43, y=0.47, z=0.57), atomic species: oxygen, atomic coordinates (x=0.46, y=0.51, z=0.11), atomic species: oxygen, atomic coordinates (x=0.47, y=0.79, z=0.15), atomic species: oxygen, atomic coordinates (x=0.50, y=0.25, z=0.36), atomic species: oxygen, atomic coordinates (x=0.64, y=0.03, z=0.12), atomic species: oxygen, atomic coordinates (x=0.66, y=0.34, z=0.23), atomic species: oxygen, atomic coordinates (x=0.72, y=0.03, z=0.40), atomic species: oxygen, atomic coordinates (x=0.78, y=0.51, z=0.12), atomic species: oxygen, atomic coordinates (x=0.80, y=0.25, z=0.06), atomic species: oxygen, atomic coordinates (x=0.96, y=0.02, z=0.12), atomic species: oxygen, atomic coordinates (x=0.98, y=0.27, z=0.64), atomic species: oxygen, atomic coordinates (x=0.97, y=0.55, z=0.72), atomic species: oxygen, atomic coordinates (x=0.95, y=0.98, z=0.60), atomic species: oxygen, atomic coordinates (x=0.90, y=0.26, z=0.35), atomic species: oxygen, atomic coordinates (x=0.90, y=0.77, z=0.94), atomic species: oxygen, atomic coordinates (x=0.88, y=0.49, z=0.91), atomic species: oxygen, atomic coordinates (x=0.88, y=0.53, z=0.43), atomic species: oxygen, atomic coordinates (x=0.87, y=0.21, z=0.83), atomic species: oxygen, atomic coordinates (x=0.81, y=0.79, z=0.16), atomic species: oxygen, atomic coordinates (x=0.80, y=0.77, z=0.64), atomic species: oxygen, atomic coordinates (x=0.75, y=0.34, z=0.51), atomic species: oxygen, atomic coordinates (x=0.73, y=0.98, z=0.88), atomic species: oxygen, atomic coordinates (x=0.70, y=0.74, z=0.35), atomic species: oxygen, atomic coordinates (x=0.67, y=0.56, z=0.71), atomic species: oxygen, atomic coordinates (x=0.62, y=0.98, z=0.60), atomic species: oxygen, atomic coordinates (x=0.61, y=0.27, z=0.65), atomic species: oxygen, atomic coordinates (x=0.59, y=0.76, z=0.93), atomic species: oxygen, atomic coordinates (x=0.58, y=0.53, z=0.43), atomic species: oxygen, atomic coordinates (x=0.54, y=0.49, z=0.89), atomic species: oxygen, atomic coordinates (x=0.53, y=0.21, z=0.85), atomic species: oxygen, atomic coordinates (x=0.50, y=0.75, z=0.64), atomic species: oxygen, atomic coordinates (x=0.36, y=0.97, z=0.88), atomic species: oxygen, atomic coordinates (x=0.34, y=0.66, z=0.77), atomic species: oxygen, atomic coordinates (x=0.28, y=0.97, z=0.60), atomic species: oxygen, atomic coordinates (x=0.22, y=0.49, z=0.88), atomic species: oxygen, atomic coordinates (x=0.20, y=0.75, z=0.94), and atomic species: oxygen, atomic coordinates (x=0.04, y=0.98, z=0.88), the crystal structure parameter (Y):

lattice constants are a=10.07±0.15 Å, b=10.45±0.15 Å, c=11.01±0.15 Å, α=111.70±0.50°, β=107.70±0.50°, and γ=90.00±0.50°, the sintered body has a triclinic crystal system, at least one metal in an atomic configuration below of the space group P-1 is any one of In, Ga and Al, or any two or more of In, Ga and Al, and is on identical atomic coordinates at a predetermined ratio, the atomic coordinates on which the at least one metal is arranged are in a range of x±0.01, y±0.01, and z±0.01, and atomic coordinates on which oxygen is arranged are in a range of x±0.01, y±0.01, and z±0.01, where atomic species: metal, atomic coordinates (x=0.04, y=0.36, z=0.87), atomic species: metal, atomic coordinates (x=0.13, y=0.12, z=0.62), atomic species: metal, atomic coordinates (x=0.21, y=0.85, z=0.39), atomic species: metal, atomic coordinates (x=0.23, y=0.11, z=0.97), atomic species: metal, atomic coordinates (x=0.29, y=0.64, z=0.11), atomic species: metal, atomic coordinates (x=0.46, y=0.12, z=0.63), atomic species: metal, atomic coordinates (x=0.58, y=0.14, z=0.01), atomic species: metal, atomic coordinates (x=0.62, y=0.64, z=0.11), atomic species: metal, atomic coordinates (x=0.69, y=0.18, z=0.32), atomic species: metal, atomic coordinates (x=0.09, y=0.88, z=0.03), atomic species: metal, atomic coordinates (x=0.02, y=0.13, z=0.30), atomic species: metal, atomic coordinates (x=0.06, y=0.61, z=0.46), atomic species: metal, atomic coordinates (x=0.15, y=0.40, z=0.19), atomic species: metal, atomic coordinates (x=0.26, y=0.36, z=0.54), atomic species: metal, atomic coordinates (x=0.34, y=0.13, z=0.30), atomic species: metal, atomic coordinates (x=0.41, y=0.61, z=0.45), atomic species: metal, atomic coordinates (x=0.48, y=0.40, z=0.23), atomic species: metal, atomic coordinates (x=0.84, y=0.39, z=0.23), atomic species: oxygen, atomic coordinates (x=0.02, y=0.73, z=0.36), atomic species: oxygen, atomic coordinates (x=0.03, y=0.45, z=0.29), atomic species: oxygen, atomic coordinates (x=0.05, y=0.02, z=0.40), atomic species: oxygen, atomic coordinates (x=0.10, y=0.74, z=0.65), atomic species: oxygen, atomic coordinates (x=0.10, y=0.23, z=0.06), atomic species: oxygen, atomic coordinates (x=0.12, y=0.51, z=0.09), atomic species: oxygen, atomic coordinates (x=0.12, y=0.47, z=0.57), atomic species: oxygen, atomic coordinates (x=0.13, y=0.79, z=0.17), atomic species: oxygen, atomic coordinates (x=0.19, y=0.21, z=0.84), atomic species: oxygen, atomic coordinates (x=0.20, y=0.23, z=0.36), atomic species: oxygen, atomic coordinates (x=0.25, y=0.66, z=0.49), atomic species: oxygen, atomic coordinates (x=0.27, y=0.02, z=0.12), atomic species: oxygen, atomic coordinates (x=0.30, y=0.26, z=0.65), atomic species: oxygen, atomic coordinates (x=0.33, y=0.44, z=0.29), atomic species: oxygen, atomic coordinates (x=0.38, y=0.02, z=0.40), atomic species: oxygen, atomic coordinates (x=0.39, y=0.73, z=0.35), atomic species: oxygen, atomic coordinates (x=0.41, y=0.24, z=0.07), atomic species: oxygen, atomic coordinates (x=0.43, y=0.47, z=0.57), atomic species: oxygen, atomic coordinates (x=0.46, y=0.51, z=0.11), atomic species: oxygen, atomic coordinates (x=0.47, y=0.79, z=0.15), atomic species: oxygen, atomic coordinates (x=0.50, y=0.25, z=0.36), atomic species: oxygen, atomic coordinates (x=0.64, y=0.03, z=0.12), atomic species: oxygen, atomic coordinates (x=0.66, y=0.34, z=0.23), atomic species: oxygen, atomic coordinates (x=0.72, y=0.03, z=0.40), atomic species: oxygen, atomic coordinates (x=0.78, y=0.51, z=0.12), atomic species: oxygen, atomic coordinates (x=0.80, y=0.25, z=0.06), and atomic species: oxygen, atomic coordinates (x=0.96, y=0.02, z=0.12).

[6] The sintered body according to [5], in which when a weight ratio between the Bixbyite structure containing the In element, the crystal structure belonging to the space group P1 or the space group P-1, and a crystal structure other than the Bixbyite structure and the crystal structure belonging to the space group P1 or P-1 is calculated by performing Rietveld analysis on a spectrum obtained by X-ray diffraction measurement on the sintered body, a weight ratio of a crystal of the Bixbyite structure containing the In element to the whole crystal of the sintered body is 70% or more.

[7] The sintered body according to any one of [1] to [6], in which the sintered body contains a H element, and an atomic concentration of the H element in the sintered body is $1\times10^{16}$ cm$^{-3}$ or more and less than $1\times10^{18}$ cm$^{-3}$.

[8] The sintered body according to any one of [1] to [7], in which the sintered body contains a C element, and an atomic concentration of the C element in the sintered body is $1\times10^{16}$ cm$^{-3}$ or more and less than $1\times10^{18}$ cm$^{-3}$.

[9] The sintered body according to any one of [1] to [8], in which a bending strength of the sintered body is 190 MPa or more.

[10] A sputtering target using the sintered body of the oxide according to any one of [1] to [9].

[11] An oxide thin film using the sputtering target according to [10].

[12] A thin film transistor including the oxide thin film according to [11].

[13] An electronic device including the thin film transistor according to [12].

[14] A method of producing a sintered body of an oxide containing an In element, a Ga element, and an Al element, the method including:

mixing and disintegrating indium oxide, gallium oxide, and aluminum oxide by bead milling, followed by granulation through a spray drying method to obtain granulated powder, and classifying the granulated powder;

molding the granulated powder after the classification into a molded body; and sintering the molded body, in which an atomic composition ratio of the In element and an atomic composition ratio of the Al element in the sintered body respectively satisfy a formula (1) and a formula (2) below, $$[In]/([In]+[Ga]+[Al]) > 0.70 \tag{1}$$

$$[Al]/([In]+[Ga]+[Al]) > 0.01. \tag{2}$$

According to an aspect of the invention, there are provided a sintered body that enables stable sputtering even in large equipment and provides a TFT having high mobility and excellent in processability and in-plane uniformity of optical reliability; a sputtering target using the sintered body; an oxide thin film using the sputtering target; a thin film transistor including the oxide thin film; an electronic device including the thin film transistor; and a method of producing a sintered body that provides a TFT having high mobility and excellent in processability and in-plane uniformity of optical reliability.

BRIEF EXPLANATION OF DRAWINGS

FIG. 7 is a vertical cross-sectional view of a quantum-tunneling field-effect transistor according to an example of the invention.

FIG. 8 is a vertical cross-sectional view of a quantum-tunneling field-effect transistor according to another example.

DESCRIPTION OF EMBODIMENT(S)

Figure 1:
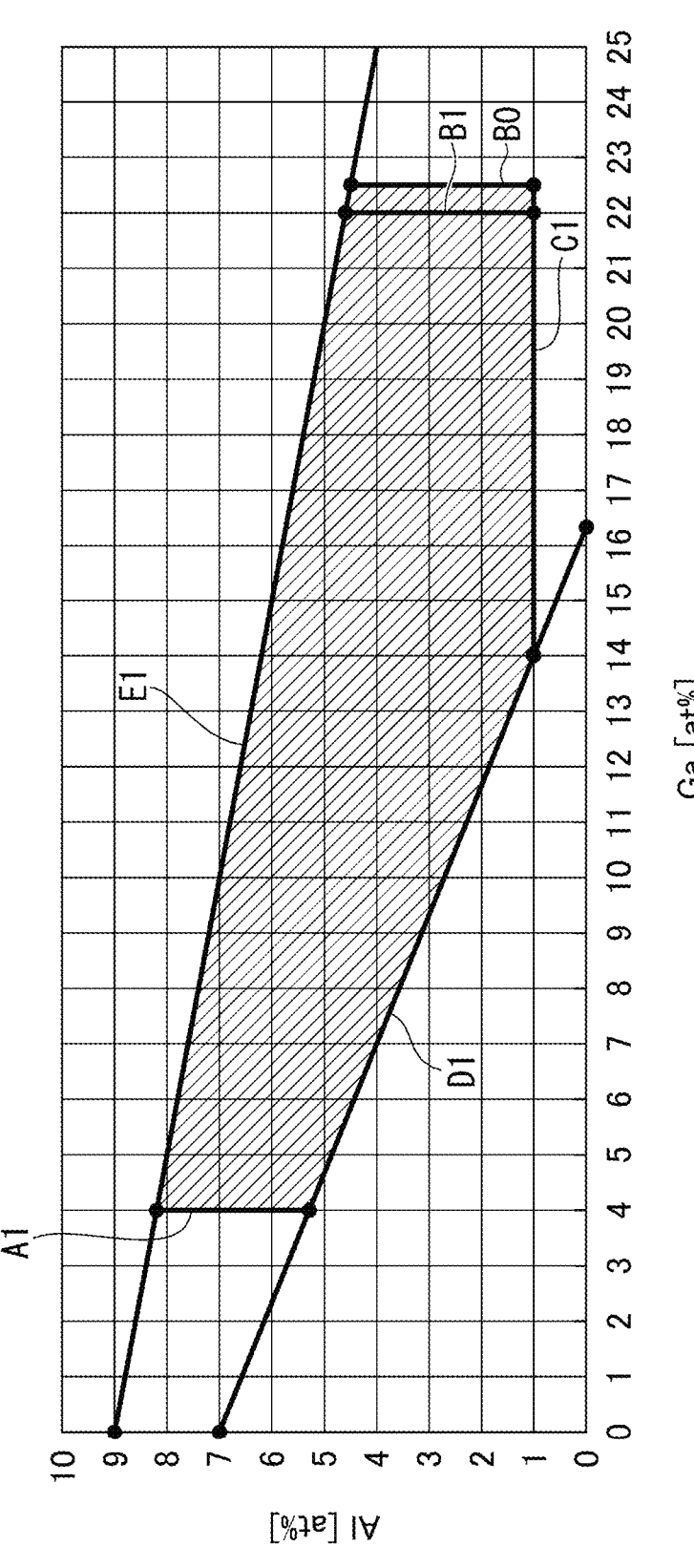
FIG. 1 is a graph indicating an atomic composition range of a sintered body according to an exemplary embodiment of the invention.

An exemplary embodiment of the invention will be described below with reference to the attached drawings, etc. It should however be noted that it is easily understood by those skilled in the art that the exemplary embodiment may be modified in various manners, as long as such modification and details are compatible with the gist and scope of the invention. Accordingly, the scope of the invention should by no means be interpreted to be limited to the disclosure in the exemplary embodiment below.

In the attached drawings, a size, a layer thickness, a region, and the like are occasionally exaggerated for clarification. Accordingly, the invention should by no means be limited to the size, the layer thickness, the region, and the like illustrated in the drawings. It should be noted that the drawings schematically illustrate an ideal example, and the invention is not limited to the shape, value, or the like illustrated in the drawings.

Ordinals such as "first", "second", and "third" used here are appended to avoid confusion between components, and are not numerically limiting.

In the specification and the like, the term "film" or "thin film" is occasionally interchangeable with the term "layer."

In a sintered body and an oxide thin film in the specification and the like, the term "compound" and the term "crystalline phase" are occasionally interchangeable.

Herein, the term "oxide sintered body" is occasionally simply referred to as a "sintered body."

Herein, the term "sputtering target" is occasionally simply referred to as a "target".

In the specification and the like, the term "electrically connected" encompasses a connection through "an object of some electric action". The "object of some electric action" is not limited to a specific object as long as such an object allows communication of electric signals between connected components. Examples of the "object of some electric action" include an electrode, a line (wiring line), a switching element such as a transistor, a resistor, an inductor, a capacitor, and devices having other functions.

In the specification and the like, a source and a drain of a transistor are occasionally interchanged, for instance, when transistors of different polarity are used or a direction of a current is changed during an operation of a circuit. Accordingly, the terms "source" and "drain" in the specification and the like are interchangeable.

Herein, numerical ranges represented by "x to y" represent a range whose lower limit is the value (x) recited before "to" and whose upper limit is the value (y) recited after "to".

The inventors invented the invention based on the following findings.

The inventors have found out that by studying atomic composition ratios of a Ga (gallium) element and an Al (aluminum) element in a sintered body of an oxide containing an In (indium) element, the Ga (gallium) element, and the Al (aluminum) element, stable sputtering can be performed even when large panels are produced using large equipment, and a TFT having high mobility and excellent in processability and in-plane uniformity of optical reliability can be produced.

In addition to studying the atomic composition ratios of the Ga (gallium) element and the Al (aluminum) element in the sintered body of the oxide containing the In (indium)

element, the Ga (gallium) element, and the Al (aluminum) element, the inventors have also studied the reduction in the amount of pores generated in the sintered body. Through those studies, the inventors have found out that it is possible to enable stable sputtering with cracking of the target inhibited even when large panels are produced using large equipment, and to produce a TFT having high mobility and excellent in processability and in-plane uniformity of optical reliability.

1. Sintered Body

A first example and a second example of a sintered body according to the exemplary embodiment will be described.

First Example

The first example of the sintered body according to the exemplary embodiment is a sintered body of an oxide that contains an In (indium) element, a Ga (gallium) element, and an Al (aluminum) element, in which an atomic composition ratio of the In element and an atomic composition ratio of the Al element respectively satisfy a formula (1) and a formula (2) below.

$$[In]/([In]+[Ga]+[Al]) > 0.70 \qquad (1)$$

$$[Al]/([In]+[Ga]+[Al]) > 0.01 \qquad (2)$$

Herein, [In], [Ga], and [Al] in the formulae representing atomic ratios respectively represent the number of atoms of the indium, gallium, and aluminum elements in the sintered body.

The first and second examples of the sintered body according to the exemplary embodiment may each consist essentially of the In (indium) element, the Ga (gallium) element, the Al (aluminum) element, and an O (oxygen) element. Herein, the term "essentially" means that the sintered body according to the exemplary embodiment may contain other component(s) to the extent that the effects of the invention attributed to the combination of the In element, Ga element, Al element, and O element are achieved. In this case, the first and second examples of the sintered body according to the exemplary embodiment may each contain an element(s) that is an impurity. For instance, in the first and second examples, 99 atomic % or more of the elements contained in the oxide sintered body may be the In element, Ga element, Al element and O element, and 99.9 atomic % or more of the elements contained in the oxide sintered body may be the In element, Ga element, Al element and O element. Further, in the first and second examples, 99 atomic % or more of the metal elements contained in the oxide sintered body may be the In element, Ga element, and Al element, and 99.9 atomic % or more of the metal elements contained in the oxide sintered body may be the In element, Ga element, and Al element. Herein, the atomic % is occasionally denoted by at %.

The impurity refers to an element not intentionally added, that is, an element mixed at least in the raw material or during a production process. The impurity is thus inevitable impurities inevitably contained. The same applies to the following description. Examples of the impurity include at least one selected from the group consisting of an alkali metal element (such as Li (lithium), Na (sodium), K (potassium), Rb (rubidium), or the like), an alkaline earth metal element (such as Mg (magnesium), Ca (calcium), Sr (strontium), Ba (barium), or the like), a H element (hydrogen element), a B element (boron element), a C element (carbon element), a N element (nitrogen element), a F element (fluorine element), a Si element (silicon element), and a Cl element (chlorine element).

In the first example of the sintered body according to the exemplary embodiment, setting the atomic composition ratio of the Al element to the lower limit or more of the above formula (2) results in a TFT having high mobility and excellent in processability and in-plane uniformity of optical reliability, the TFT being obtained by sputtering with a target having the same atomic composition as the sintered body.

In the sintered body according to the exemplary embodiment, $[Al]/([In]+[Ga]+[Al])$ is preferably more than 0.01, more preferably 0.011 or more, still more preferably 0.015 or more, still further more preferably 0.02 or more, and yet still further more preferably 0.025 or more, from the viewpoint of obtaining a TFT having high mobility and excellent in processability and in-plane uniformity of optical reliability.

By increasing the atomic ratio of the Al element, an optical bandgap becomes large and electron-hole pairs are not likely to be generated upon light irradiation, improving optical reliability.

The upper limit of $[Al]/([In]+[Ga]+[Al])$ is not particularly limited. $[Al]/([In]+[Ga]+[Al])$ is preferably less than 0.18, more preferably 0.15 or less, still more preferably 0.09 or less, and still further more preferably 0.08 or less, for instance, from the viewpoint of obtaining a TFT having high mobility and excellent in processability and in-plane uniformity of optical reliability.

If the atomic ratio of the Al element is increased too much, the Al element in the oxide thin film included in the TFT tends to become a scattering source in electron conduction, leading to a decrease in mobility.

In the sintered body according to the exemplary embodiment, $[In]/([In]+[Ga]+[Al])$ is preferably 0.71 or more and more preferably 0.72 or more, from the viewpoint of obtaining a TFT having high mobility and excellent in processability and in-plane uniformity of optical reliability.

By increasing the atomic ratio of the In element, annealing at a TFT production process temperature (250 to 450 degrees C.) facilitates crystallization of the oxide semiconductor film (oxide thin film), resulting in high mobility.

The upper limit of $[In]/([In]+[Ga]+[Al])$ is not particularly limited. $[In]/([In]+[Ga]+[Al])$ is preferably less than 0.99, more preferably 0.98 or less, still more preferably 0.97 or less, and still further more preferably 0.95 or less, for instance, from the viewpoint of obtaining a TFT having high mobility and excellent in processability and in-plane uniformity of optical reliability.

Lowering the atomic ratio of the In element in the above range inhibits crystallization after film formation and facilitates uniform processing without residues in the patterning process for TFT production.

In the sintered body according to the exemplary embodiment, the atomic composition ratio of the Ga element (gallium element) is not particularly limited. The atomic composition ratio of the Ga element preferably satisfies a formula (3) below, from the viewpoint of obtaining a TFT having high mobility and excellent in processability and in-plane uniformity of optical reliability.

$$0.23 \geq [Ga]/([In]+[Ga]+[Al]) \geq 0.04 \qquad (3)$$

[Ga]/([In]+[Ga]+[Al]) is more preferably 0.05 or more, still more preferably 0.06 or more, still further more preferably 0.07 or more, and yet still further more preferably 0.08 or more, from the viewpoint of more easily obtaining a TFT having high mobility and excellent in processability and in-plane uniformity of optical reliability. Also preferably, [Ga]/([In]+[Ga]+[Al]) is 0.10 or more.

Increasing the amount of Ga atoms inhibits crystallization after film formation and facilitates uniform processing with less residues in the patterning process for TFT production.

[Ga]/([In]+[Ga]+[Al]) is more preferably 0.225 or less, still more preferably 0.22 or less, and still further more preferably 0.20 or less, from the viewpoint of obtaining a TFT having high mobility and excellent in processability and in-plane uniformity of optical reliability. Also preferably, [Ga]/([In]+[Ga]+[Al]) is 0.18 or less.

A low amount of Ga atoms makes the In ratio high, and annealing at the TFT production process temperature (250 to 450 degrees C.) facilitates crystallization of the oxide semiconductor film (oxide thin film), resulting in high mobility.

In the sintered body according to the exemplary embodiment, the atomic composition ratios of the Ga (gallium) element and the Al (aluminum) element preferably satisfy conditions below, from the viewpoint of obtaining a TFT having high mobility and excellent in processability and in-plane uniformity of optical reliability.

Provided that the atomic composition ratio of the Ga element represented by $\{[Ga]/([In]+[Ga]+[Al])\} \times 100$ is $x$ and the atomic composition ratio of the Al element represented by $\{[Al]/([In]+[Ga]+[Al])\} \times 100$ is $y$, the $x$ and the $y$ are preferably, in atomic %, within a composition range bounded by straight lines of (A1), (B0), (C1), (D1), and (E1) below.

$$x \geq 4 \tag{A1}$$

$$x \leq 22.5 \tag{B0}$$

$$y > 1 \tag{C1}$$

$$6x + 14y - 98 \geq 0 \tag{D1}$$

$$4x + 20y - 180 \leq 0 \tag{E1}$$

Likewise, the sintered body of the first example is more preferably within a composition range bounded by straight lines of (A1), (B1), (C1), (D1), and (E1) below.

$$x \geq 4 \tag{A1}$$

$$x \leq 22 \tag{B1}$$

$$y > 1 \tag{C1}$$

$$6x + 14y - 98 \geq 0 \tag{D1}$$

$$4x + 20y - 180 \leq 0 \tag{E1}$$

Likewise, the sintered body of the first example is still more preferably within a composition range bounded by straight lines of (A2), (B2), (C1), (D1), and (E1) below.

$$x \geq 8 \tag{A2}$$

$$x \leq 20 \tag{B2}$$

-continued $$y > 1 \tag{C1}$$

$$6x + 14y - 98 \geq 0 \tag{D1}$$

$$4x + 20y - 180 \leq 0 \tag{E1}$$

Likewise, the sintered body of the first example is also still more preferably within a composition range bounded by straight lines of (A3), (B3), (C1), (D1), and (E1) below.

$$x \geq 10 \tag{A3}$$

$$x \leq 18 \tag{B3}$$

$$y > 1 \tag{C1}$$

$$6x + 14y - 98 \geq 0 \tag{D1}$$

$$4x + 20y - 180 \leq 0 \tag{E1}$$

Likewise, the sintered body of the first example is also preferably within any of a composition range bounded by straight lines of (A1) above, (C1) above, (D1) above, (E1) above, and a formula (B0-0) below, a composition range bounded by straight lines of (A1) above, (C1) above, (D1) above, (E1) above, and a formula (B0-1) below, and a composition range bounded by straight lines of (A1) above, (C1) above, (D1) above, (E1) above, and a formula (B0-2) below.

$$x \leq 23 \tag{B0-0}$$

$$22 < x \leq 23 \tag{B0-1}$$

$$22 < x \leq 22.5 \tag{B0-2}$$

When the atomic composition ratio of the Ga element in the sintered body satisfies (A1) above, preferably (A2) above, crystallization after film formation is inhibited to facilitate uniform processing without residues in the patterning process for TFT production.

When the atomic composition ratio of the Ga element in the sintered body satisfies preferably (B0) above, more preferably (B1) above, and still more preferably (B2) above, the atomic ratio of the In element is high, and annealing at the TFT production process temperature (250 to 450 degrees C.) facilitates crystallization of the oxide semiconductor film (oxide thin film), resulting in high mobility.

When the atomic composition ratio of the Al element in the sintered body satisfies (C1) above, a TFT obtained by using the sintered body according to the exemplary embodiment is excellent in in-plane uniformity of optical reliability.

When the atomic composition ratios of the Ga element and the Al element in the sintered body satisfy (D1) above, that is, when (D1) above is zero or in a range greater than zero, a TFT obtained by using the sintered body according to the exemplary embodiment is excellent in processability. In other words, a TFT obtained by using the sintered body according to the exemplary embodiment is inhibited from containing residues after patterning.

When the atomic composition ratios of the Ga element and the Al element in the sintered body satisfy (E1) above, that is, when (E1) above is zero or in a range less than zero, a TFT obtained by using the sintered body according to the exemplary embodiment has high mobility and is excellent in in-plane uniformity of optical reliability.

The content (atomic ratio) of each metal element in the sintered body can be determined by measuring the abundance of each metal element by Inductive Coupled Plasma (ICP) measurement or X-ray Fluorescence (XRF) measurement. An inductively coupled plasma emission spectrometer can be used for the ICP measurement. A thin film X-ray fluorescence analyzer can be used for the XRF measurement.

Figure 2:
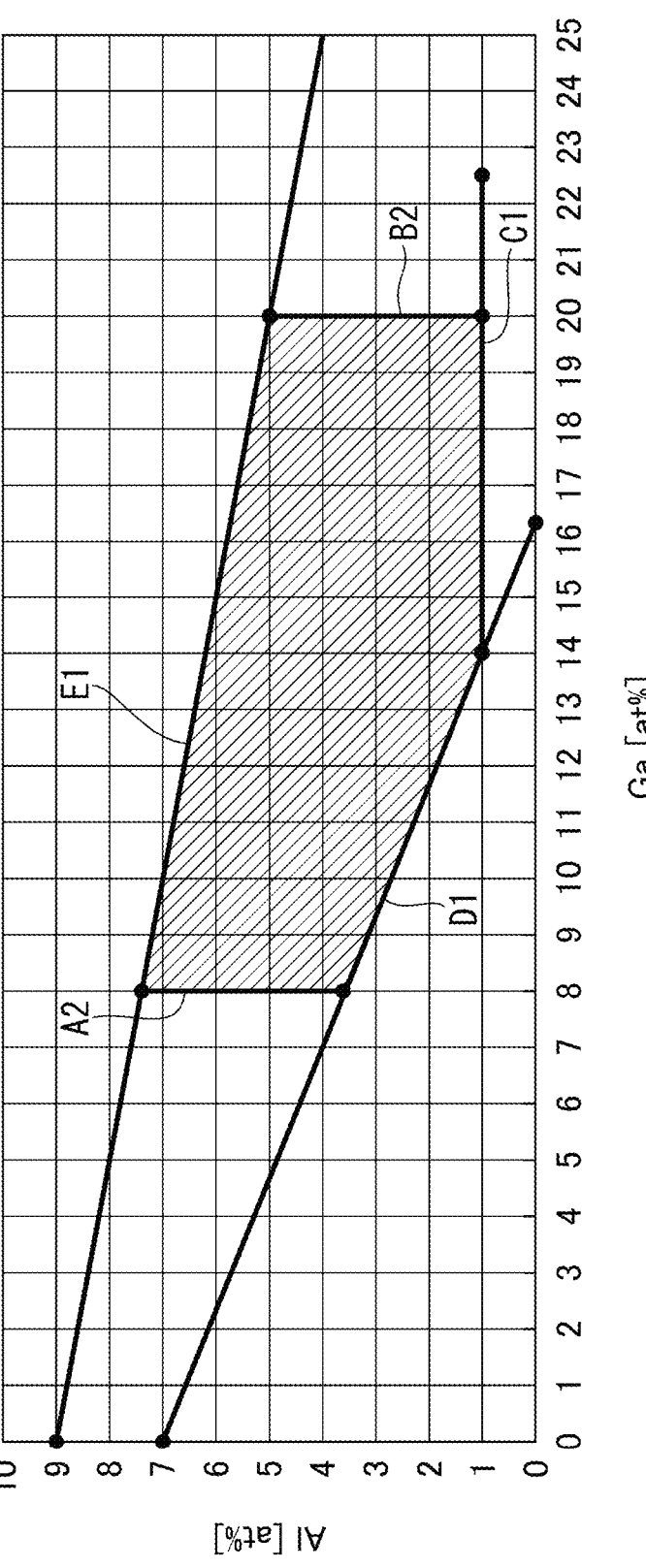
FIG. 2 is a graph indicating an atomic composition range of the sintered body according to the exemplary embodiment of the invention.

Referring to FIGS. 1 and 2, the atomic composition ratios of the Ga (gallium) element and the Al (aluminum) element are preferably within a range bounded by straight lines of A1, B0, C1, D1, and E1, more preferably within a range bounded by straight lines of A1, B1, C1, D1, and E1, as illustrated in FIG. 1; and the atomic composition ratios of the Ga (gallium) element and the Al (aluminum) element are still more preferably within a range bounded by straight lines of A2, B2, C1, D1, and E1, as illustrated in FIG. 2.

Preferably, the sintered body includes a Bixbyite structure containing the In element and a crystal structure belonging to a space group P1 or a space group P-1, from the viewpoint of enabling stable sputtering in large production equipment (large equipment) and more easily producing a TFT having high mobility and excellent in processability and in-plane uniformity of optical reliability. The crystal structure belonging to the space group P1 or P-1 is a triclinic crystal system belonging to the space group P1 or P-1. The crystal structure belonging to the space group P1 is represented by a crystal structure parameter (X) below, and the crystal structure belonging to the space group P-1 is represented by a crystal structure parameter (Y) below. The fact that the sintered body includes the Bixbyite structure containing the In element and the fact that the sintered body includes the crystal structure belonging to the space group P1 or P-1 can both be confirmed by X-ray diffraction of the sintered body.

Crystal Structure Parameter (X):
lattice constants are $a=10.07\pm0.15$ Å, $b=10.45\pm0.15$ Å, $c=11.01\pm0.15$ Å, $\alpha=111.70\pm0.50°$, $\beta=107.70\pm0.50°$, and $\gamma=90.00\pm0.50°$, the sintered body has a triclinic crystal system, at least one metal in an atomic configuration below of the space group P1 is any one of In, Ga and Al, or any two or more of In, Ga and Al, and is on identical atomic coordinates at a predetermined ratio, the atomic coordinates on which the at least one metal is arranged are in a range of $x\pm0.01$, $y\pm0.01$, and $z\pm0.01$, and atomic coordinates on which oxygen is arranged are in a range of $x\pm0.01$, $y\pm0.01$, and $z\pm0.01$, where atomic species: metal, atomic coordinates ($x=0.04$, $y=0.36$, $z=0.87$), atomic species: metal, atomic coordinates ($x=0.13$, $y=0.12$, $z=0.62$), atomic species: metal, atomic coordinates ($x=0.21$, $y=0.85$, $z=0.39$), atomic species: metal, atomic coordinates ($x=0.23$, $y=0.11$, $z=0.97$), atomic species: metal, atomic coordinates ($x=0.29$, $y=0.64$, $z=0.11$), atomic species: metal, atomic coordinates ($x=0.46$, $y=0.12$, $z=0.63$), atomic species: metal, atomic coordinates ($x=0.58$, $y=0.14$, $z=0.01$), atomic species: metal, atomic coordinates ($x=0.62$, $y=0.64$, $z=0.11$), atomic species: metal, atomic coordinates ($x=0.69$, $y=0.18$, $z=0.32$), atomic species: metal, atomic coordinates ($x=0.09$, $y=0.88$, $z=0.03$), atomic species: metal, atomic coordinates ($x=0.02$, $y=0.13$, $z=0.30$), atomic species: metal, atomic coordinates ($x=0.06$, $y=0.61$, $z=0.46$), atomic species: metal, atomic coordinates ($x=0.15$, $y=0.40$, $z=0.19$), atomic species: metal, atomic coordinates ($x=0.26$, $y=0.36$, $z=0.54$), atomic species: metal, atomic coordinates ($x=0.34$, $y=0.13$, $z=0.30$), atomic species: metal, atomic coordinates ($x=0.41$, $y=0.61$, $z=0.45$), atomic species: metal, atomic coordinates ($x=0.48$, $y=0.40$, $z=0.23$), atomic species: metal, atomic coordinates ($x=0.84$, $y=0.39$, $z=0.23$), atomic species: metal, atomic coordinates ($x=0.96$, $y=0.64$, $z=0.13$), atomic species: metal, atomic coordinates ($x=0.87$, $y=0.88$, $z=0.38$), atomic species: metal, atomic coordinates ($x=0.79$, $y=0.15$, $z=0.61$), atomic species: metal, atomic coordinates ($x=0.77$, $y=0.89$, $z=0.03$), atomic species: metal, atomic coordinates ($x=0.71$, $y=0.36$, $z=0.89$), atomic species: metal, atomic coordinates ($x=0.54$, $y=0.88$, $z=0.37$), atomic species: metal, atomic coordinates ($x=0.42$, $y=0.86$, $z=0.99$), atomic species: metal, atomic coordinates ($x=0.38$, $y=0.36$, $z=0.89$), atomic species: metal, atomic coordinates ($x=0.31$, $y=0.82$, $z=0.68$), atomic species: metal, atomic coordinates ($x=0.91$, $y=0.12$, $z=0.97$), atomic species: metal, atomic coordinates ($x=0.98$, $y=0.87$, $z=0.70$), atomic species: metal, atomic coordinates ($x=0.94$, $y=0.39$, $z=0.54$), atomic species: metal, atomic coordinates ($x=0.85$, $y=0.60$, $z=0.81$), atomic species: metal, atomic coordinates ($x=0.74$, $y=0.64$, $z=0.46$), atomic species: metal, atomic coordinates ($x=0.66$, $y=0.87$, $z=0.70$), atomic species: metal, atomic coordinates ($x=0.59$, $y=0.39$, $z=0.55$), atomic species: metal, atomic coordinates ($x=0.52$, $y=0.60$, $z=0.77$), atomic species: metal, atomic coordinates ($x=0.16$, $y=0.61$, $z=0.77$), atomic species: oxygen, atomic coordinates ($x=0.02$, $y=0.73$, $z=0.36$), atomic species: oxygen, atomic coordinates ($x=0.03$, $y=0.45$, $z=0.29$), atomic species: oxygen, atomic coordinates ($x=0.05$, $y=0.02$, $z=0.40$), atomic species: oxygen, atomic coordinates ($x=0.10$, $y=0.74$, $z=0.65$), atomic species: oxygen, atomic coordinates ($x=0.10$, $y=0.23$, $z=0.06$), atomic species: oxygen, atomic coordinates (x=0.12, y=0.51, z=0.09), atomic species: oxygen, atomic coordinates (x=0.12, y=0.47, z=0.57), atomic species: oxygen, atomic coordinates (x=0.13, y=0.79, z=0.17), atomic species: oxygen, atomic coordinates (x=0.19, y=0.21, z=0.84), atomic species: oxygen, atomic coordinates (x=0.20, y=0.23, z=0.36), atomic species: oxygen, atomic coordinates (x=0.25, y=0.66, z=0.49), atomic species: oxygen, atomic coordinates (x=0.27, y=0.02, z=0.12), atomic species: oxygen, atomic coordinates (x=0.30, y=0.26, z=0.65), atomic species: oxygen, atomic coordinates (x=0.33, y=0.44, z=0.29), atomic species: oxygen, atomic coordinates (x=0.38, y=0.02, z=0.40), atomic species: oxygen, atomic coordinates (x=0.39, y=0.73, z=0.35), atomic species: oxygen, atomic coordinates (x=0.41, y=0.24, z=0.07), atomic species: oxygen, atomic coordinates (x=0.43, y=0.47, z=0.57), atomic species: oxygen, atomic coordinates (x=0.46, y=0.51, z=0.11), atomic species: oxygen, atomic coordinates (x=0.47, y=0.79, z=0.15), atomic species: oxygen, atomic coordinates (x=0.50, y=0.25, z=0.36), atomic species: oxygen, atomic coordinates (x=0.64, y=0.03, z=0.12), atomic species: oxygen, atomic coordinates (x=0.66, y=0.34, z=0.23), atomic species: oxygen, atomic coordinates (x=0.72, y=0.03, z=0.40), atomic species: oxygen, atomic coordinates (x=0.78, y=0.51, z=0.12), atomic species: oxygen, atomic coordinates (x=0.80, y=0.25, z=0.06), atomic species: oxygen, atomic coordinates (x=0.96, y=0.02, z=0.12), atomic species: oxygen, atomic coordinates (x=0.98, y=0.27, z=0.64), atomic species: oxygen, atomic coordinates (x=0.97, y=0.55, z=0.72), atomic species: oxygen, atomic coordinates (x=0.95, y=0.98, z=0.60), atomic species: oxygen, atomic coordinates (x=0.90, y=0.26, z=0.35), atomic species: oxygen, atomic coordinates (x=0.90, y=0.77, z=0.94), atomic species: oxygen, atomic coordinates (x=0.88, y=0.49, z=0.91), atomic species: oxygen, atomic coordinates (x=0.88, y=0.53, z=0.43), atomic species: oxygen, atomic coordinates (x=0.87, y=0.21, z=0.83), atomic species: oxygen, atomic coordinates (x=0.81, y=0.79, z=0.16), atomic species: oxygen, atomic coordinates (x=0.80, y=0.77, z=0.64), atomic species: oxygen, atomic coordinates (x=0.75, y=0.34, z=0.51), atomic species: oxygen, atomic coordinates (x=0.73, y=0.98, z=0.88), atomic species: oxygen, atomic coordinates (x=0.70, y=0.74, z=0.35), atomic species: oxygen, atomic coordinates (x=0.67, y=0.56, z=0.71), atomic species: oxygen, atomic coordinates (x=0.62, y=0.98, z=0.60), atomic species: oxygen, atomic coordinates (x=0.61, y=0.27, z=0.65), atomic species: oxygen, atomic coordinates (x=0.59, y=0.76, z=0.93), atomic species: oxygen, atomic coordinates (x=0.58, y=0.53, z=0.43), atomic species: oxygen, atomic coordinates (x=0.54, y=0.49, z=0.89), atomic species: oxygen, atomic coordinates (x=0.53, y=0.21, z=0.85), atomic species: oxygen, atomic coordinates (x=0.50, y=0.75, z=0.64), atomic species: oxygen, atomic coordinates (x=0.36, y=0.97, z=0.88), atomic species: oxygen, atomic coordinates (x=0.34, y=0.66, z=0.77), atomic species: oxygen, atomic coordinates (x=0.28, y=0.97, z=0.60), atomic species: oxygen, atomic coordinates (x=0.22, y=0.49, z=0.88), atomic species: oxygen, atomic coordinates (x=0.20, y=0.75, z=0.94), and atomic species: oxygen, atomic coordinates (x=0.04, y=0.98, z=0.88).

Crystal Structure Parameter (Y):

lattice constants are a=10.07±0.15 Å, b=10.45±0.15 Å, c=11.01±0.15 Å, α=111.70±0.50°, β=107.70±0.50°, and γ=90.00±0.50°, the sintered body has a triclinic crystal system, at least one metal in an atomic configuration below of the space group P-1 is any one of In, Ga and Al, or any two or more of In, Ga and Al, and is on identical atomic coordinates at a predetermined ratio, the atomic coordinates on which the at least one metal is arranged are in a range of x±0.01, y±0.01, and z±0.01, and atomic coordinates on which oxygen is arranged are in a range of x±0.01, y±0.01, and z±0.01, where atomic species: metal, atomic coordinates (x=0.04, y=0.36, z=0.87), atomic species: metal, atomic coordinates (x=0.13, y=0.12, z=0.62), atomic species: metal, atomic coordinates (x=0.21, y=0.85, z=0.39), atomic species: metal, atomic coordinates (x=0.23, y=0.11, z=0.97), atomic species: metal, atomic coordinates (x=0.29, y=0.64, z=0.11), atomic species: metal, atomic coordinates (x=0.46, y=0.12, z=0.63), atomic species: metal, atomic coordinates (x=0.58, y=0.14, z=0.01), atomic species: metal, atomic coordinates (x=0.62, y=0.64, z=0.11), atomic species: metal, atomic coordinates (x=0.69, y=0.18, z=0.32), atomic species: metal, atomic coordinates (x=0.09, y=0.88, z=0.03), atomic species: metal, atomic coordinates (x=0.02, y=0.13, z=0.30), atomic species: metal, atomic coordinates (x=0.06, y=0.61, z=0.46), atomic species: metal, atomic coordinates (x=0.15, y=0.40, z=0.19), atomic species: metal, atomic coordinates (x=0.26, y=0.36, z=0.54), atomic species: metal, atomic coordinates (x=0.34, y=0.13, z=0.30), atomic species: metal, atomic coordinates (x=0.41, y=0.61, z=0.45), atomic species: metal, atomic coordinates (x=0.48, y=0.40, z=0.23), atomic species: metal, atomic coordinates (x=0.84, y=0.39, z=0.23), atomic species: oxygen, atomic coordinates (x=0.02, y=0.73, z=0.36), atomic species: oxygen, atomic coordinates (x=0.03, y=0.45, z=0.29), atomic species: oxygen, atomic coordinates (x=0.05, y=0.02, z=0.40), atomic species: oxygen, atomic coordinates (x=0.10, y=0.74, z=0.65), atomic species: oxygen, atomic coordinates (x=0.10, y=0.23, z=0.06), atomic species: oxygen, atomic coordinates (x=0.12, y=0.51, z=0.09), atomic species: oxygen, atomic coordinates (x=0.12, y=0.47, z=0.57), atomic species: oxygen, atomic coordinates (x=0.13, y=0.79, z=0.17), atomic species: oxygen, atomic coordinates (x=0.19, y=0.21, z=0.84), atomic species: oxygen, atomic coordinates (x=0.20, y=0.23, z=0.36), atomic species: oxygen, atomic coordinates (x=0.25, y=0.66, z=0.49), atomic species: oxygen, atomic coordinates (x=0.27, y=0.02, z=0.12), atomic species: oxygen, atomic coordinates (x=0.30, y=0.26, z=0.65), atomic species: oxygen, atomic coordinates (x=0.33, y=0.44, z=0.29), atomic species: oxygen, atomic coordinates (x=0.38, y=0.02, z=0.40), atomic species: oxygen, atomic coordinates (x=0.39, y=0.73, z=0.35), atomic species: oxygen, atomic coordinates (x=0.41, y=0.24, z=0.07), atomic species: oxygen, atomic coordinates (x=0.43, y=0.47, z=0.57), atomic species: oxygen, atomic coordinates (x=0.46, y=0.51, z=0.11), atomic species: oxygen, atomic coordinates (x=0.47, y=0.79, z=0.15), atomic species: oxygen, atomic coordinates (x=0.50, y=0.25, z=0.36), atomic species: oxygen, atomic coordinates (x=0.64, y=0.03, z=0.12), atomic species: oxygen, atomic coordinates (x=0.66, y=0.34, z=0.23), atomic species: oxygen, atomic coordinates (x=0.72, y=0.03, z=0.40), atomic species: oxygen, atomic coordinates (x=0.78, y=0.51, z=0.12), atomic species: oxygen, atomic coordinates (x=0.80, y=0.25, z=0.06), and atomic species: oxygen, atomic coordinates (x=0.96, y=0.02, z=0.12).

The crystal structure belonging to the space group P1, which may be included in the sintered body, may be represented by a crystal structure parameter (X1) below.

Crystal Structure Parameter (X1):

lattice constants are a=10.07±0.15 Å, b=10.45±0.15 Å, c=11.01±0.15 Å, α=111.70±0.50°, β=107.70±0.50°, and γ=90.00±0.50°, the sintered body has a triclinic crystal system, at least one metal in an atomic configuration below of the space group P1 is any one of In, Ga and Al, or any two or more of In, Ga and Al, and is on identical atomic coordinates at a predetermined ratio, the atomic coordinates on which the at least one metal is arranged are in a range of x±0.01, y±0.01, and z±0.01, and atomic coordinates on which oxygen is arranged are in a range of x±0.01, y±0.01, and z±0.01, where atomic species: metal, atomic coordinates (x=0.04478, y=0.36228, z=0.86934), atomic species: metal, atomic coordinates (x=0.12677, y=0.11682, z=0.62279), atomic species: metal, atomic coordinates (x=0.21268, y=0.8504, z=0.38665), atomic species: metal, atomic coordinates (x=0.23283, y=0.11047, z=0.97132), atomic species: metal, atomic coordinates (x=0.28695, y=0.64349, z=0.10627), atomic species: metal, atomic coordinates (x=0.45663, y=0.11849, z=0.62655), atomic species: metal, atomic coordinates (x=0.58343, y=0.14455, z=0.0065), atomic species: metal, atomic coordinates (x=0.62181, y=0.6417, z=0.10725), atomic species: metal, atomic coordinates (x=0.68785, y=0.18413, z=0.31614), atomic species: metal, atomic coordinates (x=0.08662, y=0.88097, z=0.03282), atomic species: metal, atomic coordinates (x=0.02388, y=0.13328, z=0.30129), atomic species: metal, atomic coordinates (x=0.0627, y=0.6051, z=0.4561), atomic species: metal, atomic coordinates (x=0.1503, y=0.3962, z=0.1949), atomic species: metal, atomic coordinates (x=0.2624, y=0.36429, z=0.5374), atomic species: metal, atomic coordinates (x=0.34051, y=0.1304, z=0.29845), atomic species: metal, atomic coordinates (x=0.4081, y=0.6082, z=0.4509), atomic species: metal, atomic coordinates (x=0.4821, y=0.39651, z=0.22899), atomic species: metal, atomic coordinates (x=0.8369, y=0.39245, z=0.23049), atomic species: metal, atomic coordinates (x=0.95522, y=0.63772, z=0.13066), atomic species: metal, atomic coordinates (x=0.87323, y=0.88318, z=0.37721), atomic species: metal, atomic coordinates (x=0.78732, y=0.1496, z=0.61335), atomic species: metal, atomic coordinates (x=0.76717, y=0.88953, z=0.02868), atomic species: metal, atomic coordinates (x=0.71305, y=0.35651, z=0.89373), atomic species: metal, atomic coordinates (x=0.54337, y=0.88151, z=0.37345), atomic species: metal, atomic coordinates (x=0.41657, y=0.85545, z=0.9935), atomic species: metal, atomic coordinates (x=0.37819, y=0.3583, z=0.89275), atomic species: metal, atomic coordinates (x=0.31215, y=0.81587, z=0.68386), atomic species: metal, atomic coordinates (x=0.91338, y=0.11903, z=0.96718), atomic species: metal, atomic coordinates (x=0.97612, y=0.86672, z=0.69871), atomic species: metal, atomic coordinates (x=0.9373, y=0.3949, z=0.5439), atomic species: metal, atomic coordinates (x=0.8497, y=0.6038, z=0.8051), atomic species: metal, atomic coordinates (x=0.7376, y=0.63571, z=0.4626), atomic species: metal, atomic coordinates (x=0.65949, y=0.8696, z=0.70155), atomic species: metal, atomic coordinates (x=0.5919, y=0.3918, z=0.5491), atomic species: metal, atomic coordinates (x=0.5179, y=0.60349, z=0.77101), atomic species: metal, atomic coordinates (x=0.1631, y=0.60755, z=0.76951), atomic species: oxygen, atomic coordinates (x=0.0157, y=0.7332, z=0.3627), atomic species: oxygen, atomic coordinates (x=0.0295, y=0.4499, z=0.285), atomic species: oxygen, atomic coordinates (x=0.0518, y=0.0204, z=0.4013), atomic species: oxygen, atomic coordinates (x=0.0975, y=0.7442, z=0.6484), atomic species: oxygen, atomic coordinates (x=0.1004, y=0.231, z=0.0611), atomic species: oxygen, atomic coordinates (x=0.121, y=0.5054, z=0.0929), atomic species: oxygen, atomic coordinates (x=0.1218, y=0.4677, z=0.5675), atomic species: oxygen, atomic coordinates (x=0.1323, y=0.7893, z=0.17), atomic species: oxygen, atomic coordinates (x=0.1917, y=0.2052, z=0.837), atomic species: oxygen, atomic coordinates (x=0.1998, y=0.2293, z=0.3578), atomic species: oxygen, atomic coordinates (x=0.2461, y=0.6607, z=0.4873), atomic species: oxygen, atomic coordinates (x=0.2703, y=0.0197, z=0.1161), atomic species: oxygen, atomic coordinates (x=0.2975, y=0.2578, z=0.6451), atomic species: oxygen, atomic coordinates (x=0.3274, y=0.4429, z=0.2908), atomic species: oxygen, atomic coordinates (x=0.38, y=0.017, z=0.3996), atomic species: oxygen, atomic coordinates (x=0.3852, y=0.7303, z=0.3495), atomic species: oxygen, atomic coordinates (x=0.4077, y=0.2385, z=0.0657), atomic species: oxygen, atomic coordinates (x=0.425, y=0.4654, z=0.5745), atomic species: oxygen, atomic coordinates (x=0.4569, y=0.5063, z=0.1142), atomic species: oxygen, atomic coordinates (x=0.472, y=0.7862, z=0.1502), atomic species: oxygen, atomic coordinates (x=0.50, y=0.2483, z=0.3581), atomic species: oxygen, atomic coordinates (x=0.6404, y=0.0285, z=0.122), atomic species: oxygen, atomic coordinates (x=0.6587, y=0.3356, z=0.2257), atomic species: oxygen, atomic coordinates (x=0.7171, y=0.0302, z=0.3985), atomic species: oxygen, atomic coordinates (x=0.7808, y=0.5096, z=0.1234), atomic species: oxygen, atomic coordinates (x=0.8007, y=0.2465, z=0.0562), atomic species: oxygen, atomic coordinates (x=0.9644, y=0.0248, z=0.117), atomic species: oxygen, atomic coordinates (x=0.9843, y=0.2668, z=0.6373), atomic species: oxygen, atomic coordinates (x=0.9705, y=0.5501, z=0.715), atomic species: oxygen, atomic coordinates (x=0.9482, y=0.9796, z=0.5987), atomic species: oxygen, atomic coordinates (x=0.9025, y=0.2558, z=0.3516), atomic species: oxygen, atomic coordinates (x=0.8996, y=0.769, z=0.9389), atomic species: oxygen, atomic coordinates (x=0.879, y=0.4946, z=0.9071), atomic species: oxygen, atomic coordinates (x=0.8782, y=0.5323, z=0.4325), atomic species: oxygen, atomic coordinates (x=0.8677, y=0.2107, z=0.83), atomic species: oxygen, atomic coordinates (x=0.8083, y=0.7948, z=0.163), atomic species: oxygen, atomic coordinates (x=0.8002, y=0.7707, z=0.6422), atomic species: oxygen, atomic coordinates (x=0.7539, y=0.3393, z=0.5127), atomic species: oxygen, atomic coordinates (x=0.7297, y=0.9803, z=0.8839), atomic species: oxygen, atomic coordinates (x=0.7025, y=0.7422, z=0.3549), atomic species: oxygen, atomic coordinates (x=0.6726, y=0.5571, z=0.7092), atomic species: oxygen, atomic coordinates (x=0.62, y=0.983, z=0.6004), atomic species: oxygen, atomic coordinates (x=0.6148, y=0.2697, z=0.6505), atomic species: oxygen, atomic coordinates (x=0.5923, y=0.7615, z=0.9343), atomic species: oxygen, atomic coordinates (x=0.575, y=0.5346, z=0.4255), atomic species: oxygen, atomic coordinates (x=0.5431, y=0.4937, z=0.8858), atomic species: oxygen, atomic coordinates (x=0.528, y=0.2138, z=0.8498), atomic species: oxygen, atomic coordinates (x=0.5, y=0.7517, z=0.6419), atomic species: oxygen, atomic coordinates (x=0.3596, y=0.9715, z=0.878), atomic species: oxygen, atomic coordinates (x=0.3413, y=0.6644, z=0.7743), atomic species: oxygen, atomic coordinates (x=0.2829, y=0.9698, z=0.6015), atomic species: oxygen, atomic coordinates (x=0.2192, y=0.4904, z=0.8766), atomic species: oxygen, atomic coordinates (x=0.1993, y=0.7535, z=0.9438), and atomic species: oxygen, atomic coordinates (x=0.0356, y=0.9752, z=0.883).

The crystal structure belonging to the space group P-1, which may be included in the sintered body, may be represented by a crystal structure parameter (Y1) below.

Crystal Structure Parameter (Y1):

lattice constants are a=10.07±0.15 Å, b=10.45±0.15 Å, c=11.01±0.15 Å, α=111.70±0.50°, β=107.70±0.50°, and γ=90.00±0.50°, the sintered body has a triclinic crystal system, at least one metal in an atomic configuration below of the space group P-1 is any one of In, Ga and Al, or any two or more of In, Ga and Al, and is on identical atomic coordinates at a predetermined ratio, the atomic coordinates on which the at least one metal is arranged are in a range of x±0.01, y±0.01, and z±0.01, and atomic coordinates on which oxygen is arranged are in a range of x±0.01, y±0.01, and z±0.01, where atomic species: metal, atomic coordinates (x=0.04478, y=0.36228, z=0.86934), atomic species: metal, atomic coordinates (x=0.12677, y=0.11682, z=0.62279), atomic species: metal, atomic coordinates (x=0.21268, y=0.8504, z=0.38665), atomic species: metal, atomic coordinates (x=0.23283, y=0.11047, z=0.97132), atomic species: metal, atomic coordinates (x=0.28695, y=0.64349, z=0.10627), atomic species: metal, atomic coordinates (x=0.45663, y=0.11849, z=0.62655), atomic species: metal, atomic coordinates (x=0.58343, y=0.14455, z=0.0065), atomic species: metal, atomic coordinates (x=0.62181, y=0.6417, z=0.10725), atomic species: metal, atomic coordinates (x=0.68785, y=0.18413, z=0.31614), atomic species: metal, atomic coordinates (x=0.08662, y=0.88097, z=0.03282), atomic species: metal, atomic coordinates (x=0.02388, y=0.13328, z=0.30129), atomic species: metal, atomic coordinates (x=0.0627, y=0.6051, z=0.4561), atomic species: metal, atomic coordinates (x=0.1503, y=0.3962, z=0.1949), atomic species: metal, atomic coordinates (x=0.2624, y=0.36429, z=0.5374), atomic species: metal, atomic coordinates (x=0.34051, y=0.1304, z=0.29845), atomic species: metal, atomic coordinates (x=0.4081, y=0.6082, z=0.4509), atomic species: metal, atomic coordinates (x=0.4821, y=0.39651, z=0.22899), atomic species: metal, atomic coordinates (x=0.8369, y=0.39245, z=0.23049), atomic species: oxygen, atomic coordinates (x=0.0157, y=0.7332, z=0.3627), atomic species: oxygen, atomic coordinates (x=0.0295, y=0.4499, z=0.285), atomic species: oxygen, atomic coordinates (x=0.0518, y=0.0204, z=0.4013), atomic species: oxygen, atomic coordinates (x=0.0975, y=0.7442, z=0.6484), atomic species: oxygen, atomic coordinates (x=0.1004, y=0.231, z=0.0611), atomic species: oxygen, atomic coordinates (x=0.121, y=0.5054, z=0.0929), atomic species: oxygen, atomic coordinates (x=0.1218, y=0.4677, z=0.5675), atomic species: oxygen, atomic coordinates (x=0.1323, y=0.7893, z=0.17), atomic species: oxygen, atomic coordinates (x=0.1917, y=0.2052, z=0.837), atomic species: oxygen, atomic coordinates (x=0.1998, y=0.2293, z=0.3578), atomic species: oxygen, atomic coordinates (x=0.2461, y=0.6607, z=0.4873), atomic species: oxygen, atomic coordinates (x=0.2703, y=0.0197, z=0.1161), atomic species: oxygen, atomic coordinates (x=0.2975, y=0.2578, z=0.6451), atomic species: oxygen, atomic coordinates (x=0.3274, y=0.4429, z=0.2908), atomic species: oxygen, atomic coordinates (x=0.38, y=0.017, z=0.3996), atomic species: oxygen, atomic coordinates (x=0.3852, y=0.7303, z=0.3495), atomic species: oxygen, atomic coordinates (x=0.4077, y=0.2385, z=0.0657), atomic species: oxygen, atomic coordinates (x=0.425, y=0.4654, z=0.5745), atomic species: oxygen, atomic coordinates (x=0.4569, y=0.5063, z=0.1142), atomic species: oxygen, atomic coordinates (x=0.472, y=0.7862, z=0.1502), atomic species: oxygen, atomic coordinates (x=0.50, y=0.2483, z=0.3581), atomic species: oxygen, atomic coordinates (x=0.6404, y=0.0285, z=0.122), atomic species: oxygen, atomic coordinates (x=0.6587, y=0.3356, z=0.2257), atomic species: oxygen, atomic coordinates (x=0.7171, y=0.0302, z=0.3985), atomic species: oxygen, atomic coordinates (x=0.7808, y=0.5096, z=0.1234), atomic species: oxygen, atomic coordinates (x=0.8007, y=0.2465, z=0.0562), and atomic species: oxygen, atomic coordinates (x=0.9644, y=0.0248, z=0.117).

Preferably, the Bixbyite structure containing the In element is substantially a Bixbyite structure of indium oxide. Here, "substantially" refers to that in the crystal structure of the Bixbyite structure, 90 volume % or more, preferably 95 volume % or more, more preferably 98 volume % or more is indium oxide showing the Bixbyite structure. Preferably, the Bixbyite structure containing the In element is a Bixbyite structure represented by $In_2O_3$. In the Bixbyite structure here, at least one of Ga or Al may be substituted on the In site, and lattice constants thereof may be different from those of $In_2O_3$, which consists of In and O.

The crystal structure belonging to the space group P1 or P-1 may be either a crystal structure belonging to the space group P1 or a crystal structure belonging to the space group P-1. The crystal structure belonging to the space group P1 or P-1 is preferably a crystal structure belonging to the space group P-1.

It should be noted that "-" between "P" and "1" in the space group "P-1" is formally placed above "1" (hereinafter, the same applies to notations of other space groups).

In the sintered body according to the exemplary embodiment, the weight ratio of the Bixbyite structure containing the In element to the whole crystal of the sintered body is preferably 70% or more from the viewpoint of more easily obtaining a TFT having high mobility and excellent in processability and in-plane uniformity of optical reliability. The weight ratio of the Bixbyite structure containing the In element to the whole crystal of the sintered body is obtained by calculating a weight ratio between the Bixbyite structure containing the In element, the crystal structure belonging to the space group P1 or P-1, and a crystal structure other than the Bixbyite structure and the crystal structure belonging to the space group P1 or P-1 through Rietveld analysis on a spectrum obtained by X-ray diffraction measurement on the sintered body.

The weight ratio of the Bixbyite structure containing the In element to the whole crystal of the sintered body is preferably 99% or less.

The Bixbyite structure containing the In element and the crystal structure belonging to the space group P1 or P-1 can be confirmed by X-ray diffraction (XRD: X-ray Diffraction) measurement.

The sintered body according to the exemplary embodiment may contain a H element (hydrogen element). When the sintered body contains a H element, an atomic concentration of the H element in the sintered body is preferably $1\times10^{16}$ cm$^{-3}$ or more and less than $1\times10^{18}$ cm$^{-3}$.

The atomic concentration of the H element in the sintered body is more preferably $3\times10^{16}$ cm$^{-3}$ or more, still more preferably $5\times10^{16}$ cm$^{-3}$ or more.

If the atomic concentration of the H element in the sintered body is too small, the effect of the H element degassed from a sputtering chamber's adhesion shield plate during film formation is significant, and the degassed H element is mixed unevenly in the formed film. This may reduce the in-plane uniformity of the TFT characteristics.

The atomic concentration of the H element in the sintered body is more preferably $5\times10^{17}$ cm$^{-3}$ or less, still more preferably $3\times10^{17}$ cm$^{-3}$ or less.

If the atomic concentration of the H element in the sintered body is too high, a lot of H element will be mixed in the formed film to form a donor or acceptor level. This may eventually cause the optical reliability of the TFT to deteriorate greatly.

The sintered body according to the exemplary embodiment may contain a C element (carbon element). When the sintered body contains a C element, the lower limit of the atomic concentration of the C element in the sintered body is not particularly limited. The atomic concentration of the C element may be $1\times10^{16}$ cm$^{-3}$ as the amount of impurities in producing the target. The atomic concentration of the C element that may contained in the sintered body is preferably $1\times10^{16}$ cm$^{-3}$ or more and less than $1\times10^{18}$ cm$^{-3}$.

The atomic concentration of the C element in the sintered body is more preferably $7\times10^{17}$ cm$^{-3}$ or less, still more preferably $4\times10^{17}$ cm$^{-3}$ or less.

If the atomic concentration of the C element in the sintered body is too high, a lot of C element will be mixed in the formed film to form a donor or acceptor level. This may eventually cause the optical reliability of the TFT to deteriorate greatly.

The sintered body according to the exemplary embodiment may contain a H element (hydrogen element) and C element (carbon element). When the sintered body contains both a H element and a C element, the atomic concentrations of the H element and the C element are each preferably $1\times10^{16}$ cm$^{-3}$ or more and less than $1\times10^{18}$ cm$^{-3}$. Herein, the unit [atoms/cm$^3$] for the atomic concentration of the H and C elements is occasionally denoted by [cm$^{-3}$].

The atomic concentrations of the H and C elements in the sintered body can be respectively determined by secondary ion mass spectrometry (SIMS) measurement. A dynamic SIMS device can be used for the SIMS measurement.

The sintered body according to the exemplary embodiment preferably has a bending strength of 190 MPa or more. The bending strength of the sintered body is more preferably 200 MPa or more, still more preferably 230 MPa or more.

The upper limit of the bending strength of the sintered body is not particularly limited.

At a bending strength of the sintered body of 190 MPa or more, sputtering is easily performed with the target being prevented from cracking, even when large panels having large areas are produced in large equipment.

The bending strength of the sintered body is determined as follows: in accordance with JIS R 1601:2008, a prismatic test piece is placed across two supports spaced from each other at a 30-mm interval, and a load is applied to a press piece while the press piece is put on a central portion of the test piece. An average of loads applied when 30 test pieces are broken (three-point flexural strength) is defined as the average bending strength.

Second Example

A second example of the sintered body according to the exemplary embodiment is a sintered body of an oxide that contains an In (indium) element, a Ga (gallium) element, and an Al (aluminum) element, in which an atomic composition ratio of the In element and an atomic composition ratio of the Al element respectively satisfy a formula (1) and a formula (2) below, and in a field of view when the sintered body is observed with a scanning electron microscope, an area ratio of pores to an area of the field of view is 0.1% or less.

$$[In]/([In]+[Ga]+[Al]) > 0.70 \qquad (1)$$

$$[Al]/([In]+[Ga]+[Al]) > 0.01 \qquad (2)$$

In the second example of the sintered body according to the exemplary embodiment, setting the atomic composition ratio of the Al element to the lower limit or more of the above formula (2) similarly to the first example results in a TFT having high mobility and excellent in processability and in-plane uniformity of optical reliability, the TFT being obtained by sputtering with a target having the same atomic composition as the sintered body.

In addition, when the second example of the sintered body according to the exemplary embodiment has an area ratio of pores of 0.1% or less, the bending strength is improved. Thus, sputtering can be performed while the target is being prevented from cracking, even when large panels are produced in large equipment.

In the second example of the sintered body according to the exemplary embodiment, the area ratio of pores is preferably less than 0.1%, more preferably 0.09% or less, still more preferably 0.07% or less, and still further more preferably 0.04% or less.

The lower limit of the area ratio of pores is not particularly limited. The area ratio of pores may be 0% or more, or 0.01% or more.

A pore, which is a hole in a grain boundary of crystal grains, is observed as a black portion in the secondary electron image when the SEM image is analyzed. An area ratio X is calculated by X=(S1/St)×100, where the area ratio of pores is defined as X, the area of the field of view when observed with the scanning electron microscope is defined as St, and the area of pores is defined as S1.

Figure 3A:
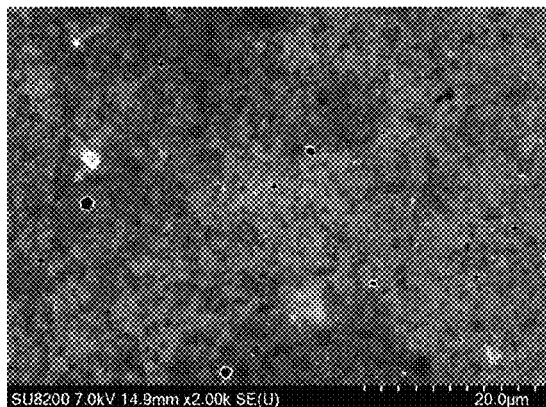
FIG. 3A is an exemplary SEM image of a sintered body according to one of comparatives.
Figure 3B:
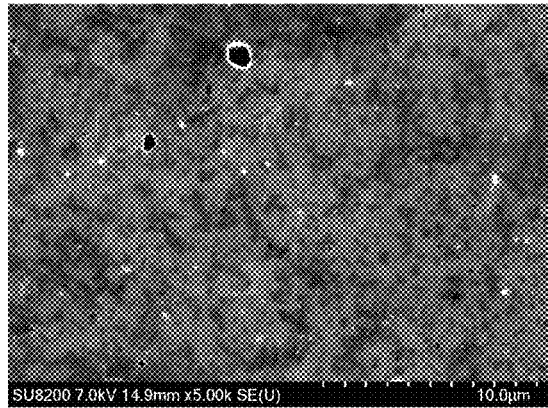
FIG. 3B is an exemplary image obtained by enlarging the SEM image of FIG. 3A.
Figure 3C:
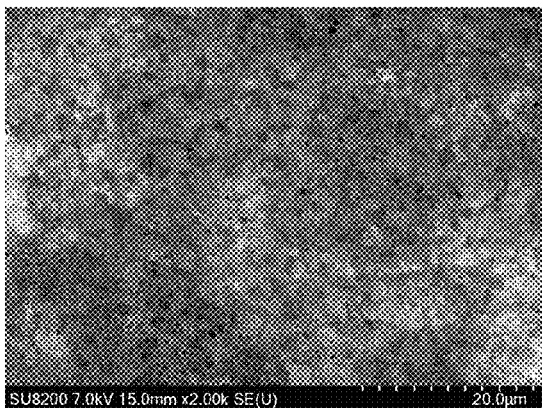
FIG. 3C is an exemplary SEM image of the sintered body according to the exemplary embodiment of the invention.
Figure 3D:
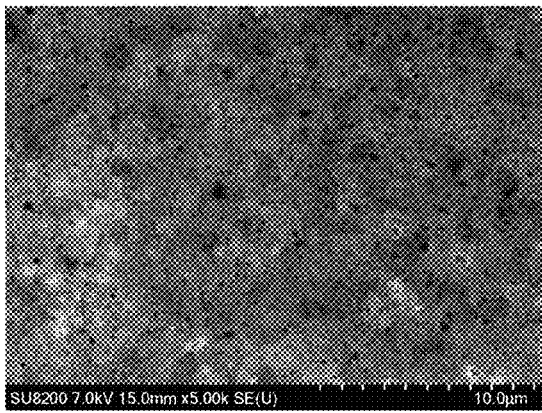
FIG. 3D is an exemplary image obtained by enlarging the SEM image of FIG. 3C.

Referring to FIGS. 3C and 3D, in the SEM image of the sintered body that is an example of the exemplary embodiment, there are very few black portions in the grain boundaries. This shows that the area ratio of pores in the sintered body of the exemplary embodiment is less than 0.1%. On the contrary, referring to FIGS. 3A and 3B, in the SEM image of the sintered body that is one of comparatives, black portions in the grain boundaries are observed.

In the second example of the sintered body according to the exemplary embodiment, preferred specific examples of the atomic composition ratios of the In element and the Al element are similar to those described in the first example above. In addition, preferred specific examples of the atomic composition ratio of the Ga element are similar to those described in the first example above.

In the second example of the sintered body according to the exemplary embodiment, provided that the atomic composition ratio of the Ga element represented by $\{[Ga]/([In]+[Ga]+[Al])\} \times 100$ is x and the atomic composition ratio of the Al element represented by $\{[Al]/([In]+[Ga]+[Al])\} \times 100$ is y, the x and the y are similar to preferred specific examples described in the first example above.

The second example of the sintered body according to the exemplary embodiment may include a Bixbyite structure containing the In element and a crystal structure belonging to the space group P1 or P-1, described in the first example. In this case, a preferred example of an area ratio of the Bixbyite structure containing the In element to a field of view when the sintered body is observed with the scanning electron microscope is similar to that described in the first example above. A preferred example of an area ratio of the crystal structure belonging to the space group P1 or P-1 to a field of view when the sintered body is observed with the scanning electron microscope is similar to that described in the first example above.

In the second example of the sintered body according to the exemplary embodiment, the sintered body may contain a H element (hydrogen element). Preferred specific examples of the atomic concentration of the H element that may be contained in the sintered body are similar to those described in the first example above.

In the second example of the sintered body according to the exemplary embodiment, the sintered body may contain a C element (carbon element). Preferred specific examples of the atomic concentration of the C element that may be contained in the sintered body are similar to those described in the first example above. Preferred specific examples of a case where the second example of the sintered body contains both the H element and the C element are also similar to those described in the first example above.

In the second example of the sintered body according to the exemplary embodiment, preferred specific examples of the bending strength are similar to those described in the first example above.

The sintered body according to the exemplary embodiment is a sintered body of an oxide containing the (indium) element, the Ga (gallium) element, and the Al (aluminum) element, in which a crystal structure belonging to the space group P1 or P-1 can be formed by setting the atomic composition ratio of the In element and the atomic composition ratio of the Al element to satisfy the respective formulae (1) and (2). In addition, optimizing the production conditions of the target causes pores generated in grain boundaries during crystal growth in the Bixbyite containing the In element to be filled with the crystal structure belonging to the space group P1 or P-1, which makes it possible to satisfy the conditions for setting the area ratio of pores to 0.1% or less. As a result, the sintered body with a bending strength of 190 MPa or more is achieved.

Method of Producing Sintered Body

A method of producing a sintered body according to the exemplary embodiment will be described. A preferred example of the method of producing the sintered body according to the exemplary embodiment includes the following steps.

A method of producing a sintered body of an oxide containing an In element, a Ga element, and an Al element, the method including:

mixing and disintegrating indium oxide, gallium oxide, and aluminum oxide by bead milling, followed by granulation through a spray drying method to obtain granulated powder, and classifying the granulated powder (hereinafter, occasionally referred to as a granulated powder preparing step);

molding the granulated powder after the classification into a molded body (hereinafter, occasionally referred to as a molding step); and sintering the molded body (hereinafter, occasionally referred to as a sintering step), in which an atomic composition ratio of the In element and an atomic composition ratio of the Al element in the sintered body respectively satisfy a formula (1) and a formula (2) below.

$$[In]/([In]+[Ga]+[Al]) > 0.70 \tag{1}$$

$$[Al]/([In]+[Ga]+[Al]) > 0.01 \tag{2}$$

The preferred production method of the sintered body according to the exemplary embodiment can provide the first example of the sintered body according to the exemplary embodiment. In addition, the preferred production method of the sintered body according to the exemplary embodiment can provide the second example of the sintered body according to the exemplary embodiment.

The granulated powder preparing step is a step of obtaining granulated powder with the use of indium oxide ($In_2O_3$), gallium oxide ($Ga_2O_3$), and aluminum oxide ($Al_2O_3$) as raw materials. The indium oxide, gallium oxide, and aluminum oxide used as raw materials are preferably in powder form, for instance. In the granulated powder preparing step, a material mixture containing indium oxide, gallium oxide, and aluminum oxide used as raw materials is prepared first. The material mixture is then mixed and disintegrated in a bead mill. The material mixture mixed and disintegrated is then dried in a spray dryer to produce granulated powder. After that, the granulated powder is classified.

The indium oxide is not particularly limited. Industrially commercially available indium oxide powder can be used. The indium oxide powder is preferably of high purity, such as 4N (0.9999) or more.

The gallium oxide is not particularly limited. Industrially commercially available gallium oxide powder can be used. The gallium oxide powder is preferably of high purity, such as 4N (0.9999) or more.

The aluminum oxide is not particularly limited. Industrially commercially available aluminum oxide powder can be used. The aluminum oxide powder is preferably of high purity, such as 4N (0.9999) or more.

To the material mixture, for instance, a dispersant to release aggregation and a thickener to adjust the viscosity to a level suitable for granulation in a spray dryer may be added. Examples of the dispersant include an ammonia neutralized product of acrylic acid-methacrylic acid copolymer. Examples of the thickener include polyvinyl alcohol.

In the granulated powder preparing step, a bead mill is used to mix and disintegrate the material mixture. The bead mill used to mix and disintegrate the material mixture is preferably a wet-type bead mill. The processing time for mixing and disintegration by a wet-type bead mill depends on the size of the equipment and the amount of the material mixture to be processed. For instance, the processing time may be adjusted so that the grain size distribution of the material mixture is all 1 μm or less, that is, nearly uniform. Examples of the disintegrating media (beads) used in a bead mill include zirconia, alumina, quartz, silicon nitride, stainless steel, mullite, glass, and silicon carbide (SiC). Among those, the disintegrating media (beads) used in a bead mill are preferably zirconia balls (also referred to as zirconia beads), which are solid particles. The grain size of zirconia balls is preferably in a range from 0.1 mm to 2 mm, more preferably in a range from 0.5 mm to 1.5 mm.

Reducing the grain size of the beads in disintegration can reduce the grain size of the material mixture after the disintegration. On the other hand, if the grain size of the beads is too small, the time required for disintegration is long, which increases the tact time during target production.

The material mixture after mixing and disintegration may be granulated immediately or pre-sintered before granulation. In the pre-sintering, the material mixture is typically sintered at a temperature ranging from 700 to 900 degrees C. for 1 to 5 hours.

The material mixture after mixing and disintegration is rapidly dried and granulated by the spray drying method. Specifically, a spray drier is used to granulate the material mixture after mixing and disintegration. Specific drying conditions using the spray dryer are determined by the concentration of the material mixture to be dried, the temperature of hot air used for drying, the rotation speed of the spray dryer, the air volume, and other conditions. When implementing the spray drying method, it is favorable to determine optimal conditions in advance. The shape of the granulated powder obtained in the granulated powder preparing step, which is not particularly limited, is preferably spherical.

When a material mixture that is not pre-sintered is granulated by the spray drying method, granulated powder may be prepared by using the material mixture obtained through mixing and disintegration as it is. When a material mixture that is pre-sintered is granulated by the spray drying method, the material mixture that is pre-sintered may be used after being disintegrated again. Since grains are bound to each other in the pre-sintered material mixture, the grains are preferably pulverized before being granulated.

The granulated powder is classified. In the following description, the granulated powder before classification is occasionally referred to as material granulated powder. Examples of the classification process include a method of sieving the granulated powder and sorting out the granulated powder falling within a desired grain size range. The sieve used in this method is preferably a sieve having openings of a size that allows the granulated powder with a desired grain size to pass through. Also preferably, this method uses a first sieve and a second sieve, the first sieve being used to sort out the material granulated powder based on the lower limit of the grain size range, the second sieve being used to sort out the material granulated powder based on the upper limit of the grain size range. When the grain size of the granulated powder is regulated, for instance, within a range of 150 μm or less, a sieve having openings of a size that allows material granulated powder of 150 μm or less to pass through but does not allow material granulated powder exceeding 150 μm to pass through is used to sort out the material granulated powder in the range of 150 μm or less.

When the grain size of the granulated powder is regulated, for instance, in a range from 25 μm to 150 μm, first, a sieve (first sieve) having openings of a size that allows material granulated powder of less than 25 μm to pass through but does not allow material granulated powder of 25 μm or more to pass through is used to sort out the material granulated powder with a grain size of 25 μm or more. Then, the sorted material granulated powder is sorted out using a sieve (second sieve) having openings of a size that allows material granulated powder of 150 μm or less to pass through but does not allow material granulated powder exceeding 150 μm to pass through, to sort out the material granulated powder in the range from 25 μm to 150 μm. The second sieve may be used before the first sieve.

In the molding step, the granulated powder obtained in the granulated powder preparing step is molded into a molded body. Specifically, the molding step may be a step of filling a mold with the granulated powder obtained in the granulated powder preparing step and molding material powder filled in the mold into a molded body.

An exemplary molding method in the molding step include mold pressing. In order to obtain a sintered body having a high sintered density as a sputtering target, it is preferable that the granulated powder, after being pre-molded by the mold pressing or the like in the molding step, is further compacted by cold isostatic pressing (CIP) or the like.

The sintering step is a step of sintering the molded body obtained in the molding step to produce a sintered body. In the sintering step, a typical sintering method such as pressureless sintering, hot press sintering, or hot isostatic pressing (HIP) sintering is usable.

In the sintering step, after placing the molded body in a sintering furnace, it is preferable to first raise the temperature to 120 degrees C. or more and 200 degrees C. or less at an increase rate of 0.1 degrees C./min or more and 1.0 degrees C./min or less, and to hold the temperature for 1 hour or more and 5 hours or less (first sintering condition). For instance, the first sintering condition can remove moisture from the molded body and degrease the molding aids.

Subsequently, it is preferable to raise the temperature to 300 degrees C. or more and 400 degrees C. or less at an increase rate of 0.1 degrees C./min or more and 1.0 degrees C./min or less, and to hold the temperature for 1 hour or more and 5 hours or less (second sintering condition).

After that, it is preferable to raise the temperature to 1,300 degrees C. or more and 1,400 degrees C. or less at an increase rate of 0.5 degrees C./min or more and 2 degrees C./min or less, and to hold the temperature for 10 hours or more and 30 hours or less (third sintering condition).

The sintering may be performed, for instance, in an atmosphere of air or oxygen gas, an atmosphere containing air or oxygen gas and a reducing gas, or an atmosphere containing air or oxygen gas and an inert gas. Examples of the reducing gas include hydrogen gas, methane gas, and carbon monoxide gas. Examples of the inert gas include argon gas and nitrogen gas.

2. Sputtering Target

The sputtering target according to the exemplary embodiment is a sputtering target using the sintered body according to the exemplary embodiment (the first example or the second example of the sintered body described above). The sputtering target according to the exemplary embodiment can be obtained by using the sintered body according to the exemplary embodiment. That is, the sputtering target according to the exemplary embodiment includes the sintered body according to the exemplary embodiment. The sintered body according to the exemplary embodiment is a film material when forming a film by sputtering.

The sputtering target includes an oxide sintered body and, if necessary, a cooling and holding member provided for the oxide sintered body, such as a backing plate.

Figure 4A:
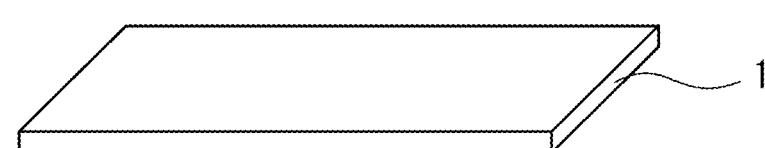
FIG. 4A is a perspective view of a target shape according to the exemplary embodiment of the invention.
Figure 4B:
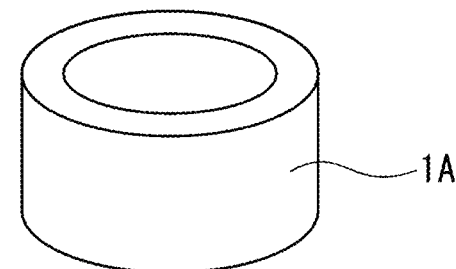
FIG. 4B is a perspective view of a target shape according to the exemplary embodiment of the invention.
Figure 4C:
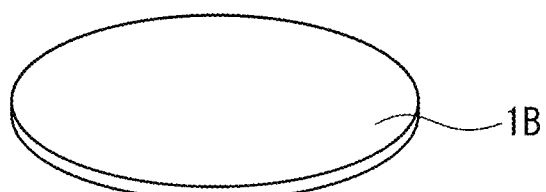
FIG. 4C is a perspective view of a target shape according to the exemplary embodiment of the invention.
Figure 4D:
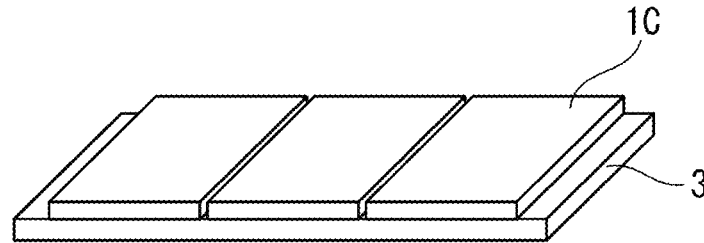
FIG. 4D is a perspective view of a target shape according to the exemplary embodiment of the invention.

The shape of the sputtering target is not particularly limited. For instance, the sputtering target may be plate-shaped with a reference numeral 1 in FIG. 4A, or cylindrical with a reference numeral 1A in FIG. 4B. In the case of a plate shape, the planar shape may be rectangular with the reference numeral 1 in FIG. 4A, or may be circular with a reference numeral 1B in FIG. 4C. The oxide sintered body may be integrally molded, or may be of a multi-divided type in which divided oxide sintered bodies (reference numeral 1C) are each fixed to a backing plate 3, as illustrated in FIG. 4D.

The backing plate is a holder/cooler for the oxide sintered body. The material of the backing plate is preferably copper or the like with excellent thermal conductivity.

The sputtering target can be obtained, for instance, by a production method including: a step of at least grinding the sintered body according to the exemplary embodiment (hereinafter, occasionally referred to as a machining step) and a step of bonding the sintered body to a backing plate (hereinafter, occasionally referred to as a bonding step).

In the machining step, the sintered body is at least cut into a shape suitable for mounting in a sputtering apparatus. Grinding of 0.3 mm or more is preferable. A grinding depth of 0.5 mm or more is preferable, and a grinding depth of 2 mm or more is especially preferable. Grinding of 0.3 mm or more can remove fluctuating portions of the crystal structure near a surface.

For instance, it is preferable to grind the oxide sintered body with a surface grinder to obtain a material having an average surface roughness Ra of 5 μm or less. Further, the sputtering surface of the sputtering target may be mirror-finished so that the average surface roughness Ra is $1000\times 10^{-10}$ m or less. For mirror finishing (polishing), a known polishing technique such as mechanical polishing, chemical polishing, or mechanochemical polishing (a combination of mechanical polishing and chemical polishing) can be used. For instance, the surface may be polished using a fixed-abrasive-grain polisher (polishing liquid: water) to #2000 or finer grain size, or may be lapped using a diamond-paste polishing material after lapping using a loose-abrasive-grain lapping material (polishing material: SiC paste etc.). The polishing method is not limited to the above.

The sintered body after the grinding step is preferably cleaned with an air blower or washed with running water and the like. When foreign matter is to be removed by air blowing, sucking air with a dust collector from a side opposite a nozzle facilitates the removal. It should be noted that ultrasonic cleaning or the like may further be performed in view of the limited cleaning power of the air blower and running water. The ultrasonic cleaning is effectively performed with multiple frequencies ranging from 25 kHz to 300 kHz. For instance, it is favorable to perform ultrasonic cleaning by oscillating 12 kinds of frequencies in 25 kHz increments between frequencies in a range from 25 kHz to 300 kHz.

In the bonding step, the sintered body after machining is bonded to the backing plate using a low melting point metal (e.g., metallic indium and metallic gallium).

Since the atomic composition of the sputtering target according to the exemplary embodiment is the same as that of the sintered body according to the exemplary embodiment (the first example or the second example of the sintered body described above), a TFT obtained by sputtering has high mobility and is excellent in processability and in-plane uniformity of optical reliability. Further, using the second example of the sintered body according to the exemplary embodiment enables sputtering while inhibiting cracking of the target, even when large panels are produced in large equipment.

3. Oxide Thin Film

The oxide thin film according to the exemplary embodiment is an oxide thin film using the sputtering target according to the exemplary embodiment. The oxide thin film according to the exemplary embodiment is obtained by forming a film using the sputtering target according to the exemplary embodiment. The oxide thin film according to the exemplary embodiment is preferably obtained by a production method including: a step of forming an oxide thin film by sputtering with the use of the sputtering target according to the exemplary embodiment (hereinafter, occasionally referred to as an oxide thin film forming step); and a step of performing a heating treatment on the oxide thin film (hereinafter, occasionally referred to as a heating treatment step). The oxide thin film according to the exemplary embodiment is formed using the target having the same atomic composition as the sintered body according to the exemplary embodiment, which results in a TFT having high mobility and excellent in processability and in-plane uniformity of optical reliability.

In the exemplary embodiment, an oxide thin film in a crystalline state is occasionally referred to as a "crystalline oxide thin film".

In the film formation by sputtering, one or more of gases selected from the group consisting of argon, hydrogen, and oxygen which are substantially free of impurity gas are used as the sputtering gas. The "impurity" contained in the sputtering gas refers to an element that is not purposefully added and is a trace element that does not substantially affect the sputtering performance.

The atomic composition ratio of the oxide thin film obtained by the sputtering method reflects the atomic composition ratio of the oxide sintered body in the sputtering target. Therefore, it is preferable to form a film using the sputtering target containing the oxide sintered body having the same atomic composition ratio as that of a desired oxide thin film.

The target used in the sputtering method preferably contains an impurity metal of 500 ppm or less, and more preferably 100 ppm or less. The content of the impurity metal in the target can be measured by ICP or SIMS similarly to the oxide sintered body. The "impurity" contained in the target is an element that is mixed in the raw material or during a production process and is not purposefully added, and refers to a trace element that does not substantially affect the performance of the target and the semiconductor. The "impurity metal" refers to a metal element among elements considered as the "impurity."

The crystalline state of the oxide thin film that is formed by sputtering with the use of the sputtering target according to the exemplary embodiment and one or more of gases selected from the group consisting of argon and oxygen which are substantially free of the impurity is solid-phase crystallized. The solid-phase crystallization of the oxide thin film can be measured by pretreating a cross section of the oxide thin film in the TFT device and observing the cross section of the oxide thin film after the pretreatment with a transmission electron microscope (TEM). The solid-phase crystallization means that the grain boundaries of the oxide thin film are continuously connected from a lower surface to a surface of the oxide thin film, and that an average grain-boundary angle θ between the lower surface and the grain boundaries of the oxide thin film is in a range from 70 degrees to 110 degrees.

Figure 5A:
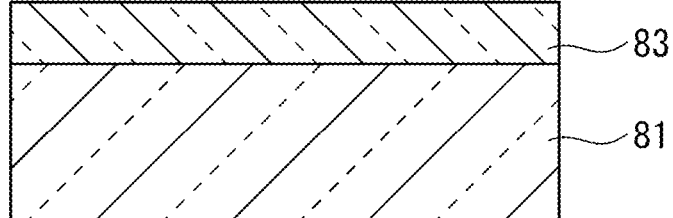
FIG. 5A is a vertical cross-sectional view of a state where an oxide thin film is formed on a glass substrate.

In the oxide thin film forming step, the oxide thin film is formed by sputtering using the sputtering target according to the exemplary embodiment and using, as the sputtering gas, one or more of gases selected from the group consisting of argon and oxygen which are substantially free of impurity gas (e.g., see FIG. 5A illustrating a state where an oxide thin film 83 is formed on a glass substrate 81).

The phrase "substantially free of impurity gas" in the sputtering gas means that impurity gas other than argon, hydrogen, and oxygen is not positively introduced except for the introduction of adsorbed water due to gas insertion and unavoidable gas (inevitable impurity gas) such as chamber leak and adsorbed gas. In the exemplary embodiment, it is possible to use, for instance, a commercially available mixed gas of high-purity argon and high-purity oxygen, as the sputtering gas. Impurities are preferably removed from the sputtering gas, if possible.

The ratio of the impurity gas in the sputtering gas is preferably 0.1 volume % or less, and more preferably 0.05 volume % or less. When the ratio of the impurity gas is 0.1 volume % or less, crystallization of the oxide thin film proceeds without any difficulty.

The purity of high-purity argon and high-purity oxygen is preferably 99 volume % or more, more preferably 99.9 volume % or more, and still more preferably 99.99 volume % or more.

The oxygen partial pressure in the mixed gas of argon and oxygen is preferably more than 0 volume % and 20 volume % or less, and more preferably more than 0 volume % and 5 volume % or less. When the oxygen partial pressure is more than 0 volume % and 20 volume % or less, the oxide thin film is easily crystallized by heating to become a semiconductor. The oxidation state of the oxide thin film, i.e., the crystallinity (the degree of structural order in a material) can be adjusted by changing the oxygen partial pressure. The oxygen partial pressure may be appropriately selected as needed.

The magnetic flux density during sputtering is preferably 700 G (gauss) or more. When the magnetic flux density during sputtering is 700 G (gauss) or more, the plasma density during sputtering film formation can be increased, the density of the oxide thin film can be increased, and crystal nuclei are easily formed during annealing after patterning. As a result, the crystal grains can be regulated to be small.

Even when the magnetic flux density during sputtering is less than 700 G (gauss), the plasma density during sputtering film formation can be increased by setting the output density during sputtering to 2.5 kW/cm² or more. As a result, the crystal grains in the oxide thin film can be regulated to be small.

In the oxide thin film forming step, it is preferable to place the sputtering target according to the exemplary embodiment in an RF magnetron sputtering apparatus or a DC magnetron sputtering apparatus for sputtering.

Figure 5B:
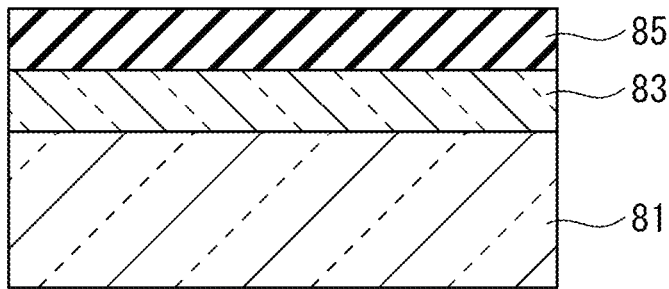
FIG. 5B illustrates a state where a $SiO_2$ film is formed on the oxide thin film of FIG. 5A.

The oxide thin film according to the exemplary embodiment can also be produced, for instance, as a part of a laminate including an oxide thin film and a protective film. When the protective film is formed on the crystalline oxide thin film, it is preferable to subject the obtained oxide thin film to a heating treatment under an oxidizing atmosphere and to form the protective film on the oxide thin film. Examples of the material of the protective film include $SiO_2$, $SiN_x$, $SiON_x$, $Al_2O_3$, and $Ga_2O_3$. The thickness of the protective film is normally in a range from 50 nm to 500 nm. Examples of the method of forming the protective film include a CVD method, a sputtering method, and a coating method. For instance, FIG. 5B illustrates a state where a $SiO_2$ film 85, which is the protective film, is formed on the oxide thin film 83 in FIG. 5A.

Subsequently, a heating treatment is performed after the formation of the oxide thin film, after the formation of the protective film, or after the formation of both the oxide thin film and the protective film. This heating treatment is occasionally referred to as annealing.

The temperature for the heating treatment is preferably in a range from 250 degrees C. to 500 degrees C., more preferably from 280 degrees C. to 470 degrees C., and still more preferably from 300 degrees C. to 450 degrees C.

When the heating treatment temperature after the formation of the oxide thin film is 250 degrees C. or more, the oxide thin film is easily crystallized.

When the heating treatment temperature after the formation of the oxide thin film is 500 degrees C. or less, abnormal growth of crystals can be inhibited, and consequently, enlargement of crystal grains can be inhibited.

The heating time in the heating treatment step is preferably in a range from 0.1 hours to 5 hours, more preferably from 0.3 hours to 3 hours, and still more preferably from 0.5 hours to 2 hours.

When the heating time in the heating treatment step is 0.1 hours or more, crystallization failure does not occur, and the oxide thin film crystallizes easily.

A heating time in the heating treatment step of 5 hours or less is economically excellent.

The "heating time" refers to a time (retention time) during which a predetermined highest temperature in the heating treatment is maintained.

The rate of temperature increase in the heating treatment step is preferably in a range from 2 degrees C./min to 40 degrees C./min, and more preferably from 3 degrees C./min to 20 degrees C./min.

When the rate of temperature increase in the heating treatment step is 2 degrees C./min or more, the production efficiency of the oxide thin film is improved as compared with a case where the rate of temperature increase is less than 1 degrees C./min.

When the rate of temperature increase in the heating treatment step is 40 degrees C./min or less, the metal elements uniformly diffuse at the time of crystallization, resulting in crystals in which no metal is segregated in the grain boundaries.

Further, the rate of temperature increase in the heating treatment step is different from a value calculated from a set temperature and a set time of a furnace, and is a value obtained by dividing the actual temperature of the oxide thin film by the time. The actual temperature of the oxide thin film can be determined, for instance by measuring an area within 1 cm from the oxide thin film in the furnace with a thermocouple.

The heating treatment step is preferably performed under air atmosphere.

The heating treatment step is preferably performed after the patterning of the oxide thin film. The heating treatment step after the patterning of the oxide thin film facilitates crystallization of the oxide thin film while desorbing excess oxygen present in the film during the film formation and organic substances adhering during patterning. As a result, a film free of organic substances or excess oxygen in the crystal grains and having few crystal defects can be formed, resulting in an oxide thin film having few electron traps and favorable conductivity.

It is preferable to further perform the heating treatment step after forming a gate insulating film and before forming a contact hole, or after forming the gate insulating film and the contact hole. In some cases, the heating treatment step performed after the oxide thin film is patterned is referred to as a first heating treatment step, and the heating treatment step performed after the gate insulating film is formed and before the contact hole is formed, or after the gate insulating film and the contact hole are formed is referred to as a second heating treatment step. The second heating treatment step is preferably performed at a higher annealing temperature than the first heating treatment step. Annealing after forming the gate insulating film diffuses hydrogen contained in the gate insulating film to the oxide thin film, allowing crystal defects present on the surface of the oxide thin film to be terminated by a hydroxyl group. As a result, an oxide thin film having few electron traps and favorable conductivity can be formed.

According to the method of producing the oxide thin film according to the exemplary embodiment, the crystalline oxide thin film can be obtained. According to the method of producing the oxide thin film according to the exemplary embodiment, a TFT having high mobility and excellent in processability and in-plane uniformity of optical reliability can be obtained more easily, even when large panels are produced in large equipment.

The oxide thin film (crystalline oxide thin film) according to the exemplary embodiment can be applied to various integrated circuits such as a logic circuit, memory circuit, and differential amplification circuit, and the various integrated circuits can be applied to an electronic device and the like. Further, the oxide thin film (crystalline oxide thin film) according to the exemplary embodiment can be applied as some layers in a solar cell, as well as some layers in a display such as a liquid crystal device, organic electroluminescent device, inorganic electroluminescent device, micro organic EL display, micro light emitting diode (LED) display, and mini LED display. Furthermore, the oxide thin film (crystalline oxide thin film) according to the exemplary embodiment can be applied as some layers in a solid-state image sensor, X-ray sensor, power semiconductor device, touch panel, large scale integrated circuit (LSI), resistance random access memory, dynamic random access memory (DRAM), ferroelectric memory, back end of line (BEOL), and microprocessor. Moreover, the oxide thin film (crystalline oxide thin film) according to the exemplary embodiment can be applied as semiconductor layers in a field-effect transistor, electrostatic induction transistor, quantum-tunneling field-effect transistor, Schottky barrier transistor, Schottky diode, PN diode, and resistor, as well as some layers therein.

4. Thin Film Transistor and Electronic Device

A thin film transistor according to the exemplary embodiment is a thin film transistor including the oxide thin film according to the exemplary embodiment. The thin film transistor according to the exemplary embodiment can be obtained by using the oxide semiconductor film according to the exemplary embodiment. The thin film transistor according to the exemplary embodiment includes the oxide thin film formed using the target having the same atomic composition as the sintered body according to the exemplary embodiment, which results in a TFT having high mobility and excellent in processability and in-plane uniformity of optical reliability. It is possible to obtain a TFT having high mobility and excellent in processability and in-plane uniformity of optical reliability.

The thin film transistor (TFT) according to the exemplary embodiment includes, for instance, electrodes, the oxide thin film according to the exemplary embodiment, and an insulating film. Examples of the electrodes include a source electrode, a drain electrode, and a gate electrode. Examples of the insulating film include a gate insulating film and a protective film. In the thin film transistor according to the exemplary embodiment, the oxide thin film is preferably in contact with the source electrode serving as the electrode.

As the structure of the TFT according to the exemplary embodiment, for instance, a known structure can be adopted.

The TFT according to the exemplary embodiment can be produced by adopting the method of producing the oxide thin film according to the exemplary embodiment. Specifically, the TFT production method includes: a step of forming an oxide thin film by sputtering with the use of the sputtering target according to the exemplary embodiment (oxide thin film forming step); and a step of performing a heating treatment on the oxide thin film (heating treatment step). In the oxide thin film forming step, preferably, the oxide thin film is formed by sputtering using the sputtering target according to the exemplary embodiment and using, as the sputtering gas, one or more of gases selected from the group consisting of argon, hydrogen, and oxygen which are substantially free of impurity gas. Conditions and the like of the oxide thin film forming step and the heating treatment step are the same as those described above in the method of producing the oxide thin film. The source electrode, drain electrode, gate electrode, and gate insulating film can be formed using known materials through known forming methods.

The thin film transistor according to the exemplary embodiment is not particularly limited in shape, but preferably is of a back channel etch type, an etch stopper type, a top gate type, a double gate type, or the like. In addition, the transistor in each of the types may have a self-alignment structure.

FIGS. 6A to 6D each illustrate a specific example of the thin film transistor.

Figure 6A:
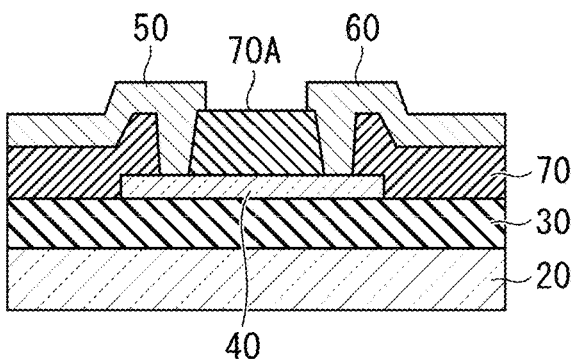
FIG. 6A is a vertical cross-sectional view of a thin film transistor according to an example of the invention.

As illustrated in FIG. 6A, a thin film transistor 100 includes a silicon wafer 20, a gate insulating film 30, an oxide thin film 40, a source electrode 50, a drain electrode 60, and interlayer insulating films 70, 70A.

The silicon wafer 20, which is a gate electrode, is provided on the gate insulating film 30 to face the oxide thin film 40 across the gate insulating film 30. The gate insulating film 30, which is an insulating film that blocks conduction between the gate electrode and the oxide thin film 40, is provided on the silicon wafer 20 and on a surface of the oxide thin film 40.

The oxide thin film 40, which is a channel layer, is provided on the gate insulating film 30. The oxide thin film (crystalline oxide thin film) according to the exemplary embodiment is used as the oxide thin film 40.

The source electrode 50 and the drain electrode 60 are conductive terminals for passing the source current and the drain current through the oxide thin film 40, and are respectively provided in the vicinity of both ends of the oxide thin film 40 so that the source electrode 50 and the drain electrode 60 are in contact with and electrically connected to the oxide thin film 40.

The interlayer insulating film 70 is an insulating film that blocks conduction between the source electrode 50 and the drain electrode 60, and the oxide thin film 40 except for the above contact portions therebetween.

The interlayer insulating film 70A is an insulating film that blocks conduction between the source electrode 50 and the drain electrode 60, and the oxide thin film 40 except for the above contact portions therebetween. The interlayer insulating film 70A also blocks conduction between the source electrode 50 and the drain electrode 60. The inter-layer insulating film 70A also serves as a channel-layer protective layer.

Figure 6B:
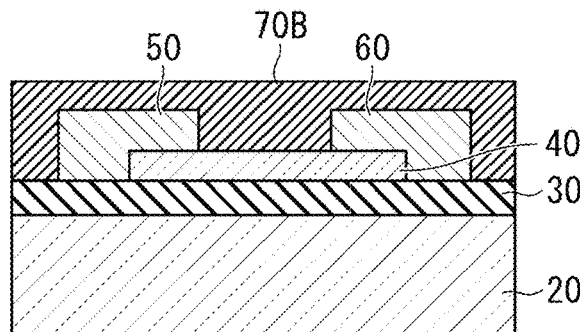
FIG. 6B is a vertical cross-sectional view of a thin film transistor according to an example of the invention.

As illustrated in FIG. 6B, a structure of a thin film transistor 100A is similar to that of the thin film transistor 100, but is different therefrom in that the source electrode 50 and the drain electrode 60 are each provided in a manner to be in contact with both the gate insulating film 30 and the oxide thin film 40. The thin film transistor 100A is different from the thin film transistor 100 also in that an interlayer insulating film 70B is integrally provided to cover the gate insulating film 30, the oxide thin film 40, the source elec-trode 50, and the drain electrode 60.

The material for the drain electrode 60, the source elec-trode 50, and the gate electrode is not particularly limited. Any general purpose material can be selected as the mate-rial. In the examples given in FIGS. 6A and 6B, the substrate is a silicon wafer that also serves as the electrode. The electrode material, however, is not limited to silicon.

For instance, it is possible to use a transparent electrode such as indium tin oxide (ITO), indium zinc oxide (IZO), zinc oxide (ZnO), and tin oxide ($SnO_2$), a metal electrode such as aluminum (Al), silver (Ag), copper (Cu), chrome (Cr), nickel (Ni), molybdenum (Mo), gold (Au), titanium (Ti), tungsten (W), and tantalum (Ta), or a metal electrode or layered electrode made of an alloy containing the above metals.

Further, the gate electrode may be formed on a substrate such as glass in FIGS. 6A and 6B.

The material for the interlayer insulating films 70, 70A, and 70B is not particularly limited, and any general purpose material can be selected as the material. As the material for the interlayer insulating films 70, 70A, and 70B, it is possible to use, for instance, compounds represented by $MO_x$, $MN_x$, and $MO_xN_y$, where M in the formulae is a metal element, and x and y are each a real number greater than zero. The same applies to x and y in compounds given below. Specific examples of the material for the interlayer insulating films 70, 70A, and 70B include compounds such as $SiO_2$, $SiO_x$, $SiN_x$, and $SiN_xO_y$. Further, examples of the material for the interlayer insulating films 70, 70A, and 70B include compounds such as $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTiO_3$, $BaTa_2O_6$, $SrTiO_3$, $Sm_2O_3$, and AlN. The valence of the anions (oxygen anions and nitrogen anions) in these oxide compounds and nitride compounds is not par-ticularly limited, and only has to be a real number greater than 0.

When the thin film transistor according to the exemplary embodiment is of a back channel etch type (bottom gate type), it is preferable to provide a protective film on the drain electrode, the source electrode, and the channel layer. The protective film increases the durability of TFT against a long-term driving.

Figure 6C:
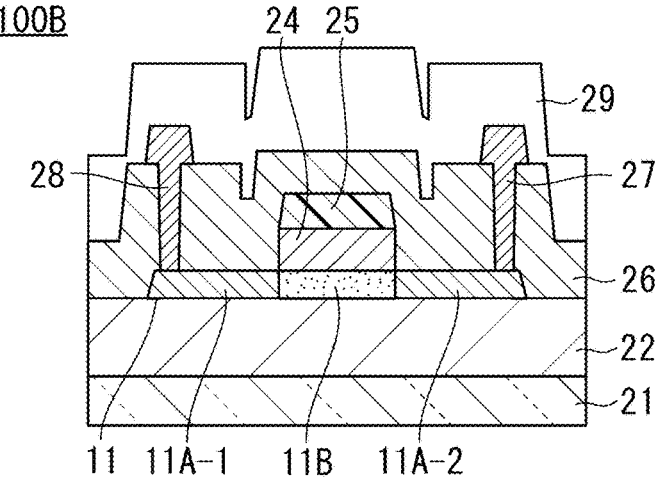
FIG. 6C is a vertical cross-sectional view of a thin film transistor according to an example of the invention.

When the thin film transistor according to the exemplary embodiment is of a top gate type, the structure thereof includes, for instance, the interlayer insulating film as a buffer layer on the substrate and the gate insulating film on the channel layer. As illustrated in FIG. 6C, a thin film transistor 100B includes a substrate 21, a buffer layer 22, a channel layer (crystalline oxide thin film) 11, a first low-resistive region 11A-1, a second low-resistive region 11A-2 (crystalline oxide thin film), a semiconductor region 11B (crystalline oxide thin film), a gate insulating film 24, a gate electrode 25, an interlayer insulating film 26, a source electrode 27, a drain electrode 28, and a protective film 29. In the thin-film transistor 100B, the first low-resistive region 11A-1 and the second low-resistive region 11A-2 are formed, for instance, by ion implantation and a dry process such as plasma processing. Further, an electrode layer may be provided, as a light-shield layer, between the substrate 21 and the buffer layer 22.

Figure 6D:
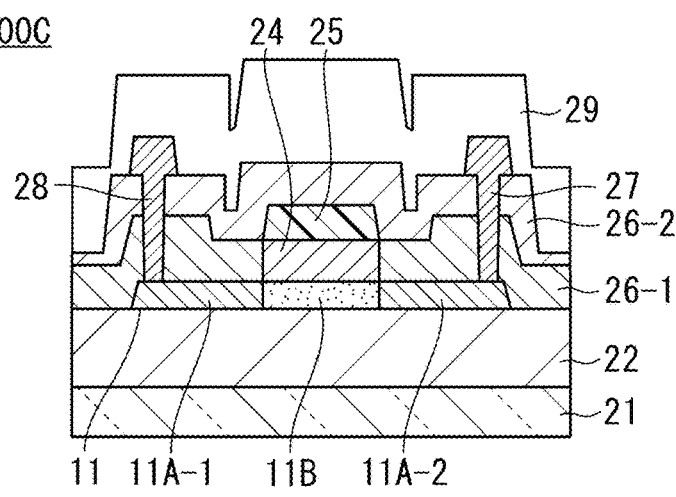
FIG. 6D is a vertical cross-sectional view of a thin film transistor according to an example of the invention.

The thin film transistor according to the exemplary embodiment may be exemplified by another top gate type TFT, as illustrated in FIG. 6D. A thin film transistor 1000 in FIG. 6D has the same structure as that of the thin film transistor 100B except that the interlayer insulating film 26 has two-layered structure (first interlayer insulating film 26-1 and second interlayer insulating film 26-2). In the thin film transistor 1000, the first low-resistive region 11A-1 and the second low-resistive region 11A-2 are formed, for instance, by ion implantation.

The material for the drain electrode 28, the source elec-trode 27, and the gate electrode 25 is not particularly limited. Any general purpose material can be selected as the mate-rial.

For instance, it is possible to use a transparent electrode such as indium tin oxide (ITO), indium zinc oxide (IZO), zinc oxide (ZnO), and tin oxide ($SnO_2$), a metal electrode such as aluminum (Al), silver (Ag), copper (Cu), chrome (Cr), nickel (Ni), molybdenum (Mo), gold (Au), titanium (Ti), tungsten (W), and tantalum (Ta), or a metal electrode or layered electrode made of an alloy containing the above metals.

In FIGS. 6C and 6D, a flexible substrate (typically poly-imide) and a silicon substrate may be used as the substrate 21, in addition to the glass substrate.

The material for the buffer layer 22, the interlayer insu-lating film 26, the first interlayer insulating film 26-1, the second interlayer insulating film 26-2, and the protective film 29 is not particularly limited, and any general purpose material can be selected as the material. As the material therefor, it is possible to use, for instance, compounds represented by $MO_x$, $MN_x$, and $MO_xN_y$, where M in the formulae is a metal element, and x and y are each a real number greater than zero. The same applies to x and y in compounds given below. Specific examples of the material therefor include compounds such as $SiO_2$, $SiO_x$, $SiN_x$, and $SiN_xO_y$. Further, examples of the material therefor include compounds such as $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTiO_3$, $BaTa_2O_6$, $SrTiO_3$, $Sm_2O_3$, and AlN. The valence of the anions (oxygen anions and nitrogen anions) in these oxide compounds and nitride compounds is not particularly limited, and only has to be a real number greater than 0.

The buffer layer, protective film, and insulating film can be formed by, for instance, CVD. The formation of the protective film or insulating film by CVD may be a process at high temperature. Further, the protective film or insulating film often contains impurity gas immediately after the film formation, so it is preferable to perform a heating treatment (annealing treatment). Removing the impurity gas by the heating treatment results in a stable protective film or insulating film, which easily provides a highly durable TFT device. In addition, annealing after forming the gate insulating film diffuses hydrogen contained in the gate insulating film to the oxide thin film, allowing crystal defects present on the surface of the oxide thin film to be terminated by a hydroxyl group. As a result, an oxide thin film having few electron traps and favorable conductivity can be formed.

Using the oxide thin film according to the exemplary embodiment makes the thin film transistor according to the exemplary embodiment less susceptible to the effects of the temperature in the CVD process and the subsequent heating treatment. The stability included in TFT characteristics is thus improvable, even when the protective film or the insulating film is formed.

In the thin film transistor according to the exemplary embodiment, a threshold voltage (Vth) is preferably in a range from −2.0 V to 2.0 V. When the threshold voltage (Vth) is in a range from −2.0 V to 2.0 V, correction to Vth=0 V is possible by installing a Vth correction circuit on the TFT. Thus, the resulting TFT installed to a panel allows a display to be driven without uneven brightness and burn-in. The threshold voltage (Vth) is more preferably in a range from −1.5 V to 1.5 V, and still more preferably in a range from −1.0 V to 1.0 V.

The threshold voltage (Vth) is defined by a gate voltage Vg at a current value between the source and the drain, Id=$10^{-9}$ A, based on the graph of transfer characteristics.

The on/off ratio is preferably in a range from $10^6$ to $10^{12}$, more preferably from $10^7$ to $10^{11}$, and still more preferably from $10^8$ to $10^{10}$. At an on/off ratio of $10^6$ or more, a liquid crystal display can be driven. At an on/off ratio of $10^{12}$ or less, a high contrast organic EL device can be driven. Further, when the on/off ratio is $10^{12}$ or less, the off current can be made to $10^{-12}$ A or less. This can extend an image retention time and improve sensitivity, when this thin film transistor is used for a transfer transistor or a reset transistor of a CMOS image sensor.

The on/off ratio can be determined as a ratio [On current value/Off current value] of an On current value (a value of Id when Vg=20 V) to an Off current value (a value of Id when Vg=−10 V).

The Off current value is preferably $10^{-10}$ A or less, more preferably $10^{-11}$ A or less, and still more preferably $10^{-12}$ A or less. When the Off current value is $10^{-10}$ A or less, a high contrast organic EL device can be driven. Further, when this thin film transistor is used for a transfer transistor or a reset transistor of a CMOS image sensor, it is possible to extend an image retention time and improve sensitivity.

In the thin film transistor according to the exemplary embodiment, linear mobility is preferably 25 cm²/Vs. The linear mobility is represented by the transconductance (Gm) of each Vg calculated from a graph of transfer characteristics, and the linear mobility is defined by maximum carrier mobility in Vg ranging from −15 V to 20 V.

In the thin film transistor according to the exemplary embodiment, die (0 0) refers to a TFT device made at the center of a TFT substrate. ΔVth of TFT at die (0 0) is preferably −2.0 V or more. When ΔVth at die (0 0) is −2.0 V or more, the thin film transistor is excellent in optical reliability.

die (0 −5) refers to a TFT made 3 cm away from die (0 0) on the TFT substrate. ΔVth at die (0 −5) is preferably −6.0 V or more. When ΔVth at die (0 −5) is −6.0 V or more, the thin film transistor is excellent in optical reliability.

The difference in thickness of the crystalline oxide thin film between the die (0 0) TFT device and the die (0 −5) TFT device in the exemplarily embodiment is 10%, and the difference in the in-plane position of the TFT may be regarded to be due to the difference in thickness of the crystalline oxide thin film. In addition, ΔVth refers to a change in Vth before and after the application of bias stress.

Quantum-Tunneling Field-Effect Transistor

The crystalline oxide thin film according to the exemplary embodiment can also be used for a quantum-tunneling field-effect transistor (FET). The quantum-tunneling field-effect transistor is occasionally referred to as a quantum-tunneling field-effect type transistor.

Figure 7:
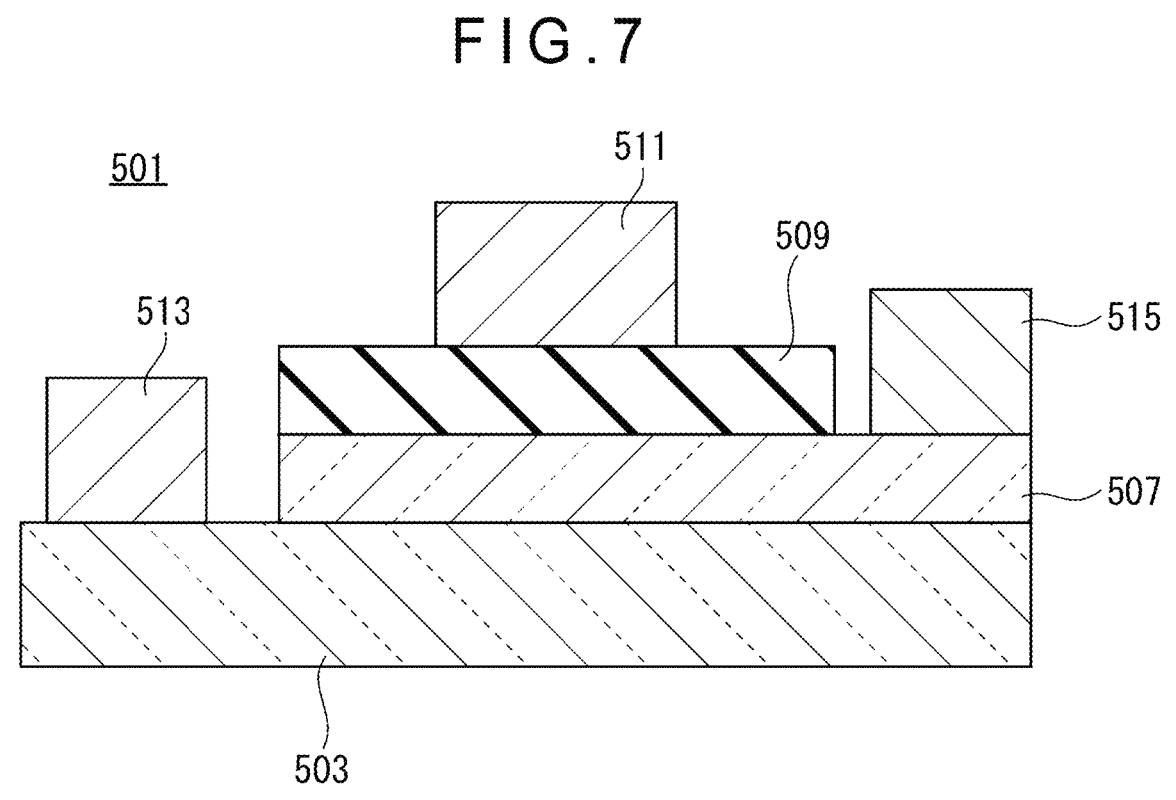

FIG. 7 is a schematic view (vertical cross-sectional view) of a quantum-tunneling field-effect transistor (FET) according to the exemplary embodiment.

A quantum-tunneling field-effect transistor 501 includes a p-type semiconductor layer 503, an n-type semiconductor layer 507, a gate insulating film 509, a gate electrode 511, a source electrode 513, and a drain electrode 515.

The p-type semiconductor layer 503, n-type semiconductor layer 507, gate insulating film 509, and gate electrode 511 are layered in this order.

The source electrode 513 is provided on the p-type semiconductor layer 503. The drain electrode 515 is provided on the n-type semiconductor layer 507.

The p-type semiconductor layer 503 is a p-type IV group semiconductor layer, which is a p-type silicon layer in the exemplary embodiment.

The n-type semiconductor layer 507 is an n-type oxide thin film used in an image sensor according to the exemplary embodiment. The source electrode 513 and the drain electrode 515 are conductive films.

Although not illustrated in FIG. 7, an insulating layer may be provided on the p-type semiconductor layer 503. In this case, the p-type semiconductor layer 503 and the n-type semiconductor layer 507 are connected through a contact hole(s) defined by partially removing the insulating layer. Although not illustrated in FIG. 7, the quantum-tunneling field-effect transistor 501 may be provided with an interlayer insulating film covering an upper side of the quantum-tunneling field-effect transistor 501.

The quantum-tunneling field-effect transistor 501 is a current-switching quantum-tunneling field-effect transistor (FET) that controls the electric current tunneled through an energy barrier formed by the p-type semiconductor layer 503 and the n-type semiconductor layer 507 using a voltage applied to the gate electrode 511. This structure increases a bandgap of the oxide semiconductor of the n-type semiconductor layer 507, thereby decreasing the Off current.

Figure 8:
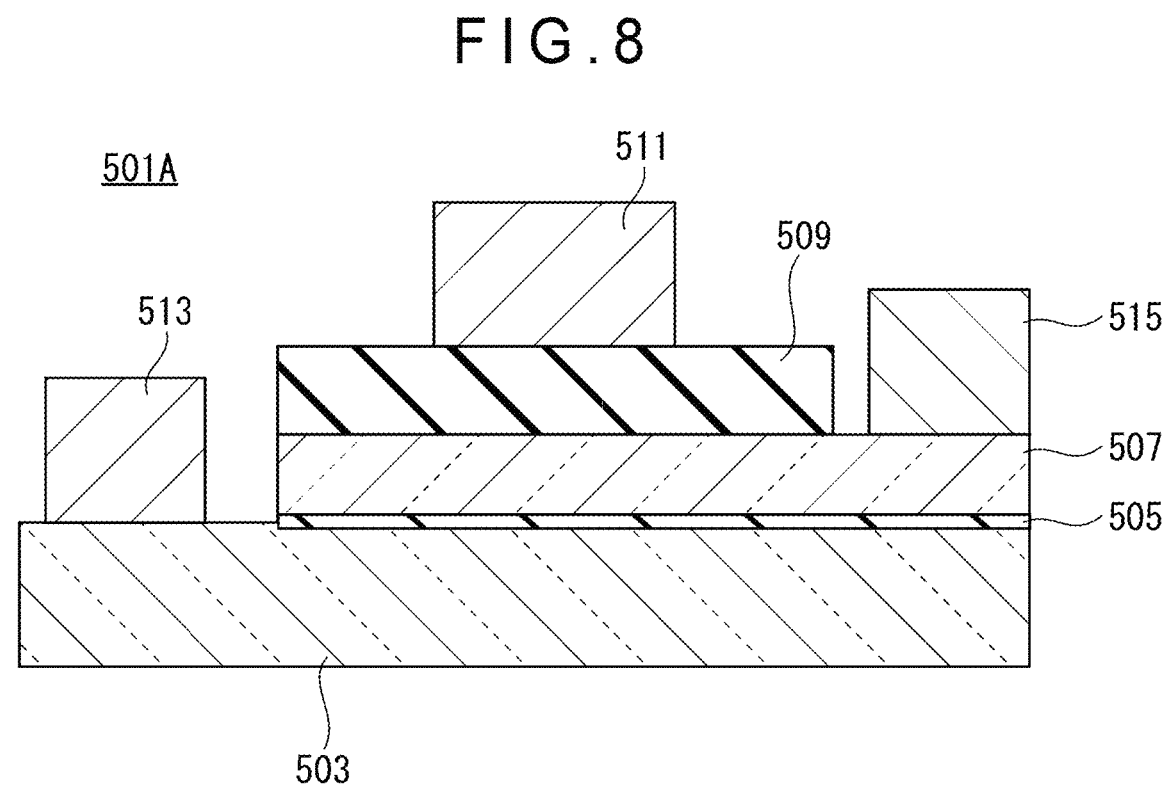

FIG. 8 is a schematic view (vertical cross-sectional view) of a quantum-tunneling field-effect transistor 501A according to another example.

A structure of the quantum-tunneling field-effect transistor 501A is similar to that of the quantum-tunneling field-effect transistor 501, but is different therefrom in that a silicon oxide layer 505 is provided between the p-type semiconductor layer 503 and the n-type semiconductor layer 507. The silicon oxide layer can reduce the Off current.

The thickness of the silicon oxide layer 505 is preferably 10 nm or less. At a thickness of the silicon oxide layer 505 of 10 nm or less, the tunnel current securely passes through the energy barrier and the energy barrier can be securely formed with a constant barrier height, preventing the decrease or change in the tunneling current. The thickness of the silicon oxide layer 505 is preferably 8 nm or less, more preferably 5 nm or less, still more preferably 3 nm or less, and still further more preferably 1 nm or less.

The n-type semiconductor layer 507 in both of the quantum-tunneling field-effect transistors 501 and 501A is an n-type oxide semiconductor.

The oxide semiconductor forming the n-type semiconductor layer 507 may be amorphous. The amorphous oxide semiconductor allows the n-type semiconductor layer 507 to be etched using an organic acid (e.g. oxalic acid) at a large difference in etching rate from other layers, so that the etching can be favorably performed without any effect on metal layers (e.g. wiring lines).

The oxide semiconductor forming the n-type semiconductor layer 507 may be crystalline. When the oxide semiconductor forming the n-type semiconductor layer 507 is crystalline, the bandgap thereof is larger than that of the oxide semiconductor being amorphous, so that the Off-current can be reduced. The work function can also be increased, making it possible to easily control the electric current tunneled through the energy barrier formed by the p-type IV group semiconductor material and the n-type semiconductor layer 507.

A method of producing the quantum-tunneling field-effect transistor 501 is not particularly limited, and an example thereof is given below.

Figure 9A:
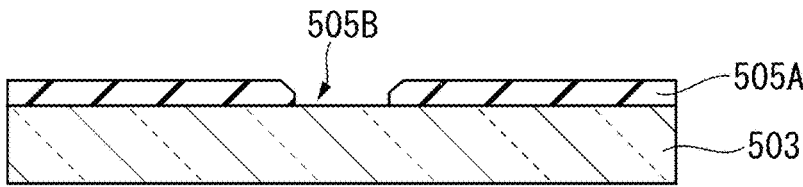
FIG. 9A is a vertical cross-sectional view for illustrating a production process of a quantum-tunneling field-effect transistor.

First, as illustrated in FIG. 9A, an insulating film 505A is formed on the p-type semiconductor layer 503. Then, a part of the insulating film 505A is removed by etching or the like to form a contact hole 505B.

Figure 9B:
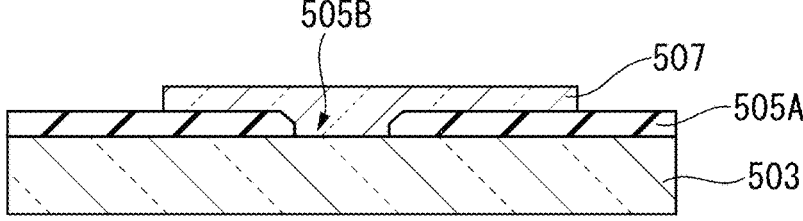
FIG. 9B is a vertical cross-sectional view for illustrating the production process of the quantum-tunneling field-effect transistor.

Subsequently, as illustrated in FIG. 9B, the n-type semiconductor layer 507 is formed on the p-type semiconductor layer 503 and the insulating film 505A. At this time, the p-type semiconductor layer 503 and the n-type semiconductor layer 507 are connected through the contact hole 505B.

Figure 9C:
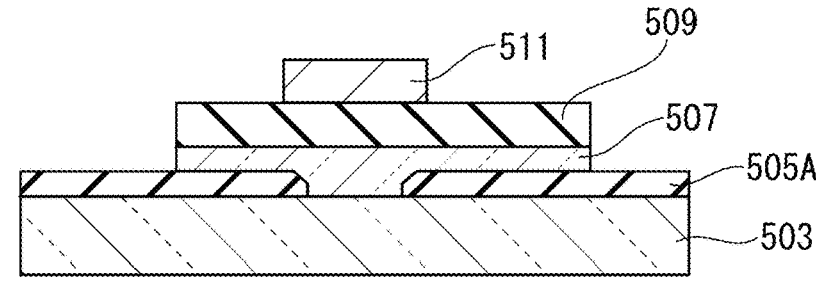
FIG. 9C is a vertical cross-sectional view for illustrating the production process of the quantum-tunneling field-effect transistor.

Subsequently, as illustrated in FIG. 9C, the gate insulating film 509 and the gate electrode 511 are formed in this order on the n-type semiconductor layer 507.

Figure 9D:
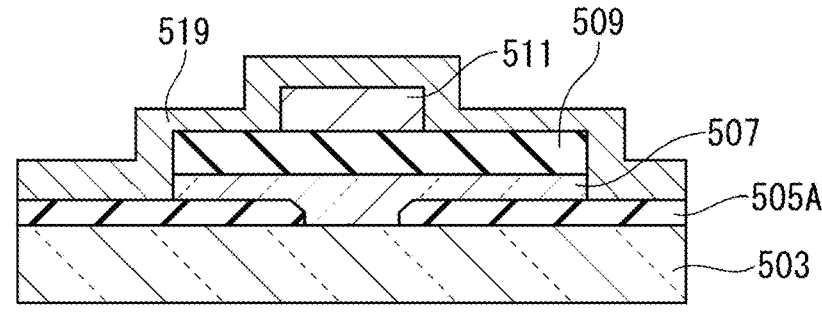
FIG. 9D is a vertical cross-sectional view for illustrating the production process of the quantum-tunneling field-effect transistor.

An interlayer insulating film 519 is then provided in a manner to cover the insulating film 505A, the n-type semiconductor layer 507, the gate insulating film 509, and the gate electrode 511, as illustrated in FIG. 9D.

Figure 9E:
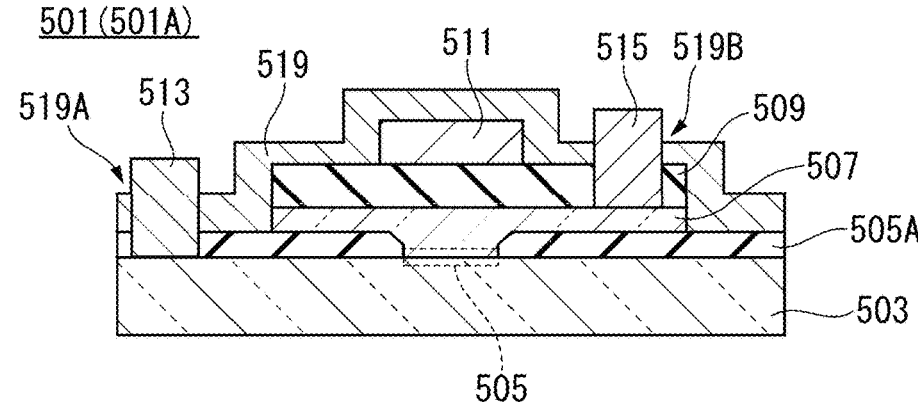
FIG. 9E is a vertical cross-sectional view for illustrating the production process of the quantum-tunneling field-effect transistor.

Subsequently, as illustrated in FIG. 9E, a contact hole 519A is formed by partially removing the insulating film 505A and the interlayer insulating film 519 on the p-type semiconductor layer 503, and the source electrode 513 is provided in the contact hole 519A.

Further, as illustrated in FIG. 9E, a contact hole 519B is formed by partially removing the gate insulating film 509 and the interlayer insulating film 519 on the n-type semiconductor layer 507, and the drain electrode 515 is formed in the contact hole 519B.

The quantum-tunneling field-effect transistor 501 is produced through the above process.

It should be noted that the silicon oxide layer 505 between the p-type semiconductor layer 503 and the n-type semiconductor layer 507 can be formed by applying a heat treatment at a temperature ranging from 150 degrees C. to 600 degrees C. after the n-type semiconductor layer 507 is formed on the p-type semiconductor layer 503. The quantum-tunneling field-effect transistor 501A is produced through the above process including this additional step.

The thin film transistor according to the exemplary embodiment is suitable for use in a solar cell, a display device such as a liquid crystal device, organic electroluminescence device, and inorganic electroluminescence device, and a power semiconductor device. The thin film transistor according to the exemplary embodiment is suitably used as a transistor of a display such as a liquid crystal display, organic electroluminescence (EL) display, micro organic EL display, micro light emitting diode (LED) display, and mini LED display, a solid-state image sensor, and an active matrix device such as a touch panel.

The thin film transistor according to the exemplary embodiment can be applied to various integrated circuits such as a field-effect transistor, logic circuit, memory circuit, and differential amplification circuit. The various integrated circuits can be applied to an electronic device and the like. An electronic device according to the exemplary embodiment preferably includes the thin film transistor. Further, the thin film transistor according to the exemplary embodiment can be applied not only to the field-effect transistor but also to an electrostatic induction transistor and a Schottky barrier transistor. The thin film transistor according to the exemplary embodiment can also be applied as a transistor for a sensor such as an image sensor, X-ray sensor, and biological sensor.

Hereinafter, a case where the thin film transistor according to the exemplary embodiment is used for a display and a solid-state image sensor will be described.

First, a case where the thin film transistor according to the exemplary embodiment is used for a display will be described with reference to FIGS. 10A to 10C.

Figure 10A:
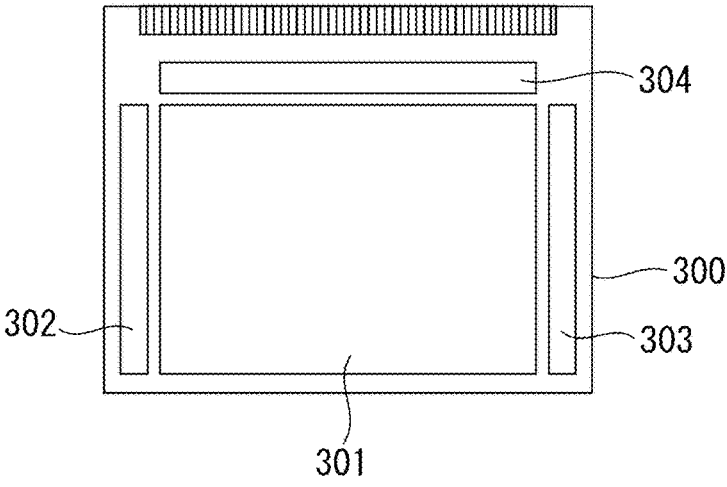
FIG. 10A is a top view of a display using a thin film transistor according to an example of the invention.

FIG. 10A is a top view of a display according to the exemplary embodiment. FIG. 10B is a circuit diagram for explaining a circuit of a pixel unit when a liquid crystal device is applied to the pixel unit of the display according to the exemplary embodiment. FIG. 10C is a circuit diagram for explaining a circuit of a pixel unit when an organic EL device is applied to the pixel unit of the display according to the exemplary embodiment.

The transistor disposed in the pixel unit may be the thin film transistor according to the exemplary embodiment. The thin film transistor according to the exemplary embodiment is easily made into an n-channel type. Thus, a drive circuit that can be provided by an n-channel transistor is partially formed on the same substrate as the transistor of the pixel unit. A display excellent in optical reliability can be provided by using the thin film transistor of the exemplary embodiment for the pixel unit and/or the drive circuit.

FIG. 10A is a top view of an exemplary active matrix display. The active matrix display includes a substrate 300, a pixel unit 301, a first scanning line drive circuit 302, a second scanning line drive circuit 303, and a signal line drive circuit 304. The pixel unit 301 and the circuits 302 to 304 are formed on the substrate 300. Multiple signal lines extend from the signal line drive circuit 304 to the pixel unit 301. Multiple scanning lines extend from the first scanning line drive circuit 302 and the second scanning line drive circuit 303 to the pixel unit 301. Pixels each including a display device are provided in a matrix at intersections of the scanning lines and the signal lines. The substrate 300 of the display is connected to a timing control circuit (also referred to as a controller or a control IC) through a connector such as a flexible printed circuit (FPC).

In FIG. 10A, the first scanning line drive circuit 302, the second scanning line drive circuit 303, and the signal line drive circuit 304 are provided on the same substrate 300 as the pixel unit 301. Such an arrangement reduces the number of external components, such as a drive circuit, leading to a reduction in production costs. In addition, when the drive circuit is provided outside the substrate 300, wiring lines need to be extended, increasing the number of connections between the wiring lines. When the drive circuit is provided on the same substrate 300, the number of connections between the wiring lines can be reduced, improving the optical reliability or yield rate.

Figure 10B:
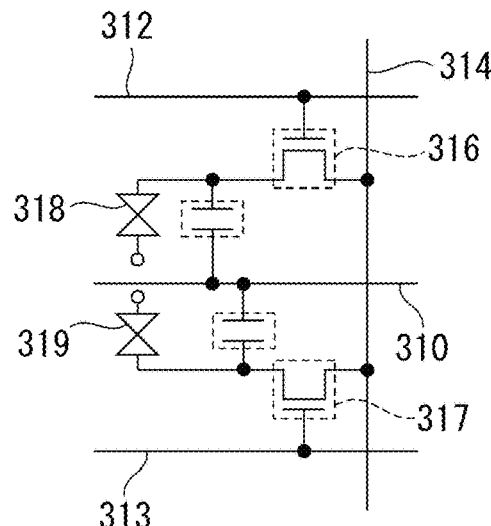
FIG. 10B is a circuit diagram for illustrating a circuit of a pixel unit of a display using a thin film transistor according to an example of the invention.

FIG. 10B illustrates an example of a pixel circuit configuration. In FIG. 10B, a circuit of a pixel unit applicable to a pixel unit of a VA liquid crystal display is illustrated.

The circuit of the pixel unit is applicable to a configuration having multiple pixel electrodes in one pixel. The respective pixel electrodes are connected to different transistors, and the respective transistors are drivable by different gate signals. Thus, the signals to be applied to the respective pixel electrodes of a multi-domain structure can be independently controlled.

A gate line (gate wiring line) 312 of a transistor 316 and a gate line (gate wiring line) 313 of a transistor 317 are separated so that different gate signals are given thereto. In contrast, a source electrode or drain electrode 314 serving as a data line is used in common by the transistors 316 and 317. The transistors 316 and 317 may each be the thin film transistor according to the exemplary embodiment. A liquid crystal display excellent in optical reliability can be thus provided.

First and second pixel electrodes are electrically connected to the transistors 316 and 317, respectively. The first pixel electrode is separated from the second pixel electrode. The first and second pixel electrodes are not particularly limited in shape. For instance, the first pixel electrode may be V-shaped.

Gate electrodes of the transistors 316 and 317 are connected to the gate lines 312 and 313, respectively. Different gate signals can be given to the gate lines 312 and 313 so that the transistors 316 and 317 are operated at different timings, thereby controlling orientation of the liquid crystal.

A capacitance line (capacitance wiring line) 310, a gate insulating film serving as a dielectric, and a capacitance electrode electrically connected to the first pixel electrode or the second pixel electrode may be provided to define a storage capacitor.

In a multi-domain structure, first and second liquid crystal devices 318 and 319 are provided for one pixel. The first liquid crystal device 318 includes the first pixel electrode, a counter electrode, and a liquid crystal layer interposed between the first pixel electrode and the counter electrode. The second liquid crystal device 319 includes the second pixel electrode, a counter electrode, and a liquid crystal layer interposed between the second pixel electrode and the counter electrode.

The pixel unit is not limited to the configuration illustrated in FIG. 10B. The pixel unit illustrated in FIG. 10B may additionally include a switch, a resistor, a capacitor, a transistor, a sensor, or a logic circuit.

Figure 10C:
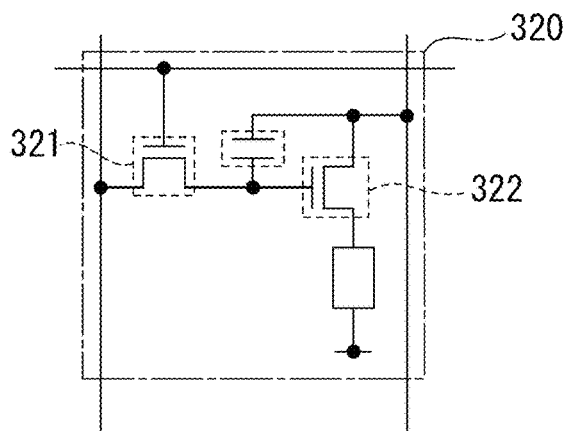
FIG. 10C is a circuit diagram for illustrating a circuit of a pixel unit of a display using a thin film transistor according to an example of the invention.

FIG. 10C illustrates another example of the pixel circuit configuration. Illustrated is a structure of a pixel unit in a display using an organic EL device.

FIG. 10C illustrates an applicable example of a circuit of a pixel unit 320. In this example, two n-channel transistors are used in one pixel. The oxide thin film (crystalline oxide thin film) according to the exemplary embodiment is usable for a channel-formation region in the n-channel transistor. The circuit of the pixel unit can be driven according to digital time gradation control.

A switching transistor 321 and a drive transistor 322 may each be the thin film transistor according to the exemplary embodiment. An organic EL display excellent in optical reliability can be thus provided.

The circuit configuration of the pixel unit is not limited to that illustrated in FIG. 10C. The circuit of the pixel unit illustrated in FIG. 10C may additionally include a switch, a resistor, a capacitor, a sensor, a transistor, or a logic circuit.

Further, both a Si-based transistor and the crystalline oxide transistor of the exemplary embodiment may be installed in the display using the thin film transistor according to the exemplary embodiment.

Subsequently, a case where the thin film transistor according to the exemplary embodiment is used for a solid-state image sensor will be described with reference to FIG. 11.

A complementary metal oxide semiconductor (CMOS) image sensor is a solid-state image sensor including a signal charge accumulator that holds an electric potential, and an amplification transistor that outputs the electric potential to a vertical output line. When the signal charge accumulator is charged or discharged by a possible leak current from the reset transistor and/or the transfer transistor of the CMOS image sensor, the electric potential of the signal charge accumulator changes. The change in the electric potential of the signal charge accumulator results in the change in the electric potential of the amplification transistor (i.e., the shift from a desired value), deteriorating the quality of the captured image.

Operational effects of the thin film transistor according to an example of the invention incorporated in the reset transistor and the transfer transistor of the CMOS image sensor will be described below. As the amplification transistor, either a thin film transistor or a bulk transistor may be applied.

Figure 11:
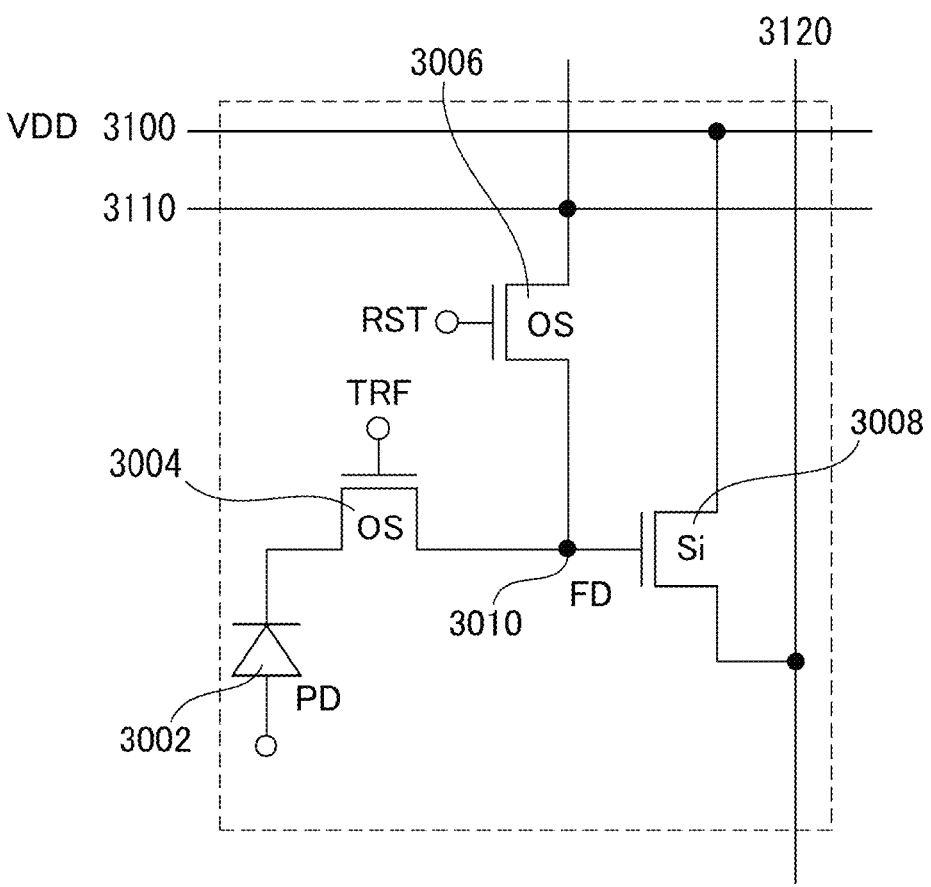
FIG. 11 illustrates a circuit of a pixel unit of a solid-state image sensor using a thin film transistor according to an example of the invention.

FIG. 11 illustrates an exemplary pixel configuration of the CMOS image sensor. The pixel includes a photodiode 3002 (photoelectric converter), a transfer transistor 3004, a reset transistor 3006, an amplification transistor 3008, and various wiring lines. Such pixels are arranged in a matrix to form the sensor. A selection transistor may be electrically connected to the amplification transistor 3008. The characters in the transistor signs each represent a preferred material to be used for the transistor, where "OS" represents an oxide semiconductor and "Si" represents silicon. The same applies to the other drawings.

The photodiode 3002 is connected to the source of the transfer transistor 3004. A signal charge accumulator 3010 (also referred to as floating diffusion (FD)) is provided for the drain of the transfer transistor 3004. The source of the reset transistor 3006 and the gate of the amplification transistor 3008 are connected to the signal charge accumulator 3010. A reset power line 3110 may be omitted in another configuration. For instance, the drain of the reset transistor 3006 may be connected to a power line 3100 or a vertical output line 3120 instead of the reset power line 3110.

The oxide semiconductor film according to the exemplary embodiment of the invention may be used for the photodiode 3002, the material of which may be the same as that of the oxide semiconductor film used for the transfer transistor 3004 and the reset transistor 3006.

EXAMPLES

The invention will be specifically described below with reference to Examples. The invention is by no means limited to Examples.

[1] Production of Sintered Body (Examples 1 to 9)

Material powder was prepared by weighing gallium oxide powder, aluminum oxide powder, and indium oxide powder at the charging composition ratio (mass %) shown in Tables 1 to 3 to obtain the atomic composition ratio (at %) shown in Tables 1 to 3.

Subsequently, a slurry-like material mixture with a solid content concentration of 50 mass % was prepared by adding a dispersant, thickener, and water to the material powder. The viscosity of the material mixture obtained was 200 mPa-s. The resulting material mixture was mixed and disintegrated by bead milling using 0.5 mm diameter zirconia balls for 2 hours.

After mixing and disintegration, the mixture was fed to a spray dryer and granulated at a rotation speed of 12,000 rpm and a hot air temperature of 150 degrees C. to obtain material granulated powder.

Granulated powder was obtained by passing the material granulated powder through a 90 mesh sieve to remove material granulated powder with a grain size exceeding 150 μm, and classifying the grain size of the material granulated powder into a range of 150 μm or less. The shape of the granulated powder was spherical.

The resulting granulated powder was placed in a mold and press-formed at a pressure of 300 kg/cm².

The press-formed body was densified by CIP at a pressure of 2,000 kg/cm².

Subsequently, the densified press-formed body was placed in an atmospheric-pressure sintering furnace, and the temperature was increased to 200 degrees C. at a rate of 0.2 degrees C./minute, and then held at 200 degrees C. for 2 hours.

The temperature was then increased to 400 degrees C. at a rate of 0.5 degrees C./min and held at 400 degrees C. for 3 hours.

In Examples 1 to 8, the temperature was then increased to 1,350 degrees C. at a rate of 1 degrees C./minute, and held at 1,350 degrees C. for 20 hours for sintering. In Example 9, the temperature was increased to 1,400 degrees C. at a rate of 1 degrees C./minute, and then held at 1,400 degrees C. for 20 hours for sintering.

After leaving to cool, the sintered body of the oxide was obtained.

The following evaluation was performed on each of the sintered bodies obtained.

Tables 1 to 3 show evaluation results.

Comparatives 1 to 12

Material powder was prepared by weighing gallium oxide powder, aluminum oxide powder, and indium oxide powder at the charging composition ratio (mass %) shown in Tables 4 to 6 to obtain the atomic composition ratio (at %) shown in Tables 4 to 6.

The material powder was placed in a polyethylene pot and mixed and pulverized by dry ball milling for 72 hours to prepare mixed powder.

The mixed powder was placed in a mold and press-formed at a pressure of 500 kg/cm².

The press-formed body was densified by CIP at a pressure of 2,000 kg/cm².

Subsequently, the densified press-formed body was placed in an atmospheric-pressure sintering furnace, and the temperature was increased to 350 degrees C. at a rate of 0.2 degrees C./minute, and then held at 350 degrees C. for 3 hours.

The temperature was then increased to 1,350 degrees C. at a rate of 1.7 degrees C./min and held at 1,350 degrees C. for 24 hours for sintering. After leaving to cool, the sintered body of the oxide was obtained.

The following evaluation was performed on each of the sintered bodies obtained.

Tables 4 to 6 show evaluation results.

In Tables 1 to 6, the phrase "Metal composition ratio [at %]" corresponds to the above atomic composition ratio (at %). For the "Material ratio" in Tables 1 to 6, the numerical values of the Charging composition ratio indicated by "mass %" respectively indicate the mass ratios of indium oxide, gallium oxide, and aluminum oxide, and the numerical values indicated by "at %" respectively indicate the atomic composition ratios of the indium, gallium, and aluminum elements expressed as a percentage. The same applies to Tables 7 to 16 shown later.

In Tables 1 to 6, the phrase "Mixing and pulverization" corresponds to the above mixing and disintegration.

[2] Evaluation on Characteristics of Sintered Body (2-1) Atomic Composition Ratio The atomic composition ratio (at %) of each of the sintered bodies was analyzed by an inductively coupled plasma atomic emission spectrometer (ICP-AES, Shimadzu Corporation). The resulting sintered bodies were each found to have the atomic composition ratio (at %) shown in Tables 1 to 6.

(2-2) XRD Measurement and Identification of Crystalline Phase

The resulting sintered bodies were each subjected to X-ray diffraction (XRD) measurement using an X-ray diffractometer SmartLab under the conditions below. The obtained XRD chart was subjected to Rietveld analysis by PDXL2 (produced by Rigaku Corporation) to confirm the crystalline phase in the sintered body.

Machine: SmartLab (produced by Rigaku Corporation)

Detector: scintillation counter (SC-70)

X-ray: Cu-Kα ray (wavelength $1.5418 \times 10^{-10}$ m)

Intensity: 45 kV, 200 mA

2θ-θ reflection method, continuous scanning (2.0 degrees/min)

Start: 5 degrees

End: 80 degrees

Sampling interval: 0.02 degrees

Slit DS (divergence slit), SS (scattering slit), RS (light-receiving slit): 1 mm In the Rietveld analysis, the Bixbyite structure (ICSD inorganic crystal structure database 169420) and the P-1 crystal structure were used as initial structures. The P-1 crystal structure here is represented by the following crystal structure parameters. The metal here is any of In (indium), Ga (gallium), and Al (aluminum).

[Space Group P-1]

Lattice Constants:

a=10.07 Å, b=10.45 Å, c=11.01 Å, α=111.70°, β=107.70°, and γ=90.000

Atomic Coordinates:

atomic species: metal, atomic coordinates (x=0.04478, y=0.36228, z=0.86934), atomic species: metal, atomic coordinates (x=0.12677, y=0.11682, z=0.62279), atomic species: metal, atomic coordinates (x=0.21268, y=0.85040, z=0.38665), atomic species: metal, atomic coordinates (x=0.23283, y=0.11047, z=0.97132), atomic species: metal, atomic coordinates (x=0.28695, y=0.64349, z=0.10627), atomic species: metal, atomic coordinates (x=0.45663, y=0.11849, z=0.62655), atomic species: metal, atomic coordinates (x=0.58343, y=0.14455, z=0.00650), atomic species: metal, atomic coordinates (x=0.62181, y=0.64170, z=0.10725), atomic species: metal, atomic coordinates (x=0.68785, y=0.18413, z=0.31614), atomic species: metal, atomic coordinates (x=0.08662, y=0.88097, z=0.03282), atomic species: metal, atomic coordinates (x=0.02388, y=0.13328, z=0.30129), atomic species: metal, atomic coordinates (x=0.06270, y=0.60510, z=0.45610), atomic species: metal, atomic coordinates (x=0.15030, y=0.39620, z=0.19490), atomic species: metal, atomic coordinates (x=0.26240, y=0.36429, z=0.53740), atomic species: metal, atomic coordinates (x=0.34051, y=0.13040, z=0.29845), atomic species: metal, atomic coordinates (x=0.40810, y=0.60820, z=0.45090), atomic species: metal, atomic coordinates (x=0.48210, y=0.39651, z=0.22899), atomic species: metal, atomic coordinates (x=0.83690, y=0.39245, z=0.23049), atomic species: oxygen, atomic coordinates (x=0.01570, y=0.73320, z=0.36270), atomic species: oxygen, atomic coordinates (x=0.02950, y=0.44990, z=0.28500), atomic species: oxygen, atomic coordinates (x=0.05180, y=0.02040, z=0.40130), atomic species: oxygen, atomic coordinates (x=0.09750, y=0.74420, z=0.64840), atomic species: oxygen, atomic coordinates (x=0.10040, y=0.23100, z=0.06110), atomic species: oxygen, atomic coordinates (x=0.12100, y=0.50540, z=0.09290), atomic species: oxygen, atomic coordinates (x=0.12180, y=0.46770, z=0.56750), atomic species: oxygen, atomic coordinates (x=0.13230, y=0.78930, z=0.17000), atomic species: oxygen, atomic coordinates (x=0.19170, y=0.20520, z=0.83700), atomic species: oxygen, atomic coordinates (x=0.19980, y=0.22930, z=0.35780), atomic species: oxygen, atomic coordinates (x=0.24610, y=0.66070, z=0.48730), atomic species: oxygen, atomic coordinates (x=0.27030, y=0.01970, z=0.11610), atomic species: oxygen, atomic coordinates (x=0.29750, y=0.25780, z=0.64510), atomic species: oxygen, atomic coordinates (x=0.32740, y=0.44290, z=0.29080), atomic species: oxygen, atomic coordinates (x=0.38000, y=0.01700, z=0.39960), atomic species: oxygen, atomic coordinates (x=0.38520, y=0.73030, z=0.34950), atomic species: oxygen, atomic coordinates (x=0.40770, y=0.23850, z=0.06570), atomic species: oxygen, atomic coordinates (x=0.42500, y=0.46540, z=0.57450), atomic species: oxygen, atomic coordinates (x=0.45690, y=0.50630, z=0.11420), atomic species: oxygen, atomic coordinates (x=0.47200, y=0.78620, z=0.15020), atomic species: oxygen, atomic coordinates (x=0.50000, y=0.24830, z=0.35810), atomic species: oxygen, atomic coordinates (x=0.64040, y=0.02850, z=0.12200), atomic species: oxygen, atomic coordinates (x=0.65870, y=0.33560, z=0.22570), atomic species: oxygen, atomic coordinates (x=0.71710, y=0.03020, z=0.39850), atomic species: oxygen, atomic coordinates (x=0.78080, y=0.50960, z=0.12340), atomic species: oxygen, atomic coordinates (x=0.80070, y=0.24650, z=0.05620), atomic species: oxygen, atomic coordinates (x=0.96440, y=0.02480, z=0.11700).

In particular, the aforementioned P-1 or P1 crystal is characterized by a diffraction peak around 2θ=6 to 14 degrees, and the presence or absence of P-1 or P1 can also be determined at this peak. If the diffraction peak is buried by noise, the presence or absence of crystal can be determined by performing precision measurement under the following conditions.

Machine: D8 DISCOVER Plus (produced by Bruker)

Detector: Eiger2R500K

X-ray: Cu-Kα ray (wavelength $1.5418 \times 10^{-10}$ m)

Intensity: 45 kV, 120 mA

X-ray irradiation conditions: 2θ-θ reflection method, continuous scanning

Start: 5 degrees

End: 80 degrees

Sampling interval: 0.02 degrees

Speed: 25 s/step

Optical conditions: Twin Primary (Goebel Mirror), Soller (4.0 degrees) on light source side, Slit: 1.0 mm, Twin Primary (Open), Soller (4.0 degrees) on light receiving side Detector condition: 1D mode Tables 1 to 6 show the results of identification of the crystalline phase by XRD of the sintered bodies prepared under the respective conditions. In Examples 1 to 9, Comparatives 1 to 9, Comparative 11, and Comparative 12, the Bixbyite structure and the P-1 crystal structure were confirmed. Under the conditions of Example 10, only the Bixbyite structure was confirmed.

(2-3) Calculation of Weight Ratio of Crystalline Phase by XRD

Fitting was performed by the Rietveld analysis until a reliability factor Rwp was less than 15%, and the weight ratio of a crystal(s) having the Bixbyite structure that mainly contained the In element, to all crystals in each sintered body was calculated.

In Examples 1 to 9, Comparatives 1 to 9, Comparative 11, and Comparative 12, the weight ratio of the Bixbyite structure in the sintered body was 70% or more.

(2-4) High Resolution SEM Measurement

The state of crystal grains of the sintered body was evaluated using a scanning electron microscope (SEM).

The area ratio of the pores was evaluated using a scanning electron microscope (SEM).

The surface of the sintered body was polished, and if the planar shape was a rectangle, the surface was divided into 16 equal areas, and sintered body samples were prepared as measurement samples at 16 center points of the respective rectangles. Each sintered body sample was prepared by cutting the sintered body into a piece of 1 cm (1 cm×1 cm in size) or smaller, and this sintered body sample was embedded in 1-inch φ of epoxy-based room temperature curing resin. Further, the embedded sintered body sample was polished using abrasive paper #400, #600, #800, 3 μm diamond suspension water, and 50 nm colloidal silica (for final finishing) in this order. After polishing, each sintered body sample was observed under an optical microscope, and polishing was performed until no polishing marks of 1 μm or more appeared on the polished surface of the sintered body sample. The state of crystal grains of the sintered body was evaluated by performing the high-resolution SEM image measurement on the polished surface of the sintered body sample using a scanning electron microscope SU8200 produced by Hitachi High-Technologies Corporation. For the high-resolution SEM image measurement, the acceleration voltage was set to 10.0 kV and the magnifications were 2000× and 5000×. In addition, the high-resolution SEM image measurement was performed by observing areas with sizes of 62 μm×43 μm and 25 μm×18 μm, respectively, and secondary electron images were measured.

(2-5) Measurement of Area Ratio of Pores

The area ratio of pores in the sintered body was calculated by image analysis of the secondary electron image of the high-resolution SEM image using image analysis software (SPIP produced by Image Metrology, Version 4.3.2.0).

First, the contrast of the secondary electron image of the SEM image was quantified using image analysis software, and the height of (maximum concentration–minimum concentration)×1/5 was set as a threshold value. Those equal to or less than the threshold value were defined as pores, and the area ratio of the pores to the entire image was calculated. This was calculated for each of the sintered body samples (16 in total) prepared by dividing the sintered body into 16 areas as described above, and was determined as the area ratio of the pores in each sample. Finally, the average of the area ratio of the pores for the 16 samples was determined, and the average was defined as the area ratio of the pores in the sintered body produced in each of Examples and Comparatives.

Tables 1 to 6 show the evaluation results of the area ratio of the pores of the sintered bodies prepared under the respective conditions. In Examples 1 to 9, mixing and pulverization (i.e., mixing and disintegration) in the preparation of sintered bodies were performed in a bead mill, the size of the zirconia balls was adjusted, and the conditions for drying and granulation were optimized. This resulted in finely granulated powder with a true spherical shape and a grain size of 150 μm or less. By sintering this powder, a good sintered body with an area ratio of pores of 0.1% or less was obtained. No granulation was performed under the production conditions of Comparatives 1 to 12, and the area ratio of pores after sintering was increased to 0.2% or more, resulting in sintered bodies that may crack in sputtering with large equipment.

(2-6) Measurement of Hydrogen Atom Concentration and Carbon Atom Concentration

The flat surface of each sintered body was polished using abrasive paper #600, and the sample surface was subsequently etched by several tens of μm before analysis. The analysis was performed by secondary ion mass spectrometry (D-SIMS). The measurement was performed using IMS-6f produced by CAMECA. The sample was irradiated with ions of primary ion species Cs⁺, an accelerating voltage of the primary ions being 14.5 kV, and the secondary ions were measured. Then, the concentrations of H and C atoms in the sintered body were calculated from the ratio between the intensity of the secondary ions of the respective H and C atoms obtained by the SIMS measurement of the sintered body and that of a standard sample ZnO doped with known concentrations of H and C atoms, and the calculated concentrations were defined as the concentrations of H atoms and carbon atoms, respectively.

In Examples 1, 4, 5, and 7, values of $3.7\times10^{17}$ [atoms/cm$^3$], $1.0\times10^{17}$ [atoms/cm$^3$], $5.3\times10^{16}$ [atoms/cm$^3$], and $5.2\times10^{16}$ [atoms/cm$^3$] were respectively obtained for the hydrogen atom concentrations in the sintered bodies, and those value were confirmed to be concentrations that do not affect optical reliability degradation. In addition, in Examples 1, 4, 5, and 7, values of $2.2\times10^{17}$ [atoms/cm$^3$], $2.5\times10^{17}$ [atoms/cm$^3$], $3.8\times10^{16}$ [atoms/cm$^3$], and $9.7\times10^{16}$ [atoms/cm$^3$] were respectively obtained for the carbon atom concentrations, and those value were confirmed to be concentrations that do not affect optical reliability degradation.

(2-7) Bending Strength

The obtained sintered body was cut into 30 prismatic test pieces having a rectangular cross section, each of the test pieces having 3 mm thickness×4 mm width×36 mm whole length. Each test piece was measured in terms of three-point flexural strength using a material tester (EZ Graph produced by Shimadzu Corporation) in accordance with JIS R 1601: 2008. The average of measurement values of the three-point flexural strength of the 30 test pieces was defined as a bending strength.

Tables 1 to 6 show the evaluation results of the bending strength of the sintered bodies prepared under the respective conditions. In Examples 1 to 9, in which the amount of pores in the sintered bodies was small and the values of the bending strength were higher than 190 MPa, the sintered bodies that enabled stable sputtering without cracks when used as sputtering targets for large equipment were obtained. In contrast, the sintered bodies obtained in Comparatives 1 to 12, in which the values were lower than 190 MPa, had a concern that cracking occurred due to the power during sputtering when used as sputtering targets for large equipment.

TABLE 1

| | | | Ex. 1 | Ex. 2 | Ex. 3 |
|---|---|---|---|---|---|
| Material ratio | Charging composition ratio [mass %] | In$_2$O$_3$ | 91.5 | 94.0 | 88.5 |
| | | Ga$_2$O$_3$ | 6.5 | 4.0 | 10.0 |
| | | Al$_2$O$_3$ | 2.0 | 2.0 | 1.5 |
| | Metal composition ratio [at %] | In | 85.9 | 89.2 | 82.4 |
| | | Ga | 9.0 | 5.6 | 13.8 |
| | | Al | 5.1 | 5.2 | 3.8 |
| Sintered body production conditions | Mixing and pulverization | Mixing and pulverization method | Bead Milling | Bead Milling | Bead Milling |
| | | Zirconia ball diameter [mm] | 0.5 | 0.5 | 0.5 |
| | Drying and granulation | Drying and granulation method | Spray drying | Spray drying | Spray drying |
| | | Spray drying conditions | 150° C., 12,000 rpm | 150° C., 12,000 rpm | 150° C., 12,000 rpm |
| | | Spray-dried powder form | Spherical | Spherical | Spherical |
| | | Classification [μm] | ≤150 | ≤150 | ≤150 |
| | Molding | Molding method | CIP | CIP | CIP |
| | Sintering conditions 1 | Temperature increase [° C./min] | 0.2 | 0.2 | 0.2 |
| | | Retention temperature [° C.] | 200 | 200 | 200 |
| | | Retention time [h] | 2.0 | 2.0 | 2.0 |

TABLE 1-continued

|  |  |  | Ex. 1 | Ex. 2 | Ex. 3 |
|---|---|---|---|---|---|
|  | Sintering | Temperature increase [° C./min] | 0.5 | 0.5 | 0.5 |
|  | conditions 2 | Retention temperature [° C.] | 400 | 400 | 400 |
|  |  | Retention time [h] | 3.0 | 3.0 | 3.0 |
|  | Sintering | Temperature increase [° C./min] | 1.0 | 1.0 | 1.0 |
|  | conditions 3 | Retention temperature [° C.] | 1350 | 1350 | 1350 |
|  |  | Retention time [h] | 20.0 | 20.0 | 20.0 |
| Crystal structure of sintered body | XRD | Crystalline phase | Bixbyite structure Space group P-1 structure | Bixbyite structure Space group P-1 structure | Bixbyite structure Space group P-1 structure |
|  | SEM image | Area ratio of pores [%] | 0.01 | 0.02 | 0.01 |
| Strength of sintered body | Bending strength [MPa] |  | 241 | 253 | 249 |

15

TABLE 2

|  |  |  | Ex. 4 | Ex. 5 | Ex. 6 |
|---|---|---|---|---|---|
| Material ratio | Charging composition ratio [mass %] | In$_2$O$_3$ | 89.0 | 88.0 | 87.5 |
|  |  | Ga$_2$O$_3$ | 10.00 | 11.00 | 11.00 |
|  |  | Al$_2$O$_3$ | 1.00 | 1.00 | 1.50 |
|  | Metal composition ratio [at %] | In | 83.5 | 82.2 | 81.1 |
|  |  | Ga | 13.9 | 15.2 | 15.1 |
|  |  | Al | 2.6 | 2.5 | 3.8 |
| Sintered body production conditions | Mixing and pulverization | Mixing and pulverization method | Bead Milling | Bead Milling | Bead Milling |
|  |  | Zirconia ball diameter [mm] | 0.5 | 0.5 | 0.5 |
|  | Drying and granulation | Drying and granulation method | Spray drying | Spray drying | Spray drying |
|  |  | Spray drying conditions | 150° C., 12,000 rpm | 150° C., 12,000 rpm | 150° C., 12,000 rpm |
|  |  | Spray-dried powder form | Spherical | Spherical | Spherical |
|  |  | Classification [μm] | ≤150 | ≤150 | ≤150 |
|  | Molding | Molding method | CIP | CIP | CIP |
|  | Sintering conditions 1 | Temperature increase [° C./min] | 0.2 | 0.2 | 0.2 |
|  |  | Retention temperature [° C.] | 200 | 200 | 200 |
|  |  | Retention time [h] | 2.0 | 2.0 | 2.0 |
|  | Sintering conditions 1 | Temperature increase [° C./min] | 0.5 | 0.5 | 0.5 |
|  |  | Retention temperature [° C.] | 400 | 400 | 400 |
|  |  | Retention time [h] | 3.0 | 3.0 | 3.0 |
|  | Sintering conditions 1 | Temperature increase [° C./min] | 1.0 | 1.0 | 1.0 |
|  |  | Retention temperature [° C.] | 1350 | 1350 | 1350 |
|  |  | Retention time [h] | 20.0 | 20.0 | 20.0 |
| Crystal structure of sintered body | XRD | Crystalline phase | Bixbyite structure Space group P-1 structure | Bixbyite structure Space group P-1 structure | Bixbyite structure Space group P-1 structure |
|  | SEM image | Area ratio of pores [%] | 0.03 | 0.02 | 0.01 |
| Strength of sintered body | Bending strength [MPa] |  | 258 | 260 | 255 |

TABLE 3

|  |  |  | Ex. 7 | Ex. 8 | Ex. 9 |
|---|---|---|---|---|---|
| Material ratio | Charging composition ratio [mass %] | In$_2$O$_3$ | 89.0 | 89.6 | 91.5 |
|  |  | Ga$_2$O$_3$ | 9.75 | 9.97 | 6.5 |
|  |  | Al$_2$O$_3$ | 1.25 | 0.41 | 2.0 |
|  | Metal Composition Ratio [at %] | In | 83.3 | 84.9 | 85.9 |
|  |  | Ga | 13.5 | 14.0 | 9.0 |
|  |  | Al | 3.2 | 1.1 | 5.1 |
| Sintered body production conditions | Mixing and pulverization | Mixing and pulverization method | Bead Milling | Bead Milling | Bead Milling |
|  |  | Zirconia ball diameter [mm] | 0.5 | 0.5 | 0.5 |
|  | Drying and granulation | Drying and granulation method | Spray drying | Spray drying | Spray drying |
|  |  | Spray drying conditions | 150° C., 12,000 rpm | 150° C., 12,000 rpm | 150° C., 12,000 rpm |
|  |  | Spray-dried powder form | Spherical | Spherical | Spherical |
|  |  | Classification [μm] | ≤150 | ≤150 | ≤150 |
|  | Molding | Molding method | CIP | CIP | CIP |
|  | Sintering conditions 1 | Temperature increase [° C./min] | 0.2 | 0.2 | 0.2 |
|  |  | Retention temperature [° C.] | 200 | 200 | 200 |
|  |  | Retention time [h] | 2.0 | 2.0 | 2.0 |

TABLE 3-continued

|  |  |  | Ex. 7 | Ex. 8 | Ex. 9 |
|---|---|---|---|---|---|
|  | Sintering conditions 1 | Temperature increase [° C./min] | 0.5 | 0.5 | 0.5 |
|  |  | Retention temperature [° C.] | 400 | 400 | 400 |
|  |  | Retention time [h] | 3.0 | 3.0 | 3.0 |
|  | Sintering conditions 1 | Temperature increase [° C./min] | 1.0 | 1.0 | 1.0 |
|  |  | Retention temperature [° C.] | 1350 | 1350 | 1400 |
|  |  | Retention time [h] | 20.0 | 20.0 | 20.0 |
| Crystal structure of sintered body | XRD | Crystalline phase | Bixbyite structure Space group P-1 structure | Bixbyite structure Space group P-1 structure | Bixbyite structure Space group P-1 structure |
|  | SEM image | Area ratio of pores [%] | 0.03 | 0.01 | 0.02 |
| Strength of sintered body | Bending strength [MPa] |  | 239 | 256 | 239 |

TABLE 4

|  |  |  | Comp. 1 | Comp. 2 | Comp. 3 | Comp. 4 |
|---|---|---|---|---|---|---|
| Material ratio | Charging composition ratio [mass %] | In₂O₃ | 91.5 | 94.0 | 88.5 | 89.0 |
|  |  | Ga₂O₃ | 6.5 | 4.0 | 10.0 | 10.00 |
|  |  | Al₂O₃ | 2.0 | 2.0 | 1.5 | 1.00 |
|  | Metal composition ratio [at %] | In | 85.9 | 89.2 | 82.4 | 83.5 |
|  |  | Ga | 9.0 | 5.6 | 13.8 | 13.9 |
|  |  | Al | 5.1 | 5.2 | 3.8 | 2.6 |
| Sintered body production conditions | Mixing and pulverization | Mixing and pulverization method | Ball milling | Ball milling | Ball milling | Ball milling |
|  | Molding | Molding method | CIP | CIP | CIP | CIP |
|  | Sintering conditions 1 | Temperature increase [° C./min] | 0.2 | 0.2 | 0.2 | 0.2 |
|  |  | Retention temperature [° C.] | 350 | 350 | 350 | 350 |
|  |  | Retention time [h] | 3.0 | 3.0 | 3.0 | 3.0 |
|  | Sintering conditions 2 | Temperature increase [° C./min] | 1.7 | 1.7 | 1.7 | 1.7 |
|  |  | Retention temperature [° C.] | 1350 | 1350 | 1350 | 1350 |
|  |  | Retention time [h] | 24.0 | 24.0 | 24.0 | 24.0 |
| Crystal structure of sintered body | XRD | Crystalline phase | Bixbyite structure Space group P-1 structure | Bixbyite structure Space group P-1 structure | Bixbyite structure Space group P-1 structure | Bixbyite structure Space group P-1 structure |
|  | SEM image | Area ratio of pores [%] | 0.2 | 0.7 | 0.5 | 0.3 |
| Strength of sintered body |  | Bending strength [MPa] | 150 | 152 | 180 | 177 |

TABLE 5

|  |  |  | Comp. 5 | Comp. 6 | Comp. 7 | Comp. 8 |
|---|---|---|---|---|---|---|
| Material ratio | Charging composition ratio [mass %] | In₂O₃ | 88.0 | 87.5 | 89.0 | 89.6 |
|  |  | Ga₂O₃ | 11.00 | 11.00 | 9.75 | 9.97 |
|  |  | Al₂O₃ | 1.00 | 1.50 | 1.25 | 0.41 |
|  | Metal composition ratio [at %] | In | 82.2 | 81.1 | 83.3 | 72.9 |
|  |  | Ga | 15.2 | 15.1 | 13.5 | 14.0 |
|  |  | Al | 2.5 | 3.8 | 3.2 | 1.1 |
| Sintered body production conditions | Mixing and pulverization | Mixing and pulverization method | Ball milling | Ball milling | Ball milling | Ball milling |
|  | Molding | Molding method | CIP | CIP | CIP | CIP |
|  | Sintering conditions 1 | Temperature increase [° C./min] | 0.2 | 0.2 | 0.2 | 0.2 |
|  |  | Retention temperature [° C.] | 350 | 350 | 350 | 350 |
|  |  | Retention time [h] | 3.0 | 3.0 | 3.0 | 3.0 |
|  | Sintering conditions 2 | Temperature increase [° C./min] | 1.7 | 1.7 | 1.7 | 1.7 |
|  |  | Retention temperature [° C.] | 1350 | 1350 | 1350 | 1350 |
|  |  | Retention time [h] | 24.0 | 24.0 | 24.0 | 24.0 |
| Crystal structure of sintered body | XRD | Crystalline phase | Bixbyite structure Space group P-1 structure | Bixbyite structure Space group P-1 structure | Bixbyite structure Space group P-1 structure | Bixbyite structure Space group P-1 structure |
|  | SEM image | Area ratio of pores [%] | 0.3 | 0.3 | 0.4 | 0.2 |
| Strength of sintered body |  | Bending strength [MPa] | 151 | 170 | 162 | 166 |

TABLE 6

| | | | Comp. 9 | Comp. 10 | Comp. 11 | Comp. 12 |
|---|---|---|---|---|---|---|
| Material ratio | Charging composition ratio [mass %] | $In_2O_3$ | 84.0 | 87.6 | 89.0 | 94.0 |
| | | $Ga_2O_3$ | 10.0 | 12.19 | 5.0 | 5.00 |
| | | $Al_2O_3$ | 6.0 | 0.20 | 6.0 | 1.00 |
| | Metal composition ratio [at %] | In | 72.9 | 82.5 | 78.9 | 90.3 |
| | | Ga | 12.9 | 17.0 | 6.6 | 7.1 |
| | | Al | 14.2 | 0.5 | 14.5 | 2.6 |
| Sintered body production conditions | Mixing and pulverization | Mixing and pulverization method | Ball milling | Ball milling | Ball milling | Ball milling |
| | Molding | Molding method | CIP | CIP | CIP | CIP |
| | Sintering conditions 1 | Temperature increase [° C./min] | 0.2 | 0.2 | 0.2 | 0.2 |
| | | Retention temperature [° C.] | 350 | 350 | 350 | 350 |
| | | Retention time [h] | 3.0 | 3.0 | 3.0 | 3.0 |
| | Sintering conditions 2 | Temperature increase [° C./min] | 1.7 | 1.7 | 1.7 | 1.7 |
| | | Retention temperature [° C.] | 1350 | 1350 | 1350 | 1350 |
| | | Retention time [h] | 24.0 | 24.0 | 24.0 | 24.0 |
| Crystal structure of sintered body | XRD | Crystalline phase | Bixbyite structure Space group P-1 structure | Bixbyite | Bixbyite structure Space group P-1 structure | Bixbyite structure Space group P-1 structure |
| | SEM image | Area ratio of pores [%] | 0.4 | 0.6 | 4.9 | 0.5 |
| Strength of sintered body | | Bending strength [MPa] | 155 | 180 | 125 | 180 |

[3] Production of Sputtering Target and Oxide Thin Film (Examples 1 to 9)

A sputtering target was obtained using the sintered body obtained in each of Examples 1 to 9. Tables 7 to 9 show the metal composition ratio (unit: at %) of the resulting sputtering targets.

Using this oxide sputtering target, a 50-nm-thick oxide semiconductor film (oxide semiconductor layer) was formed by sputtering on a silicon wafer (gate electrode) with a 100-nm-thick thermal oxide film (gate insulating film). Film forming conditions are as shown in Tables 7 to 9. A mixed gas of high-purity argon and high-purity oxygen (impurity gas concentration: 0.01 volume %) was used as the sputtering gas.

Subsequently, the formed oxide semiconductor layer was patterned in an island shape by photolithography.

First, a photoresist film was formed on the oxide semiconductor layer. As the photoresist, AZ1500 (produced by AZ Electronic Materials) was used. The formed photoresist film was exposed to light through a photomask with a pattern in the size of 14 μm×4 μm. After exposure, development was performed with tetramethylammonium hydroxide (TMAH). After development, the oxide semiconductor layer was etched with oxalic acid. After etching, the photoresist was removed to obtain a substrate with the patterned oxide thin film. The obtained semiconductor area was smaller than the photomask pattern due to invasion of the etching solution, and was 12 μm×2.8 μm in size.

Next, the substrate with the patterned oxide thin film was placed in a furnace, heated in air to 350 degrees C. at 10 degrees C./min, and then kept for one hour. The inside of the furnace was kept at 350 degrees C. for one hour, then allowed to cool naturally. After the internal temperature of the furnace returned to room temperature, the substrate with the oxide thin film was taken out from the furnace.

Subsequently, an image reversal resist was spin-coated on a semiconductor patterning surface of the substrate with the oxide thin film after annealing. As the image reversal resist, AZ5214 (produced by AZ Electronic Materials) was used. After the spin coating, the image reversal resist was exposed to light through a photomask with a pattern in the size of 6 μm×6 μm. The image reversal resist AZ5214 was wholly exposed to light after reversal baking and developed with TMAH. A 300-nm-thick $SiO_2$ film was formed by sputtering on the substrate with the patterned resist. Sputtering conditions are as follows.

Substrate temperature: 25 degrees C.
Ultimate pressure: $4 \times 10^{-4}$ Pa or less
Atmosphere gas: Ar+$O_2$ ($O_2$ flow rate: 10%)
Sputtering pressure (full pressure): 0.5 Pa
Input voltage: RF 500 W
Magnetic Flux Density: 1000 G
Distance between S (substrate) and T (target): 70 mm Then, the substrate with the $SiO_2$ film was lifted off in acetone, thereby patterning the $SiO_2$ film.

Further, the substrate with the oxide thin film that was the patterned $SiO_2$ film was coated with Photoresist AZ1500 (produced by AZ Electronic Materials) and exposed to light through a photomask. After that, development was performed with tetramethylammonium hydroxide (TMAH). After development, Si (silicon wafer) with a thermal oxide film was etched with buffered hydrofluoric acid (BHF) to form a contact hole for taking out the gate electrode. After forming the contact hole, the substrate was annealed in air at 400 degrees C. for one hour.

A source-drain electrode layer was then patterned by a lift-off process using the image reversal resist AZ5214 and a photomask. The image reversal resist AZ5214 was exposed to light through the photomask, which was formed so that the image reversal resist AZ5214 was able to be patterned according to the final device shape (L length: 6 μm, W length: 2.8 μm, Ls length of each of the source electrode and the drain electrode: 3 μm). After reversal baking, the image reversal resist AZ5214 was wholly exposed to light and developed with TMAH. A 150-nm-thick Ti layer was formed under the following sputtering conditions on the substrate with the patterned resist.

Substrate temperature: 25 degrees C.
Ultimate pressure: $8.5 \times 10^{-5}$ Pa
Atmosphere gas: Ar
Sputtering pressure (full pressure): 0.4 Pa
Input voltage: DC 100 W
Distance between S (substrate) and T (target): 70 mm Then, the substrate with the Ti layer was lifted off in acetone, thereby patterning an ohmic electrode layer.

Finally, the substrate was annealed in air at 200 degrees C. for one hour.

The device (etch stopper type (ES type) TFT) was obtained by the above process.

Examples 10 to 23

The sintered bodies were produced as in Example 1 from gallium oxide powder, aluminum oxide powder, and indium oxide powder at the charging composition ratio (mass %) shown in Tables 10 to 13. Sputtering targets, oxide thin films, and TFT devices were obtained as in Example 1 except that the respective sputtering targets were obtained using the respective sintered bodies obtained.

Comparative 8 and Comparatives 12 to 23

The sintered bodies were produced as in Comparative 1 from gallium oxide powder, aluminum oxide powder, and indium oxide powder at the charging composition ratio (mass %) shown in Tables 14 to 16. Sputtering targets, oxide thin films, and TFT devices were obtained as in Example 1 except that the respective sputtering targets were obtained using the respective sintered bodies obtained.

[4] Presence or Absence of Patterning Defect

The substrate with the patterned oxide thin film, which was obtained by etching the oxide semiconductor layer with oxalic acid and removing the photoresist in the production of the TFT device, was observed under an optical microscope. The state where the oxide thin film remained wider than the photomask pattern when viewed from above was determined as a patterning defect.

The pattering defect occurred in Comparatives 12, 16, 17, and 18, and no patterning defect occurred and a good patterning shape was obtained in any other TFT production conditions.

[5] State of Oxide Thin Film (Semiconductor Film) after TFT Production (5-1) Method of Measuring Crystalline State of Cross Section of Oxide Thin Film by Cross-Sectional TEM The crystalline state of the cross section of the oxide thin film in the TFT device was measured by pretreating the oxide thin film using a focused ion beam system (FIB) and observing the cross section of the oxide thin film after the pretreatment using a transmission electron microscope (TEM).

Specifically, first, an ion beam was placed perpendicular to a film surface of an area where the oxide semiconductor film of the TFT device was patterned, using an FIB system (Hitachi High-Technologies Corporation "FB2100 model"). A specimen in the size of 16 μm×4 μm was sampled. Then, two samples were taken from the sampled specimen for a region of 3 μm from an end portion of a region where the source electrode or drain electrode and the oxide thin film overlapped in the channel length direction toward a region where the source electrode or drain electrode and the oxide thin film did not overlap. Ar ion milling was performed on the two taken samples until the thickness of each thin piece in the channel width direction perpendicular to the channel length and film thickness direction was approximately 100 nm, thus reducing the thickness of the two taken samples. If crystal grains were not observed due to ion sputter damage during FIB processing, etching was repeated with Ar ion milling ("Model 691" produced by Gatan) until the crystal grains were observed at an ion gun voltage of 4 keV.

The cross-sectional TEM image was observed using a transmission electron microscope (JEM-2800 model produced by JEOL Ltd.) at an acceleration voltage of 200 kV with an observation magnification of 200,000 times (approximately 4 μm square area), an observation magnification of 500,000 times (approximately 800 nm square area), an observation magnification of 2,000,000 times (about 200 nm square area), and an observation magnification of 10,000, 000 times (about 40 nm square area).

A case where atoms were not periodically arranged in the observed image was determined to be amorphous. In addition, a state where atoms were periodically arranged, the grain boundaries of the oxide thin film were continuously connected from the lower surface to the surface of the oxide thin film, and the average grain-boundary angle θ between the lower surface and the grain boundaries of the oxide thin film was in a range from 70 degrees to 110 degrees, was determined as the solid-phase crystallization. Furthermore, a state where the grain boundaries were discontinuous from the lower surface to the surface of the oxide thin film and the crystalline state on the substrate side was different from that on the surface side, was determined as two-layered crystallization.

Tables 7 to 16 show the crystalline state of the cross section of the oxide thin film in the TFT devices prepared under the respective conditions. Examples 1 to 23, and Comparatives 8, 13, 19, 20, and 21 were solid-phase crystallized, while Comparatives 14, 15, 22, and 23 were in the amorphous state. In Comparatives 14 and 15, the optical reliability of the TFT device at die (0 0) was poor with a significant shift of $\Delta Vth < -5.0$ V. Comparative Examples 22 and 23 showed a large positive shift in value, $Vth > 2V$, which resulted in a significant decrease in linear mobility.

In Comparatives 12, 16, 17, and 18, the two-layered crystallization was observed in the end, but the TFT could not be produced and measured because residues were generated when the semiconductor patterning was performed in the TFT production and the oxide thin film could not be processed into the TFT shape.

[6] Evaluation on Characteristics of ES-Type TFT (6-1) Initial Characteristics

The resulting TFTs were measured using a semiconductor parameter analyzer ("B1500" produced by Agilent) at room temperature and in a light-shielding environment (inside a shield box). A drain voltage (Vd) of 0.1 V was applied. A current value Id was measured in increments of 0.2 V from −5 V to 20 V of the gate voltage (Vg) for each Vd application to obtain Id-Vg characteristics.

The calculation method for each parameter is as described below.

(a) Linear Mobility (μlin)

For the maximum value of the linear mobility when Vd=0.1 V was applied, a graph of Id-Vg characteristics was created, transconductance (Gm) of each Vg was calculated, and the linear mobility (μlin) was drawn using a formula for a linear region. Specifically, Gm was calculated by $\partial(Id)/\partial(Vg)$. Further, μlin was calculated by a formula (b) for the linear region.

$$\mu lin = (Gm \cdot L)/(W \cdot Ci \cdot Vd) \qquad \text{(b)}$$

Ci in the formula (b) was capacitance of the gate insulating film, and a value of Ci [F/cm$^2$] calculated based on a film thickness of the gate insulating film in final shape of 100 nm, relative permittivity of SiO$_2$ of 3.9, and permittivity of vacuum of 8.85×10$^{-14}$ [F/cm] was used.

In the formula (b), L is the channel length (L length) and W is the channel width (W length).

(b) Threshold Voltage (Vth)

The threshold voltage (Vth) was defined as Vg at $Id=10^{-9}$ A from the graph of transfer characteristics Id-Vg by applying Vd=0.1 V and measuring the Id-Vg characteristics.

A variety of parameters calculated from the Id-Vg characteristics for the TFT devices at die (0 0) prepared under the respective conditions are shown in Tables 7 to 16. Examples 1 to 23 and Comparatives 8, 13, 14, and 15 had a linear mobility of 25 cm$^2$/Vs or more, which was sufficient for high-definition display applications, while Comparatives 19 to 23 had a linear mobility of 20 cm$^2$/Vs or less, which was low.

Further, Examples 1 to 23 and Comparatives 8, 19, and 20 had Vth in a range from −2 V to 2 V, which was a value that could be corrected by a correction circuit when incorporated as a TFT in a panel. On the contrary, Comparatives 21, 22, 23, 13, 14, and 15 had Vth>2.0 V, which was a value that could not be controlled by a correction circuit.

(6-2) Optical Reliability

For each TFT device, the substrate temperature was heated to 60 degrees C. and Vd=0.1 V was applied to measure the Id-Vg characteristics. Vth at this time was defined as Vth before the test. Subsequently, Vg=−20 V and white LED light of 4,200 nits luminance were applied from above the upper surface of the TFT substrate using an LED backlight unit produced by Asahi Spectra Co., Ltd., and the threshold voltage (Vth) after 10,000 seconds was compared with that before the test, and the difference was defined as ΔVth.

The evaluation results of ΔVth as the optical reliability for the TFT devices at die (0 0) and die (0 −5) prepared under the respective conditions are shown in Tables 7 to 16. In Examples 1 to 23, the TFT device at die (0 0) had a good value of ΔVth≥−2.0 V, whereas in Comparatives 8, 13, 14, and 15, the TFT device at die (0 0) had a large degradation with ΔVth≤−2.2 V. In Examples 1 to 23, the TFT device at die (0 −5) had ΔVth≥−6.0 V, whereas in Comparatives 8, 13, 14, and 15, the TFT device at die (0 −5) had a large degradation with ΔVth≤−8.0 V.

TABLE 7

| | | | Ex. 1 | Ex. 2 | Ex. 3 |
|---|---|---|---|---|---|
| Oxide sputtering target | Charging composition ratio [mass %] | $In_2O_3$ | 91.5 | 94.0 | 88.5 |
| | | $Ga_2O_3$ | 6.5 | 4.0 | 10.0 |
| | | $Al_2O_3$ | 2.0 | 2.0 | 1.5 |
| | Metal composition ratio [at %] | In | 85.9 | 89.2 | 82.4 |
| | | Ga | 9.0 | 5.6 | 13.8 |
| | | Al | 5.1 | 5.2 | 3.8 |
| ES-type TFT production conditions | Sputtering film forming conditions of oxide semiconductor | Atmosphere gas | Ar + O$_2$ | Ar + O$_2$ | Ar + O$_2$ |
| | | Back pressure before film formation [Pa] | $4 \times 10^{-4}$ or less | $4 \times 10^{-4}$ or less | $4 \times 10^{-4}$ or less |
| | | Pressure during film formation [Pa] | 0.5 | 0.5 | 0.5 |
| | | O$_2$ flow rate during film formation [%] | 10 | 10 | 10 |
| | | Output during film formation [W] | 400.0 | 400.0 | 400.0 |
| | | Magnetic flux density [G] | 1000 | 1000 | 1000 |
| | | Film thickness [nm] | 50 | 50 | 50 |
| | Semiconductor patterning | Resist | AZ1500 | AZ1500 | AZ1500 |
| | | Semiconductor etching | Oxalic acid | Oxalic acid | Oxalic acid |
| | Annealing | Temperature-increase pattern [° C./min] | 10 | 10 | 10 |
| | | Highest temperature [° C.] | 350 | 350 | 350 |
| | | Retention time [hour] | 1 | 1 | 1 |
| | | Atmosphere | Air | Air | Air |
| | Etch stopper patterning | Etch stopper | SiO$_2$ | SiO$_2$ | SiO$_2$ |
| | | Resist | AZ5214 | AZ5214 | AZ5214 |
| | Formation of contact hole in gate insulating film | Resist | AZ1500 | AZ1500 | AZ1500 |
| | | Etchant | BHF | BHF | BHF |
| | Annealing | Highest temperature [° C.] | 400 | 400 | 400 |
| | | Retention time [hour] | 1 | 1 | 1 |
| | | Atmosphere | In air | In air | In air |
| | Formation of electrodes | Electrodes | Ti | Ti | Ti |
| | | Resist | AZ5214 | AZ5214 | AZ5214 |
| | Final annealing | Highest temperature [° C.] | 200 | 200 | 200 |
| | | Retention time [hour] | 1 | 1 | 1 |
| | | Atmosphere | In air | In air | In air |
| State of semiconductor film | Cross-sectional TEM | Crystallizability | Solid-phase crystallization | Solid-phase crystallization | Solid-phase crystallization |
| ES-type TFT characteristics | die (0 0) initial characteristics | Vth [V] | 1.0 | −1.2 | 0.7 |
| | | Linear mobility [cm$^2$/Vs] | 26 | 29 | 27 |
| | die (0 0) optical reliability | ∠Vth [V] | −0.5 | −2.0 | −1.0 |
| | die (0-5) optical reliability | ∠Vth [V] | −1.2 | −5.2 | −1.4 |

TABLE 8

| | | | Ex. 4 | Ex. 5 | Ex. 6 |
|---|---|---|---|---|---|
| Oxide sputtering target | Charging composition ratio [mass %] | $In_2O_3$ | 89.0 | 88.0 | 87.5 |
| | | $Ga_2O_3$ | 10.00 | 11.00 | 11.00 |
| | | $Al_2O_3$ | 1.00 | 1.00 | 1.50 |
| | Metal composition ratio [at %] | In | 83.5 | 82.2 | 81.1 |
| | | Ga | 13.9 | 15.2 | 15.1 |
| | | Al | 2.6 | 2.5 | 3.8 |
| ES-type TFT production conditions | Sputtering film forming conditions of oxide semiconductor | Atmosphere gas | Ar + $O_2$ | Ar + $O_2$ | Ar + $O_2$ |
| | | Back pressure before film formation [Pa] | $4 \times 10^{-4}$ or less | $4 \times 10^{-4}$ or less | $4 \times 10^{-4}$ or less |
| | | Pressure during film formation [Pa] | 0.5 | 0.5 | 0.5 |
| | | $O_2$ flow rate during film formation [%] | 10 | 10 | 10 |
| | | Output during film formation [W] | 400.0 | 400.0 | 400.0 |
| | | Magnetic flux density [G] | 1000 | 1000 | 1000 |
| | | Film thickness [nm] | 50 | 50 | 50 |
| | Semiconductor patterning | Resist | AZ1500 | AZ1500 | AZ1500 |
| | | Semiconductor etching | Oxalic acid | Oxalic acid | Oxalic acid |
| | Annealing | Temperature-increase pattern [° C./min] | 10 | 10 | 10 |
| | | Highest temperature [° C.] | 350 | 350 | 350 |
| | | Retention time [hour] | 1 | 1 | 1 |
| | | Atmosphere | Air | Air | Air |
| | Etch stopper patterning | Etch stopper | $SiO_2$ | $SiO_2$ | $SiO_2$ |
| | | Resist | AZ5214 | AZ5214 | AZ5214 |
| | Formation of contact hole in gate insulating film | Resist | AZ1500 | AZ1500 | AZ1500 |
| | | Etchant | BHF | BHF | BHF |
| | Annealing | Highest temperature [° C.] | 400 | 400 | 400 |
| | | Retention time [hour] | 1 | 1 | 1 |
| | | Atmosphere | In air | In air | In air |
| | Formation of electrodes | Electrodes | Ti | Ti | Ti |
| | | Resist | AZ5214 | AZ5214 | AZ5214 |
| | Final annealing | Highest temperature [° C.] | 200 | 200 | 200 |
| | | Retention time [hour] | 1 | 1 | 1 |
| | | Atmosphere | In air | In air | In air |
| State of semiconductor film | Cross-sectional TEM | Crystallizability | Solid-phase crystallization | Solid-phase crystallization | Solid-phase crystallization |
| ES-type TFT characteristics | die (0 0) initial characteristics | Vth [V] | 0.5 | 0.1 | 0.6 |
| | | Linear mobility [cm²/Vs] | 30 | 34 | 29 |
| | die (0 0) optical reliability | ⊿Vth [V] | −1.1 | −1.8 | −1.0 |
| | die (0-5) optical reliability | ⊿Vth [V] | −2.1 | −2.4 | −1.4 |

40

TABLE 9

| | | | Ex. 7 | Ex. 8 | Ex. 9 |
|---|---|---|---|---|---|
| Oxide sputtering target | Charging composition ratio [mass %] | $In_2O_3$ | 89.0 | 89.6 | 91.5 |
| | | $Ga_2O_3$ | 9.75 | 9.97 | 6.5 |
| | | $Al_2O_3$ | 1.25 | 0.41 | 2.0 |
| | Metal composition ratio [at %] | In | 83.3 | 84.9 | 85.9 |
| | | Ga | 13.5 | 14.0 | 9.0 |
| | | Al | 3.2 | 1.1 | 5.1 |
| ES-type TFT production conditions | Sputtering film forming conditions of oxide semiconductor | Atmosphere gas | Ar + $O_2$ | Ar + $O_2$ | Ar + $O_2$ |
| | | Back pressure before film formation [Pa] | $4 \times 10^{-4}$ or less | $4 \times 10^{-4}$ or less | $4 \times 10^{-4}$ or less |
| | | Pressure during film formation [Pa] | 0.5 | 0.5 | 0.5 |
| | | $O_2$ flow rate during film formation [%] | 10 | 10 | 10 |
| | | Output during film formation [W] | 400.0 | 400.0 | 400.0 |
| | | Magnetic flux density [G] | 1000 | 1000 | 1000 |
| | | Film thickness [nm] | 50 | 50 | 50 |
| | Semiconductor patterning | Resist | AZ1500 | AZ1500 | AZ1500 |
| | | Semiconductor etching | Oxalic acid | Oxalic acid | Oxalic acid |
| | Annealing | Temperature-increase pattern [° C./min] | 10 | 10 | 10 |
| | | Highest temperature [° C.] | 350 | 350 | 350 |
| | | Retention time [hour] | 1 | 1 | 1 |
| | | Atmosphere | Air | Air | Air |

TABLE 9-continued

| | | | Ex. 7 | Ex. 8 | Ex. 9 |
|---|---|---|---|---|---|
| | Etch stopper patterning | Etch stopper | SiO$_2$ | SiO$_2$ | SiO$_2$ |
| | | Resist | AZ5214 | AZ5214 | AZ5214 |
| | Formation of contact hole in | Resist | AZ1500 | AZ1500 | AZ1500 |
| | gate insulating film | Etchant | BHF | BHF | BHF |
| | Annealing | Highest temperature [° C.] | 400 | 400 | 400 |
| | | Retention time [hour] | 1 | 1 | 1 |
| | | Atmosphere | In air | In air | In air |
| | Formation of electrodes | Electrodes | Ti | Ti | Ti |
| | | Resist | AZ5214 | AZ5214 | AZ5214 |
| | Final annealing | Highest temperature [° C.] | 200 | 200 | 200 |
| | | Retention time [hour] | 1 | 1 | 1 |
| | | Atmosphere | In air | In air | In air |
| State of semiconductor film | Cross-sectional TEM | Crystallizability | Solid-phase crystallization | Solid-phase crystallization | Solid-phase crystallization |
| ES-type TFT characteristics | die (0 0) initial characteristics | Vth [V] | 0.5 | 0.3 | 0.3 |
| | | Linear mobility [cm$^2$/Vs] | 32 | 35 | 34 |
| | die (0 0) optical reliability | ⊿Vth [V] | −1.0 | −1.4 | −1.5 |
| | die (0-5) optical reliability | ⊿Vth [V] | −1.8 | −5.6 | −5.3 |

TABLE 10

| | | | Ex. 10 | Ex. 11 | Ex. 12 | Ex. 13 |
|---|---|---|---|---|---|---|
| Oxide sputtering target | Charging composition ratio [mass %] | In$_2$O$_3$ | 83.0 | 84.4 | 82.0 | 83.2 |
| | | Ga$_2$O$_3$ | 15.0 | 15.0 | 16.5 | 16.2 |
| | | Al$_2$O$_3$ | 2.0 | 0.6 | 1.5 | 0.6 |
| | Metal composition ratio [at %] | In | 75.0 | 78.0 | 74.2 | 76.5 |
| | | Ga | 20.1 | 20.5 | 22.1 | 22.0 |
| | | Al | 4.9 | 1.5 | 3.7 | 1.5 |
| ES-type TFT production conditions | Sputtering film forming conditions of oxide semiconductor | Atmosphere gas | Ar + O$_2$ | Ar + O$_2$ | Ar + O$_2$ | Ar + O$_2$ |
| | | Back pressure before film formation [Pa] | 4 × 10$^{-4}$ or less | 4 × 10$^{-4}$ or less | 4 × 10$^{-4}$ or less | 4 × 10$^{-4}$ or less |
| | | Pressure during film formation [Pa] | 0.5 | 0.5 | 0.5 | 0.5 |
| | | O$_2$ flow rate during film formation [%] | 10 | 10 | 10 | 10 |
| | | Output during film formation [W] | 400.0 | 400.0 | 400.0 | 400.0 |
| | | Magnetic flux density [G] | 1000 | 1000 | 1000 | 1000 |
| | | Film thickness [nm] | 50 | 50 | 50 | 50 |
| | Semiconductor patterning | Resist | AZ1500 | AZ1500 | AZ1500 | AZ1500 |
| | | Semiconductor etching | Oxalic acid | Oxalic acid | Oxalic acid | Oxalic acid |
| | Annealing | Temperature-increase pattern [° C./min] | 10 | 10 | 10 | 10 |
| | | Highest temperature [° C.] | 350 | 350 | 350 | 350 |
| | | Retention time [hour] | 1 | 1 | 1 | 1 |
| | | Atmosphere | Air | Air | Air | Air |
| | Etch stopper patterning | Etch stopper | SiO2 | SiO$_2$ | SiO$_2$ | SiO$_2$ |
| | | Resist | AZ5214 | AZ5214 | AZ5214 | AZ5214 |
| | Formation of contact hole in gate insulating film | Resist | AZ1500 | AZ1500 | AZ1500 | AZ1500 |
| | | Etchant | BHF | BHF | BHF | BHF |
| | Annealing | Highest temperature [° C.] | 400 | 400 | 400 | 400 |
| | | Retention time [hour] | 1 | 1 | 1 | 1 |
| | | Atmosphere | In air | In air | In air | In air |
| | Formation of electrodes | Electrodes | Ti | Ti | Ti | Ti |
| | | Resist | AZ5214 | AZ5214 | AZ5214 | AZ5214 |
| | Final annealing | Highest temperature [° C.] | 200 | 200 | 200 | 200 |
| | | Retention time [hour] | 1 | 1 | 1 | 1 |
| | | Atmosphere | In air | In air | In air | In air |
| State of semiconductor film | Cross-sectional TEM | Crystallizability | Solid-phase crystallization | Solid-phase crystallization | Solid-phase crystallization | Solid-phase crystallization |
| ES-type TFT characteristics | die (0 0) initial characteristics | Vth [V] | 1.8 | 1.8 | 2.0 | 1.8 |
| | | Linear mobility [cm$^2$/Vs] | 26 | 36 | 25 | 35 |
| | die (0 0) optical reliability | ∠Vth [V] | −1.2 | −2.0 | −1.5 | −2.0 |
| | die (0-5) optical reliability | ∠Vth [V] | −2.0 | −6.0 | −2.2 | −5.8 |

TABLE 11

| | | | Ex. 14 | Ex. 15 | Ex. 16 | Ex. 17 |
|---|---|---|---|---|---|---|
| Oxide sputtering target | Charging composition ratio [mass %] | $In_2O_3$ | 85.2 | 84.0 | 86.6 | 87.8 |
| | | $Ga_2O_3$ | 14.0 | 14.0 | 11.0 | 9.8 |
| | | $Al_2O_3$ | 0.8 | 2.0 | 2.4 | 2.4 |
| | Metal composition ratio [at %] | In | 78.8 | 76.2 | 79.1 | 80.7 |
| | | Ga | 19.2 | 18.8 | 14.9 | 13.3 |
| | | Al | 2.0 | 4.9 | 6.0 | 6.0 |
| ES-type TFT production conditions | Sputtering film forming conditions of oxide semiconductor | Atmosphere gas | Ar + $O_2$ | Ar + $O_2$ | Ar + $O_2$ | Ar + $O_2$ |
| | | Back pressure before film formation [Pa] | $4 \times 10^{-4}$ or less | $4 \times 10^{-4}$ or less | $4 \times 10^{-4}$ or less | $4 \times 10^{-4}$ or less |
| | | Pressure during film formation [Pa] | 0.5 | 0.5 | 0.5 | 0.5 |
| | | $O_2$ flow rate during film formation [%] | 10 | 10 | 10 | 10 |
| | | Output during film formation [W] | 400.0 | 400.0 | 400.0 | 400.0 |
| | | Magnetic flux density [G] | 1000 | 1000 | 1000 | 1000 |
| | | Film thickness [nm] | 50 | 50 | 50 | 50 |
| | Semiconductor patterning | Resist | AZ1500 | AZ1500 | AZ1500 | AZ1500 |
| | | Semiconductor etching | Oxalic acid | Oxalic acid | Oxalic acid | Oxalic acid |
| | Annealing | Temperature-increase pattern [° C./min] | 10 | 10 | 10 | 10 |
| | | Highest temperature [° C.] | 350 | 350 | 350 | 350 |
| | | Retention time [hour] | 1 | 1 | 1 | 1 |
| | | Atmosphere | Air | Air | Air | Air |
| | Etch stopper patterning | Etch stopper | $SiO_2$ | $SiO_2$ | $SiO_2$ | $SiO_2$ |
| | | Resist | AZ5214 | AZ5214 | AZ5214 | AZ5214 |
| | Formation of contact hole in gate insulating film | Resist | AZ1500 | AZ1500 | AZ1500 | AZ1500 |
| | | Etchant | BHF | BHF | BHF | BHF |
| | Annealing | Highest temperature [° C.] | 400 | 400 | 400 | 400 |
| | | Retention time [hour] | 1 | 1 | 1 | 1 |
| | | Atmosphere | In air | In air | In air | In air |
| | Formation of electrodes | Electrodes | Ti | Ti | Ti | Ti |
| | | Resist | AZ5214 | AZ5214 | AZ5214 | AZ5214 |
| | Final annealing | Highest temperature [° C.] | 200 | 200 | 200 | 200 |
| | | Retention time [hour] | 1 | 1 | 1 | 1 |
| | | Atmosphere | In air | In air | In air | In air |
| State of semiconductor film | Cross-sectional TEM | Crystallizability | Solid-phase crystallization | Solid-phase crystallization | Solid-phase crystallization | Solid-phase crystallization |
| ES-type TFT characteristics | die (0 0) initial characteristics | Vth [V] | 0.4 | 1.9 | 2.0 | 1.9 |
| | | Linear mobility [cm²/Vs] | 37 | 31 | 26 | 28 |
| | die (0 0) optical reliability | ⊿Vth [V] | −1.9 | −1.0 | −1.2 | −1.1 |
| | die (0 −5) optical reliability | ⊿Vth [V] | −5.9 | −3.1 | −1.1 | −1.1 |

40

TABLE 12

| | | | Ex. 18 | Ex. 19 | Ex. 20 |
|---|---|---|---|---|---|
| Oxide sputtering target | Charging composition ratio [mass %] | $In_2O_3$ | 91.5 | 90.7 | 89.9 |
| | | $Ga_2O_3$ | 7.3 | 7.3 | 7.3 |
| | | $Al_2O_3$ | 1.2 | 2.0 | 2.8 |
| | Metal composition ratio [at %] | In | 86.7 | 84.8 | 83.0 |
| | | Ga | 10.2 | 10.1 | 10.0 |
| | | Al | 3.1 | 5.1 | 7.0 |
| ES-type TFT production conditions | Sputtering film forming conditions of oxide semiconductor | Atmosphere gas | Ar + $O_2$ | Ar + $O_2$ | Ar + $O_2$ |
| | | Back pressure before film formation [Pa] | $4 \times 10^{-4}$ or less | $4 \times 10^{-4}$ or less | $4 \times 10^{-4}$ or less |
| | | Pressure during film formation [Pa] | 0.5 | 0.5 | 0.5 |
| | | $O_2$ flow rate during film formation [%] | 10 | 10 | 10 |
| | | Output during film formation [W] | 400.0 | 400.0 | 400.0 |
| | | Magnetic flux density [G] | 1000 | 1000 | 1000 |
| | | Film thickness [nm] | 50 | 50 | 50 |
| | Semiconductor patterning | Resist | AZ1500 | AZ1500 | AZ1500 |
| | | Semiconductor etching | Oxalic acid | Oxalic acid | Oxalic acid |
| | Annealing | Temperature-increase pattern [° C./min] | 10 | 10 | 10 |
| | | Highest temperature [° C.] | 350 | 350 | 350 |
| | | Retention time [hour] | 1 | 1 | 1 |
| | | Atmosphere | Air | Air | Air |

TABLE 12-continued

| | | | Ex. 18 | Ex. 19 | Ex. 20 |
|---|---|---|---|---|---|
| | Etch stopper patterning | Etch stopper | SiO$_2$ | SiO$_2$ | SiO$_2$ |
| | | Resist | AZ5214 | AZ5214 | AZ5214 |
| | Formation of contact hole | Resist | AZ1500 | AZ1500 | AZ1500 |
| | in gate insulating film | Etchant | BHF | BHF | BHF |
| | Annealing | Highest temperature [° C.] | 400 | 400 | 400 |
| | | Retention time [hour] | 1 | 1 | 1 |
| | | Atmosphere | In air | In air | In air |
| | Formation of electrodes | Electrodes | Ti | Ti | Ti |
| | | Resist | AZ5214 | AZ5214 | AZ5214 |
| | Final annealing | Highest temperature [° C.] | 200 | 200 | 200 |
| | | Retention time [hour] | 1 | 1 | 1 |
| | | Atmosphere | In air | In air | In air |
| State of semiconductor film | Cross-sectional TEM | Crystallizability | Solid-phase crystallization | Solid-phase crystallization | Solid-phase crystallization |
| ES-type TFT characteristics | die (0 0) initial characteristics | Vth [V] | 0.0 | 0.8 | 2.0 |
| | | Linear mobility [cm$^2$/Vs] | 35 | 28 | 25 |
| | die (0 0) optical reliability | ⊿Vth [V] | −2.0 | −1.1 | −0.7 |
| | die (0-5) optical reliability | ⊿Vth [V] | −2.2 | −1.9 | −1.1 |

TABLE 13

| | | | Ex. 21 | Ex. 22 | Ex. 23 |
|---|---|---|---|---|---|
| Oxide sputtering target | Charging composition ratio [mass %] | In$_2$O$_3$ | 92.6 | 91.4 | 92.1 |
| | | Ga$_2$O$_3$ | 5.8 | 5.8 | 5.1 |
| | | Al$_2$O$_3$ | 1.6 | 2.8 | 2.8 |
| | Metal composition ratio [at %] | In | 87.7 | 84.9 | 85.9 |
| | | Ga | 8.1 | 8.0 | 7.0 |
| | | Al | 4.1 | 7.1 | 7.1 |
| ES-type TFT production conditions | Sputtering film forming conditions of oxide semiconductor | Atmosphere gas | Ar + O$_2$ | Ar + O$_2$ | Ar + O$_2$ |
| | | Back pressure before film formation [Pa] | 4 × 10$^{-4}$ or less | 4 × 10$^{-4}$ or less | 4 × 10$^{-4}$ or less |
| | | Pressure during film formation [Pa] | 0.5 | 0.5 | 0.5 |
| | | O$_2$ flow rate during film formation [%] | 10 | 10 | 10 |
| | | Output during film formation [W] | 400.0 | 400.0 | 400.0 |
| | | Magnetic flux density [G] | 1000 | 1000 | 1000 |
| | | Film thickness [nm] | 50 | 50 | 50 |
| | Semiconductor patterning | Resist | AZ1500 | AZ1500 | AZ1500 |
| | | Semiconductor etching | Oxalic acid | Oxalic acid | Oxalic acid |
| | Annealing | Temperature-increase pattern [° C./min] | 10 | 10 | 10 |
| | | Highest temperature [° C.] | 350 | 350 | 350 |
| | | Retention time [hour] | 1 | 1 | 1 |
| | | Atmosphere | Air | Air | Air |
| | Etch stopper patterning | Etch stopper | SiO$_2$ | SiO$_2$ | SiO$_2$ |
| | | Resist | AZ5214 | AZ5214 | AZ5214 |
| | Formation of contact hole | Resist | AZ1500 | AZ1500 | AZ1500 |
| | in gate insulating film | Etchant | BHF | BHF | BHF |
| | Annealing | Highest temperature [° C.] | 400 | 400 | 400 |
| | | Retention time [hour] | 1 | 1 | 1 |
| | | Atmosphere | In air | In air | In air |
| | Formation of electrodes | Electrodes | Ti | Ti | Ti |
| | | Resist | AZ5214 | AZ5214 | AZ5214 |
| | Final annealing | Highest temperature [° C.] | 200 | 200 | 200 |
| | | Retention time [hour] | 1 | 1 | 1 |
| | | Atmosphere | In air | In air | In air |
| State of semiconductor film | Cross-sectional TEM | Crystallizability | Solid-phase crystallization | Solid-phase crystallization | Solid-phase crystallization |
| ES-type TFT characteristics | die (0 0) initial characteristics | Vth [V] | 1.5 | 1.7 | 1.2 |
| | | Linear mobility [cm$^2$/Vs] | 25 | 25 | 27 |
| | die (0 0) optical reliability | ⊿Vth [V] | −2.0 | −1.8 | −2.0 |
| | die (0-5) optical reliability | ⊿Vth [V] | −3.1 | −2.3 | −3.3 |

TABLE 14

| | | | Comp. 8 | Comp. 13 | Comp. 14 | Comp. 15 |
|---|---|---|---|---|---|---|
| Oxide sputtering target | Charging composition ratio [mass %] | In₂O₃ | 89.6 | 84.9 | 82.7 | 81.7 |
| | | Ga₂O₃ | 9.97 | 14.80 | 17.00 | 18.00 |
| | | Al₂O₃ | 0.39 | 0.30 | 0.30 | 0.30 |
| | Metal composition ratio [at %] | In | 72.9 | 72.9 | 72.9 | 72.9 |
| | | Ga | 14.0 | 20.4 | 23.2 | 24.4 |
| | | Al | 1.0 | 0.8 | 0.8 | 0.7 |
| ES-type TFT production conditions | Sputtering film forming conditions of oxide semiconductor | Atmosphere gas | Ar + O₂ | Ar + O₂ | Ar + O₂ | Ar + O₂ |
| | | Back pressure before film formation [Pa] | 4 × 10⁻⁴ or less | 4 × 10⁻⁴ or less | 4 × 10⁻⁴ or less | 4 × 10⁻⁴ or less |
| | | Pressure during film formation [Pa] | 0.5 | 0.5 | 0.5 | 0.5 |
| | | O₂ flow rate during film formation [%] | 10 | 10 | 10 | 10 |
| | | Output during film formation [W] | 400.0 | 400.0 | 400.0 | 400.0 |
| | | Magnetic flux density [G] | 1000 | 1000 | 1000 | 1000 |
| | | Film thickness [nm] | 50 | 50 | 50 | 50 |
| | Semiconductor patterning | Resist | AZ1500 | AZ1500 | AZ1500 | AZ1500 |
| | | Semiconductor etching | Oxalic acid | Oxalic acid | Oxalic acid | Oxalic acid |
| | Annealing | Temperature-increase pattern [° C./min] | 10 | 10 | 10 | 10 |
| | | Highest temperature [° C.] | 350 | 350 | 350 | 350 |
| | | Retention time [hour] | 1 | 1 | 1 | 1 |
| | | Atmosphere | Air | Air | Air | Air |
| | Etch stopper patterning | Etch stopper | SiO₂ | SiO₂ | SiO₂ | SiO₂ |
| | | Resist | AZ5214 | AZ5214 | AZ5214 | AZ5214 |
| | Formation of contact hole in gate insulating film | Resist | AZ1500 | AZ1500 | AZ1500 | AZ1500 |
| | | Etchant | BHF | BHF | BHF | BHF |
| | Annealing | Highest temperature [° C.] | 400 | 400 | 400 | 400 |
| | | Retention time [hour] | 1 | 1 | 1 | 1 |
| | | Atmosphere | In air | In air | In air | In air |
| | Formation of electrodes | Electrodes | Ti | Ti | Ti | Ti |
| | | Resist | AZ5214 | AZ5214 | AZ5214 | AZ5214 |
| | Final annealing | Highest temperature [° C.] | 200 | 200 | 200 | 200 |
| | | Retention time [hour] | 1 | 1 | 1 | 1 |
| | | Atmosphere | In air | In air | In air | In air |
| State of semiconductor film | Cross-sectional TEM | Crystallizability | Solid-phase crystallization | Solid-phase crystallization | amorphous | amorphous |
| ES-type TFT characteristics | die (0 0) initial characteristics | Vth [V] | 1.9 | 2.1 | 2.3 | 2.2 |
| | | Linear mobility [cm²/Vs] | 35 | 34 | 28 | 28 |
| | die (0 0) optical reliability | ∠Vth [V] | −3.7 | −2.2 | −5.5 | −5.3 |
| | die (0 −5) optical reliability | ∠Vth [V] | −10 or less | −8.9 | −10 or less | −10 or less |

TABLE 15

| | | | Comp. 12 | Comp. 16 | Comp. 17 | Comp. 18 |
|---|---|---|---|---|---|---|
| Oxide sputtering target | Charging composition ratio [mass %] | In₂O₃ | 94.0 | 92.5 | 94.0 | 95.1 |
| | | Ga₂O₃ | 5.00 | 7.10 | 5.00 | 3.70 |
| | | Al₂O₃ | 1.00 | 0.45 | 1.00 | 1.20 |
| | Metal composition ratio [at %] | In | 90.3 | 88.7 | 90.3 | 91.6 |
| | | Ga | 7.1 | 10.1 | 7.1 | 5.3 |
| | | Al | 2.6 | 1.2 | 2.6 | 3.1 |
| ES-type TFT production conditions | Sputtering film forming conditions of oxide semiconductor | Atmosphere gas | Ar + O₂ | Ar + O₂ | Ar + O₂ | Ar + O₂ |
| | | Back pressure before film formation [Pa] | 4 × 10⁻⁴ or less | 4 × 10⁻⁴ or less | 4 × 10⁻⁴ or less | 4 × 10⁻⁴ or less |
| | | Pressure during film formation [Pa] | 0.5 | 0.5 | 0.5 | 0.5 |
| | | O₂ flow rate during film formation [%] | 10 | 10 | 10 | 10 |
| | | Output during film formation [W] | 400.0 | 400.0 | 400.0 | 400.0 |
| | | Magnetic flux density [G] | 1000 | 1000 | 1000 | 1000 |
| | | Film thickness [nm] | 50 | 50 | 50 | 50 |
| | Semiconductor patterning | Resist | AZ1500 | AZ1500 | AZ1500 | AZ1500 |
| | | Semiconductor etching | Oxalic acid | Oxalic acid | Oxalic acid | Oxalic acid |
| | Annealing | Temperature-increase pattern [° C./min] | 10 | 10 | 10 | 10 |
| | | Highest temperature [° C.] | 350 | 350 | 350 | 350 |
| | | Retention time [hour] | 1 | 1 | 1 | 1 |
| | | Atmosphere | Air | Air | Air | Air |

TABLE 15-continued

| | | | Comp. 12 | Comp. 16 | Comp. 17 | Comp. 18 |
|---|---|---|---|---|---|---|
| | Etch stopper patterning | Etch stopper Resist | TFT was not be produced due to patterning defect | TFT was not be produced due to patterning defect | TFT was not be produced due to patterning defect | TFT was not be produced due to patterning defect |
| | Formation of contact hole in gate insulating film | Resist Etchant | | | | |
| | Annealing | Highest temperature [° C.] Retention time [hour] Atmosphere | | | | |
| | Formation of electrodes | Electrodes Resist | | | | |
| | Final annealing | Highest temperature [° C.] Retention time [hour] Atmosphere | | | | |
| State of semiconductor film | Cross-sectional TEM | Crystallizability | Two-layered crystallization | Two-layered crystallization | Two-layered crystallization | Two-layered crystallization |
| ES-type TFT characteristics | die (0 0) initial characteristics | Vth [V] Linear mobility [cm$^2$/Vs] | TFT was not be produced due to patterning defect | TFT was not be produced due to patterning defect | TFT was not be produced due to patterning defect | TFT was not be produced due to patterning defect |
| | die (0 0) optical reliability | $\varDelta$Vth [V] | | | | |
| | die (0 −5) optical reliability | $\varDelta$Vth [V] | | | | |

TABLE 16

| | | | Comp. 19 | Comp. 20 | Comp. 21 | Comp. 22 | Comp. 23 |
|---|---|---|---|---|---|---|---|
| Oxide sputtering target | Charging composition ratio [mass %] | In$_2$O$_3$ | 92.7 | 90.2 | 86.7 | 81.3 | 82.3 |
| | | Ga$_2$O$_3$ | 3.70 | 6.60 | 10.50 | 15.40 | 17.1 |
| | | Al$_2$O$_3$ | 3.60 | 3.20 | 2.80 | 3.30 | 0.6 |
| | Metal composition ratio [at %] | In | 72.9 | 72.9 | 72.9 | 72.9 | 72.9 |
| | | Ga | 5.1 | 9.0 | 14.2 | 20.2 | 23.2 |
| | | Al | 9.1 | 8.0 | 6.9 | 7.9 | 1.5 |
| ES-type TFT production conditions | Sputtering film forming conditions of oxide semiconductor | Atmosphere gas | Ar + O$_2$ | Ar + O$_2$ | Ar + O$_2$ | Ar + O$_2$ | Ar + O$_2$ |
| | | Back pressure before film formation [Pa] | 4 × 10$^{-4}$ or less | 4 × 10$^{-4}$ or less | 4 × 10$^{-4}$ or less | 4 × 10$^{-4}$ or less | 4 × 10$^{-4}$ or less |
| | | Pressure during film formation [Pa] | 0.5 | 0.5 | 0.5 | 0.5 | 0.5 |
| | | O$_2$ flow rate during film formation [%] | 10 | 10 | 10 | 10 | 10 |
| | | Output during film formation [W] | 400.0 | 400.0 | 400.0 | 400.0 | 400.0 |
| | | Magnetic flux density [G] | 1000 | 1000 | 1000 | 1000 | 1000 |
| | | Film thickness [nm] | 50 | 50 | 50 | 50 | 50 |
| | Semiconductor patterning | Resist | AZ1500 | AZ1500 | AZ1500 | AZ1500 | AZ1500 |
| | | Semiconductor etching | Oxalic acid | Oxalic acid | Oxalic acid | Oxalic acid | Oxalic acid |
| | Annealing | Temperature-increase pattern [° C./min] | 10 | 10 | 10 | 10 | 10 |
| | | Highest temperature [° C.] | 350 | 350 | 350 | 350 | 350 |
| | | Retention time [hour] | 1 | 1 | 1 | 1 | 1 |
| | | Atmosphere | Air | Air | Air | Air | Air |
| | Etch stopper patterning | Etch stopper | SiO$_2$ | SiO$_2$ | SiO$_2$ | SiO$_2$ | SiO$_2$ |
| | | Resist | AZ5214 | AZ5214 | AZ5214 | AZ5214 | AZ5214 |
| | Formation of contact hole in gate insulating film | Resist | AZ1500 | AZ1500 | AZ1500 | AZ1500 | AZ1500 |
| | | Etchant | BHF | BHF | BHF | BHF | BHF |
| | Annealing | Highest temperature [° C.] | 400 | 400 | 400 | 400 | 400 |
| | | Retention time [hour] | 1 | 1 | 1 | 1 | 1 |
| | | Atmosphere | In air | In air | In air | In air | In air |
| | Formation of electrodes | Electrodes | Ti | Ti | Ti | Ti | Ti |
| | | Resist | AZ5214 | AZ5214 | AZ5214 | AZ5214 | AZ5214 |
| | Final annealing | Highest temperature [° C.] | 200 | 200 | 200 | 200 | 200 |
| | | Retention time [hour] | 1 | 1 | 1 | 1 | 1 |
| | | Atmosphere | In air | In air | In air | In air | In air |
| State of semiconductor film | Cross-sectional TEM | Crystallizability | Solid-phase crystallization | Solid-phase crystallization | Solid-phase crystallization | amorphous | amorphous |
| ES-type TFT characteristics | die (0 0) initial characteristics | Vth [V] | 1.9 | 1.7 | 2.1 | 2.5 | 2.5 |
| | | Linear mobility [cm$^2$/Vs] | 17 | 20 | 18 | 14 | 12 |

The invention claimed is:

1. A sintered body of an oxide comprising an In element, a Ga element, and an Al element, wherein in a field of view when the sintered body is observed with a scanning electron microscope, an area ratio of pores to an area of the field of view is 0.1% or less, and wherein an atomic composition ratio of the In element and an atomic composition ratio of the Al element respectively satisfy a formula (1) and a formula (2) below, $$[In]/([In]+[Ga]+[Al]) > 0.70 \qquad (1)$$

$$[Al]/([In]+[Ga]+[Al]) > 0.01. \qquad (2)$$

2. The sintered body according to claim 1, wherein provided that an atomic composition ratio of the Ga element represented by $\{[Ga]/([In]+[Ga]+[Al])\}\times100$ is x and an atomic composition ratio of the Al element represented by $\{[Al]/([In]+[Ga]+[Al])\}\times100$ is y, the x and the y are, in atomic %, within a composition range bounded by straight lines of (A1), (B0), (C1), (D1), and (E1) below, $$x \geq 4 \qquad (A1)$$

$$x \leq 22.5 \qquad (B0)$$

$$y > 1 \qquad (C1)$$

$$6x + 14y - 98 \geq 0 \qquad (D1)$$

$$4x + 20y - 180 \leq 0. \qquad (E1)$$

3. The sintered body according to claim 2, wherein the x and the y are, in atomic %, within a composition range bounded by straight lines of (A2) and (B2) below and the straight lines of (C1), (D1), and (E1) above, $$x \geq 8 \qquad (A2)$$

$$x \leq 20. \qquad (B2)$$

4. The sintered body according to claim 1, comprising a Bixbyite structure comprising the In element and a crystal structure belonging to a space group P1 or a space group P-1, the crystal structure belonging to the space group P1 being represented by a crystal structure parameter (X) below, the crystal structure belonging to the space group P-1 being represented by a crystal structure parameter (Y) below, the crystal structure parameter (X):

lattice constants are a=10.07±0.15 Å, b=10.45=0.15 Å, c=11.01±0.15 Å, α=111.70±0.50°, β=107.70±0.50°, and γ=90.00±0.50°, the sintered body has a triclinic crystal system, at least one metal in an atomic configuration below of the space group P1 is any one of In, Ga and Al, or any two or more of In, Ga and Al, and is on identical atomic coordinates at a predetermined ratio, the atomic coordinates on which the at least one metal is arranged are in a range of x±0.01, y±0.01, and z=0.01, and atomic coordinates on which oxygen is arranged are in a range of x±0.01, y=0.01, and z±0.01, where atomic species: metal, atomic coordinates (x=0.04, y=0.36, z=0.87), atomic species: metal, atomic coordinates (x=0.13, y=0.12, z=0.62), atomic species: metal, atomic coordinates (x=0.21, y=0.85, z=0.39), atomic species: metal, atomic coordinates (x=0.23, y=0.11, z=0.97), atomic species: metal, atomic coordinates (x=0.29, y=0.64, z=0.11), atomic species: metal, atomic coordinates (x=0.46, y=0.12, z=0.63), atomic species: metal, atomic coordinates (x=0.58, y=0.14, z=0.01), atomic species: metal, atomic coordinates (x=0.62, y=0.64, z=0.11), atomic species: metal, atomic coordinates (x=0.69, y=0.18, z=0.32), atomic species: metal, atomic coordinates (x=0.09, y=0.88, z=0.03), atomic species: metal, atomic coordinates (x=0.02, y=0.13, z=0.30), atomic species: metal, atomic coordinates (x=0.06, y=0.61, z=0.46), atomic species: metal, atomic coordinates (x=0.15, y=0.40, z=0.19), atomic species: metal, atomic coordinates (x=0.26, y=0.36, z=0.54), atomic species: metal, atomic coordinates (x=0.34, y=0.13, z=0.30), atomic species: metal, atomic coordinates (x=0.41, y=0.61, z=0.45), atomic species: metal, atomic coordinates (x=0.48, y=0.40, z=0.23), atomic species: metal, atomic coordinates (x=0.84, y=0.39, z=0.23), atomic species: metal, atomic coordinates (x=0.96, y=0.64, z=0.13), atomic species: metal, atomic coordinates (x=0.87, y=0.88, z=0.38), atomic species: metal, atomic coordinates (x=0.79, y=0.15, z=0.61), atomic species: metal, atomic coordinates (x=0.77, y=0.89, z=0.03), atomic species: metal, atomic coordinates (x=0.71, y=0.36, z=0.89), atomic species: metal, atomic coordinates (x=0.54, y=0.88, z=0.37), atomic species: metal, atomic coordinates (x=0.42, y=0.86, z=0.99), atomic species: metal, atomic coordinates (x=0.38, y=0.36, z=0.89), atomic species: metal, atomic coordinates (x=0.31, y=0.82, z=0.68), atomic species: metal, atomic coordinates (x=0.91, y=0.12, z=0.97), atomic species: metal, atomic coordinates (x=0.98, y=0.87, z=0.70), atomic species: metal, atomic coordinates (x=0.94, y=0.39, z=0.54), atomic species: metal, atomic coordinates (x=0.85, y=0.60, z=0.81), atomic species: metal, atomic coordinates (x=0.74, y=0.64, z=0.46), atomic species: metal, atomic coordinates (x=0.66, y=0.87, z=0.70), atomic species: metal, atomic coordinates (x=0.59, y=0.39, z=0.55), atomic species: metal, atomic coordinates (x=0.52, y=0.60, z=0.77), atomic species: metal, atomic coordinates (x=0.16, y=0.61, z=0.77), atomic species: oxygen, atomic coordinates (x=0.02, y=0.73, z=0.36), atomic species: oxygen, atomic coordinates (x=0.03, y=0.45, z=0.29), atomic species: oxygen, atomic coordinates (x=0.05, y=0.02, z=0.40), atomic species: oxygen, atomic coordinates (x=0.10, y=0.74, z=0.65), atomic species: oxygen, atomic coordinates (x=0.10, y=0.23, z=0.06), atomic species: oxygen, atomic coordinates (x=0.12, y=0.51, z=0.09), atomic species: oxygen, atomic coordinates (x=0.12, y=0.47, z=0.57), atomic species: oxygen, atomic coordinates (x=0.13, y=0.79, z=0.17), atomic species: oxygen, atomic coordinates (x=0.19, y=0.21, z=0.84), atomic species: oxygen, atomic coordinates (x=0.20, y=0.23, z=0.36), atomic species: oxygen, atomic coordinates (x=0.25, y=0.66, z=0.49), atomic species: oxygen, atomic coordinates (x=0.27, y=0.02, z=0.12), atomic species: oxygen, atomic coordinates (x=0.30, y=0.26, z=0.65), atomic species: oxygen, atomic coordinates (x=0.33, y=0.44, z=0.29), atomic species: oxygen, atomic coordinates (x=0.38, y=0.02, z=0.40), atomic species: oxygen, atomic coordinates (x=0.39, y=0.73, z=0.35), atomic species: oxygen, atomic coordinates (x=0.41, y=0.24, z=0.07), atomic species: oxygen, atomic coordinates (x=0.43, y=0.47, z=0.57), atomic species: oxygen, atomic coordinates (x=0.46, y=0.51, z=0.11), atomic species: oxygen, atomic coordinates (x=0.47, y=0.79, z=0.15), atomic species: oxygen, atomic coordinates (x=0.50, y=0.25, z=0.36), atomic species: oxygen, atomic coordinates (x=0.64, y=0.03, z=0.12), atomic species: oxygen, atomic coordinates (x=0.66, y=0.34, z=0.23), atomic species: oxygen, atomic coordinates (x=0.72, y=0.03, z=0.40), atomic species: oxygen, atomic coordinates (x=0.78, y=0.51, z=0.12), atomic species: oxygen, atomic coordinates (x=0.80, y=0.25, z=0.06), atomic species: oxygen, atomic coordinates (x=0.96, y=0.02, z=0.12), atomic species: oxygen, atomic coordinates (x=0.98, y=0.27, z=0.64), atomic species: oxygen, atomic coordinates (x=0.97, y=0.55, z=0.72), atomic species: oxygen, atomic coordinates (x=0.95, y=0.98, z=0.60), atomic species: oxygen, atomic coordinates (x=0.90, y=0.26, z=0.35), atomic species: oxygen, atomic coordinates (x=0.90, y=0.77, z=0.94), atomic species: oxygen, atomic coordinates (x=0.88, y=0.49, z=0.91), atomic species: oxygen, atomic coordinates (x=0.88, y=0.53, z=0.43), atomic species: oxygen, atomic coordinates (x=0.87, y=0.21, z=0.83), atomic species: oxygen, atomic coordinates (x=0.81, y=0.79, z=0.16), atomic species: oxygen, atomic coordinates (x=0.80, y=0.77, z=0.64), atomic species: oxygen, atomic coordinates (x=0.75, y=0.34, z=0.51), atomic species: oxygen, atomic coordinates (x=0.73, y=0.98, z=0.88), atomic species: oxygen, atomic coordinates (x=0.70, y=0.74, z=0.35), atomic species: oxygen, atomic coordinates (x=0.67, y=0.56, z=0.71), atomic species: oxygen, atomic coordinates (x=0.62, y=0.98, z=0.60), atomic species: oxygen, atomic coordinates (x=0.61, y=0.27, z=0.65), atomic species: oxygen, atomic coordinates (x=0.59, y=0.76, z=0.93), atomic species: oxygen, atomic coordinates (x=0.58, y=0.53, z=0.43), atomic species: oxygen, atomic coordinates (x=0.54, y=0.49, z=0.89), atomic species: oxygen, atomic coordinates (x=0.53, y=0.21, z=0.85), atomic species: oxygen, atomic coordinates (x=0.50, y=0.75, z=0.64), atomic species: oxygen, atomic coordinates (x=0.36, y=0.97, z=0.88), atomic species: oxygen, atomic coordinates (x=0.34, y=0.66, z=0.77), atomic species: oxygen, atomic coordinates (x=0.28, y=0.97, z=0.60), atomic species: oxygen, atomic coordinates (x=0.22, y=0.49, z=0.88), atomic species: oxygen, atomic coordinates (x=0.20, y=0.75, z=0.94), and atomic species: oxygen, atomic coordinates (x=0.04, y=0.98, z=0.88), the crystal structure parameter (Y):

lattice constants are a=10.07±0.15 Å, b=10.45±0.15 Å, c=11.01±0.15 Å, α=111.70±0.50°, β=107.70±0.50°, and γ=90.00±0.50°, the sintered body has a triclinic crystal system, at least one metal in an atomic configuration below of the space group P-1 is any one of In, Ga and Al, or any two or more of In, Ga and Al, and is on identical atomic coordinates at a predetermined ratio, the atomic coordinates on which the at least one metal is arranged are in a range of x±0.01, y±0.01, and z±0.01, and atomic coordinates on which oxygen is arranged are in a range of x±0.01, y±0.01, and z±0.01, where atomic species: metal, atomic coordinates (x=0.04, y=0.36, z=0.87), atomic species: metal, atomic coordinates (x=0.13, y=0.12, z=0.62), atomic species: metal, atomic coordinates (x=0.21, y=0.85, z=0.39), atomic species: metal, atomic coordinates (x=0.23, y=0.11, z=0.97), atomic species: metal, atomic coordinates (x=0.29, y=0.64, z=0.11), atomic species: metal, atomic coordinates (x=0.46, y=0.12, z=0.63), atomic species: metal, atomic coordinates (x=0.58, y=0.14, z=0.01), atomic species: metal, atomic coordinates (x=0.62, y=0.64, z=0.11), atomic species: metal, atomic coordinates (x=0.69, y=0.18, z=0.32), atomic species: metal, atomic coordinates (x=0.09, y=0.88, z=0.03), atomic species: metal, atomic coordinates (x=0.02, y=0.13, z=0.30), atomic species: metal, atomic coordinates (x=0.06, y=0.61, z=0.46), atomic species: metal, atomic coordinates (x=0.15, y=0.40, z=0.19), atomic species: metal, atomic coordinates (x=0.26, y=0.36, z=0.54), atomic species: metal, atomic coordinates (x=0.34, y=0.13, z=0.30), atomic species: metal, atomic coordinates (x=0.41, y=0.61, z=0.45), atomic species: metal, atomic coordinates (x=0.48, y=0.40, z=0.23), atomic species: metal, atomic coordinates (x=0.84, y=0.39, z=0.23), atomic species: oxygen, atomic coordinates (x=0.02, y=0.73, z=0.36), atomic species: oxygen, atomic coordinates (x=0.03, y=0.45, z=0.29), atomic species: oxygen, atomic coordinates (x=0.05, y=0.02, z=0.40), atomic species: oxygen, atomic coordinates (x=0.10, y=0.74, z=0.65), atomic species: oxygen, atomic coordinates (x=0.10, y=0.23, z=0.06), atomic species: oxygen, atomic coordinates (x=0.12, y=0.51, z=0.09), atomic species: oxygen, atomic coordinates (x=0.12, y=0.47, z=0.57), atomic species: oxygen, atomic coordinates (x=0.13, y=0.79, z=0.17), atomic species: oxygen, atomic coordinates (x=0.19, y=0.21, z=0.84), atomic species: oxygen, atomic coordinates (x=0.20, y=0.23, z=0.36), atomic species: oxygen, atomic coordinates (x=0.25, y=0.66, z=0.49), atomic species: oxygen, atomic coordinates (x=0.27, y=0.02, z=0.12), atomic species: oxygen, atomic coordinates (x=0.30, y=0.26, z=0.65), atomic species: oxygen, atomic coordinates (x=0.33, y=0.44, z=0.29), atomic species: oxygen, atomic coordinates (x=0.38, y=0.02, z=0.40), atomic species: oxygen, atomic coordinates (x=0.39, y=0.73, z=0.35), atomic species: oxygen, atomic coordinates (x=0.41, y=0.24, z=0.07), atomic species: oxygen, atomic coordinates (x=0.43, y=0.47, z=0.57), atomic species: oxygen, atomic coordinates (x=0.46, y=0.51, z=0.11), atomic species: oxygen, atomic coordinates (x=0.47, y=0.79, z=0.15), atomic species: oxygen, atomic coordinates (x=0.50, y=0.25, z=0.36), atomic species: oxygen, atomic coordinates (x=0.64, y=0.03, z=0.12), atomic species: oxygen, atomic coordinates (x=0.66, y=0.34, z=0.23), atomic species: oxygen, atomic coordinates (x=0.72, y=0.03, z=0.40), atomic species: oxygen, atomic coordinates (x=0.78, y=0.51, z=0.12), atomic species: oxygen, atomic coordinates (x=0.80, y=0.25, z=0.06), and atomic species: oxygen, atomic coordinates (x=0.96, y=0.02, z=0.12).

5. The sintered body according to claim 4, wherein when a weight ratio between the Bixbyite structure containing the In element, the crystal structure belonging to the space group P1 or the space group P-1, and a crystal structure other than the Bixbyite structure and the crystal structure belonging to the space group P1 or P-1 is calculated by performing Rietveld analysis on a spectrum obtained by X-ray diffraction measurement on the sintered body, the weight ratio of a crystal of the Bixbyite structure containing the In element to a whole crystal of the sintered body is 70% or more.

6. The sintered body according to claim 1, wherein the sintered body comprises a H element, and an atomic concentration of the H element in the sintered body is $1 \times 10^{16}$ cm$^{-3}$ or more and less than $1 \times 10^{18}$ cm$^{-3}$.

7. The sintered body according to claim 1, wherein the sintered body comprises a C element, and an atomic concentration of the C element in the sintered body is $1 \times 10^{16}$ cm$^{-3}$ or more and less than $1 \times 10^{18}$ cm$^{-3}$.

8. The sintered body according to claim 1, wherein a bending strength of the sintered body is 190 MPa or more.

9. A sputtering target using the sintered body of the oxide according to claim 1.

10. An oxide thin film using the sputtering target according to claim 9.

11. A thin film transistor comprising the oxide thin film according to claim 10.

12. An electronic device comprising the thin film transistor according to claim 11.

13. A method of producing a sintered body of an oxide comprising an In element, a Ga element, and an Al element, the method comprising:

mixing and disintegrating indium oxide, gallium oxide, and aluminum oxide by bead milling, followed by granulation through a spray drying method to obtain granulated powder, and classifying the granulated powder;

molding the granulated powder after the classification into a molded body; and sintering the molded body, wherein:

in a field of view when the sintered body is observed with a scanning electron microscope, an area ratio of pores to an area of the field of view is 0.1% or less, and an atomic composition ratio of the In element and an atomic composition ratio of the Al element in the sintered body respectively satisfy a formula (1) and a formula (2) below, $$[In]/([In] + [Ga] + [Al]) > 0.70 \qquad (1)$$

$$[Al]/([In] + [Ga] + [Al]) > 0.01. \qquad (2)$$

* * * * *